United States Patent
Shibuya

(10) Patent No.: US 7,794,916 B2
(45) Date of Patent: *Sep. 14, 2010

(54) POSITIVE PHOTOSENSITIVE COMPOSITION, POLYMER COMPOUND USED FOR THE POSITIVE PHOTOSENSITIVE COMPOSITION, PRODUCTION METHOD OF THE POLYMER COMPOUND, AND PATTERN FORMING METHOD USING THE POSITIVE PHOTOSENSITIVE COMPOSITION

(75) Inventor: Akinori Shibuya, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 69 days.

This patent is subject to a terminal disclaimer.

(21) Appl. No.: 11/943,908

(22) Filed: Nov. 21, 2007

(65) Prior Publication Data

US 2008/0187863 A1  Aug. 7, 2008

(30) Foreign Application Priority Data

Nov. 21, 2006 (JP) ............................... 2006-313912

(51) Int. Cl.
- *G03F 7/004* (2006.01)
- *G03F 7/30* (2006.01)
- *C08F 2/38* (2006.01)
- *C08F 28/04* (2006.01)

(52) U.S. Cl. .................... 430/270.1; 430/326; 430/910; 526/84; 526/85; 525/328.5; 525/328.9; 525/329.8; 525/350; 525/385

(58) Field of Classification Search ............... 430/270.1, 430/326, 910; 526/84, 85; 525/328.5, 328.9, 525/329.8, 350, 385
See application file for complete search history.

(56) References Cited

U.S. PATENT DOCUMENTS

| 3,705,882 | A | 12/1972 | Skillicorn |
| 6,403,281 | B1 | 6/2002 | Lee et al. |
| 2004/0058269 | A1 | 3/2004 | Hada et al. |
| 2004/0181023 | A1 | 9/2004 | Yamagishi et al. |
| 2006/0068324 | A1* | 3/2006 | Mita ...................... 430/270.1 |
| 2006/0204888 | A1 | 9/2006 | Aoki et al. |
| 2007/0111137 | A1* | 5/2007 | Yamagishi et al. ....... 430/270.1 |
| 2007/0190449 | A1* | 8/2007 | Momose et al. .......... 430/270.1 |
| 2008/0090173 | A1* | 4/2008 | Harada et al. ............ 430/270.1 |
| 2008/0118860 | A1* | 5/2008 | Harada et al. ............ 430/270.1 |

FOREIGN PATENT DOCUMENTS

| EP | 0796873 | A1 | 9/1997 |
| JP | 2000-214587 | A | 8/2000 |
| JP | 2001-106737 | A | 4/2001 |
| JP | 2003-167347 | A | 6/2003 |
| JP | 2003-223001 | A | 8/2003 |
| WO | 2005/085301 | A1 | 9/2005 |
| WO | 2007/078541 | A1 | 7/2007 |

* cited by examiner

Primary Examiner—John S Chu
(74) Attorney, Agent, or Firm—Sughrue Mion, PLLC

(57) ABSTRACT

A polymer compound having a structure represented by the formula (1) as defined herein at a main chain terminal, and a positive photosensitive composition containing a polymer compound having a structure represented by the following formula (1) as defined herein at a main chain terminal and a photoacid generator capable of generating an acid upon irradiation with actinic rays or radiation.

10 Claims, No Drawings

POSITIVE PHOTOSENSITIVE COMPOSITION, POLYMER COMPOUND USED FOR THE POSITIVE PHOTOSENSITIVE COMPOSITION, PRODUCTION METHOD OF THE POLYMER COMPOUND, AND PATTERN FORMING METHOD USING THE POSITIVE PHOTOSENSITIVE COMPOSITION

FIELD OF THE INVENTION

The present invention relates to a positive photosensitive composition for use in the production process of a semiconductor such as IC, in the production of a circuit substrate of liquid crystal, thermal head or the like or in other photofabrication processes, and also relates to a polymer compound for use in the positive photosensitive composition, a production method of the polymer compound, and a pattern forming method using the positive photosensitive composition. More specifically, the present invention relates to a positive photosensitive composition suitable for the processing with an exposure light source of emitting a far ultraviolet ray or the like at 250 nm or less, preferably 220 nm or less, or an irradiation source utilizing an electron beam or the like; a polymer compound for use in the positive photosensitive composition; a production method of the polymer compound; and a pattern forming method using the positive photo-sensitive composition.

BACKGROUND OF THE INVENTION

A chemical amplification-type photosensitive composition is a pattern forming material capable of producing an acid in the exposed area upon irradiation with radiation such as far ultraviolet ray, and through a reaction using this acid as the catalyst, changing the solubility in a developer between the area irradiated with actinic rays and the non-irradiated area, thereby forming a pattern on a substrate.

In the case of using a KrF excimer laser as the exposure light source, a resin having small absorption in the region of 248 nm and having a basic skeleton of poly(hydroxystyrene) is predominantly used as the main component, and this is an excellent system capable of forming a good pattern with high sensitivity and high resolution compared to the conventional naphthoquinone-diazide/novolak resin system.

In the case where a light source of emitting light at a shorter wavelength, for example, an ArF excimer laser (193 nm), is used as the exposure light source, a satisfactory pattern cannot be formed even by the above-described chemical amplification system because the compound having an aromatic group substantially has large absorption in the region of 193 nm.

In order to solve this problem, a resist containing a resin having an alicyclic hydrocarbon structure has been developed as the resist for use with an ArF excimer laser. JP-A-2003-167347 (the term "JP-A" as used herein means an "unexamined published Japanese patent application") (corresponding to US 2004/0058269 A1) and JP-A-2003-223001 describe a composition containing a resin having a polycyclic acid-decomposable repeating unit and a non-acid-decomposable repeating unit. This resin is a chemical amplification-type resist having a protective group which dissociates by the effect of an acid and is unstable to an acid, but amid increasing demands for a finer resist pattern, a sufficiently high resist performance can be hardly obtained only by such a protective group.

To meet such a requirement, a resist polymer where a crosslinked moiety capable of dissociating by the effect of an acid is introduced into the side chain of a resin containing a repeating unit having an acid-dissociatable protective group is also studied in JP-A-2000-214587 and JP-A-2001-106737 (corresponding to U.S. Pat. No. 6,403,281 B1). This is a technique of breaking the crosslinking bond by an acid catalyst and thereby enhancing the dissolution contract between the exposed region and the unexposed region. However, a bifunctional monomer such as diacrylate is used for the polymerization of the polymer and since a crosslinking reaction in the polymer side chain is involved, the polymer produced comes to have a very large molecular weight distribution and suffers from bad solubility. Moreover, an ultrahigh molecular weight polymer is readily produced and a sparingly soluble high-molecular-weight component which hardly dissolves in an alkali developer is present even after decomposition by the effect of an acid, as a result, there arises a problem that the undissolved component gives rise to a defect at the formation of a fine pattern.

SUMMARY OF THE INVENTION

Under these circumstances, the present invention has been made and an object of the present invention is to provide a positive photosensitive composition assured of high sensitivity and improved in the pattern collapse by containing a polymer compound having introduced into the main chain terminal thereof an acid-dissociatable structure, and provide a polymer compound for use in the positive photosensitive composition, a production method of the polymer compound, and a pattern forming method using the positive photosensitive composition.

The present invention is as follows.

(1) A positive photosensitive composition comprising:

(A) a polymer compound having a structure represented by the following formula (1) at the main chain terminal, (B) a photoacid generator capable of generating an acid upon irradiation with actinic rays or radiation:

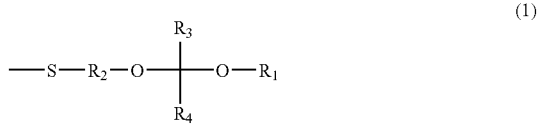

wherein

R$_1$ represents a monovalent organic group,

R$_2$ represents a divalent linking group,

R$_3$ an R$_4$ each independently represents a hydrogen atom or a monovalent organic group, and R$_3$ or R$_4$ may combine with the carbon atom on R$_1$ to form a ring structure.

(2) The positive photosensitive composition as described in (1), wherein in formula (1), R$_1$ represents an alkyl group, a cycloalkyl group, an aryl group, a monovalent thiazoline ring group, a monovalent oxazoline ring group, a monovalent imidazoline ring group, or a monovalent organic group formed by combining at least two members thereof, R$_2$ represents an alkylene group, a cycloalkylene group, an oxyalkylene group, an arylene group, a divalent thiazoline ring group, a divalent oxazoline ring group, a divalent imidazoline ring group, or a divalent linking group formed by combining at least two members thereof, and R$_3$ and R$_4$ each independently represents a hydrogen atom, an alkyl group, a cycloalkyl group, an alkenyl group or an aryl group.

(3) A polymer compound having a structure represented by the following formula (1) at the main chain terminal:

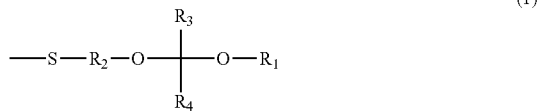

wherein $R_1$ represents a monovalent organic group, $R_2$ represents a divalent linking group, $R_3$ an $R_4$ each independently represents a hydrogen atom or a monovalent organic group, and $R_3$ or $R_4$ may combine with the carbon atom on $R_1$ to form a ring structure.

(4) A method for producing a polymer compound, comprising polymerizing a polymerizable compound having an ethylenic double bond by using a compound represented by the following formula (2) and a polymerization initiator, and reacting the obtained polymer compound with a vinyl ether compound or a halomethyl ether compound:

$$HS-R_2-OH \quad (2)$$

wherein $R_2$ represents a divalent linking group.

(5) A polymer compound having a structure represented by the following formula (1) at the main chain terminal, which is obtained by the production method described in (4):

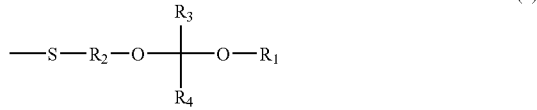

wherein $R_1$ represents a monovalent organic group, $R_2$ represents a divalent linking group, $R_3$ an $R_4$ each independently represents a hydrogen atom or a monovalent organic group, and $R_3$ or $R_4$ may combine with the carbon atom on $R_1$ to form a ring structure.

(6) A pattern forming method comprising steps of forming a photosensitive film from the positive photosensitive composition described in (1) or (2), and exposing and developing the photosensitive film.

According to the present invention, a positive photosensitive composition ensuring that by virtue of containing a polymer compound having a main chain terminal which is broken by an acid catalyst to produce a hydrophilic group moiety, the dissolution contrast between the exposed region and the unexposed region is enhanced to reveal high sensitivity and at the same time, the resist pattern at the interfacial boundary between the exposed region and the unexposed region is flattened to realize improvement in terms of the pattern collapse; a polymer compound for use in the positive photosensitive composition; a production method of the polymer compound; and a pattern forming method using the positive photosensitive composition can be provided.

DETAILED DESCRIPTION OF THE INVENTION

The best mode for carrying out the present invention is described below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(A) Polymer compound having a structure represented by formula (1)

The positive photosensitive composition of the present invention contains a polymer compound having a structure represented by the following formula (1) at the main chain terminal.

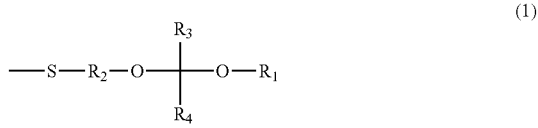

In formula (1), $R_1$ represents a monovalent organic group.

$R_2$ represents a divalent linking group.

$R_3$ an $R_4$ each independently represents a hydrogen atom or a monovalent organic group.

$R_3$ or $R_4$ may combine with the carbon atom on $R_1$ to form a ring structure.

In formula (1), the monovalent organic group of $R_1$ is preferably an alkyl group, a cycloalkyl group, an aryl group, a monovalent thiazoline ring group (a group after removing one hydrogen atom from thiazoline, hereinafter the same), a monovalent oxazoline ring group, a monovalent imidazoline ring group or a monovalent organic group formed by combining at least two members thereof, more preferably an alkyl group, a cycloalkyl group or an aryl group, still more preferably an alkyl group having a carbon number of 1 to 20, a cycloalkyl group having a carbon number of 3 to 20 or an aryl group having a carbon number of 1 to 20, still more preferably an alkyl group having a carbon number of 6 to 20 or a cycloalkyl group having a carbon number of 6 to 20. Above all, in view of dry etching resistance, a cycloalkyl group having a carbon number of 6 to 20 is preferred and suitable examples thereof include a cyclohexyl group, a norbornane group and an adamantane group. The monovalent organic group of $R_1$ may have an oxy group, a carbonyl group or the like in the inside thereof.

The divalent linking group of $R_2$ is preferably an alkylene group, a cycloalkylene group, an oxyalkylene group, an arylene group, a divalent thiazoline ring group (a group after removing two hydrogen atoms from thiazoline, hereinafter the same), a divalent oxazoline ring group, a divalent imidazoline ring group or a divalent linking group formed by combining at least two members thereof, more preferably an alkylene group, a cycloalkylene group or an arylene group, still more preferably an alkylene group having a carbon number of 1 to 10, a cycloalkylene group having a carbon number of 3 to 10 or an arylene group having a carbon number of 1 to 10, yet still more preferably an alkylene group having a carbon number of 6 to 10, a cycloalkylene group having a carbon number of 6 to 10 or an oxyalkylene group having a carbon number of 4 to 10. Specific preferred examples of the divalent linking group of $R_2$ include an ethylene group and a phenylene group. The divalent linking group of $R_2$ may be substituted by a halogen atom (preferably fluorine atom) or the like.

$R_3$ and $R_4$ each is independently preferably a hydrogen atom, an alkyl group, a cycloalkyl group, an alkenyl group or an aryl group, more preferably a hydrogen atom, an alkyl group having a carbon number of 1 to 18, a cycloalkyl group having a carbon number of 3 to 18, an alkenyl group having a carbon number of 2 to 18 or an aryl group having a carbon number of 6 to 18. In view of thermal stability, it is still more preferred that at least one of $R_3$ and $R_4$ is a hydrogen atom and another is a methyl group, an ethyl group, a propyl group or an isobutyl group.

In the case where $R_3$ or $R_4$ combines with the carbon atom on $R_1$ to form a ring structure, examples of the group formed after $R_3$ or $R_4$ is combined with $R_1$ include a butylene group.

Specific examples (S1 to S24) of the structure represented by formula (1), which the polymer compound of the present invention has at the main chain terminal, are set forth below, but the present invention is not limited thereto.

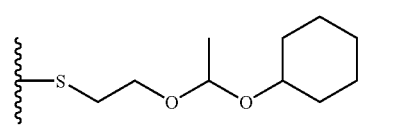
(S1)

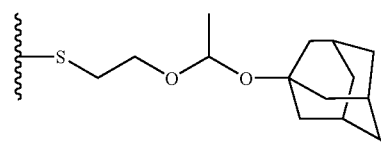
(S2)

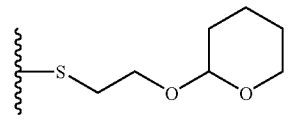
(S3)

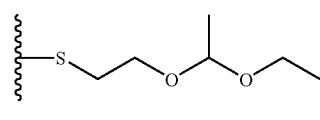
(S4)

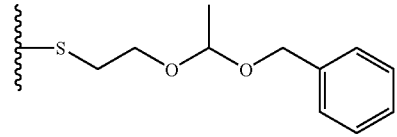
(S5)

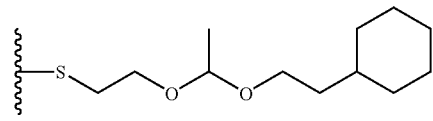
(S6)

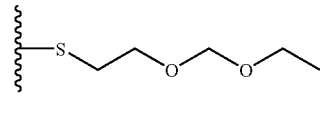
(S7)

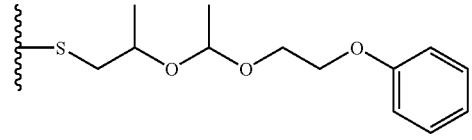
(S8)

-continued

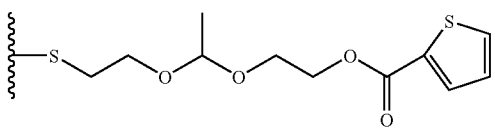
(S9)

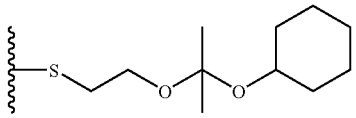
(S10)

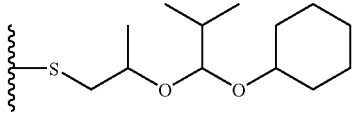
(S11)

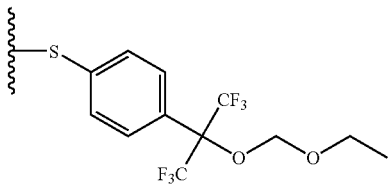
(S12)

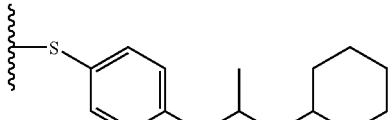
(S13)

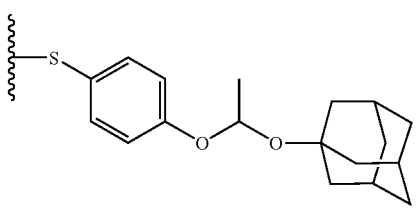
(S14)

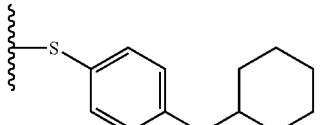
(S15)

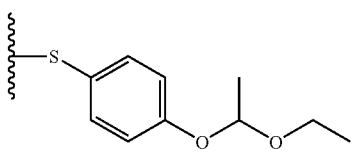
(S16)

(S17)

-continued

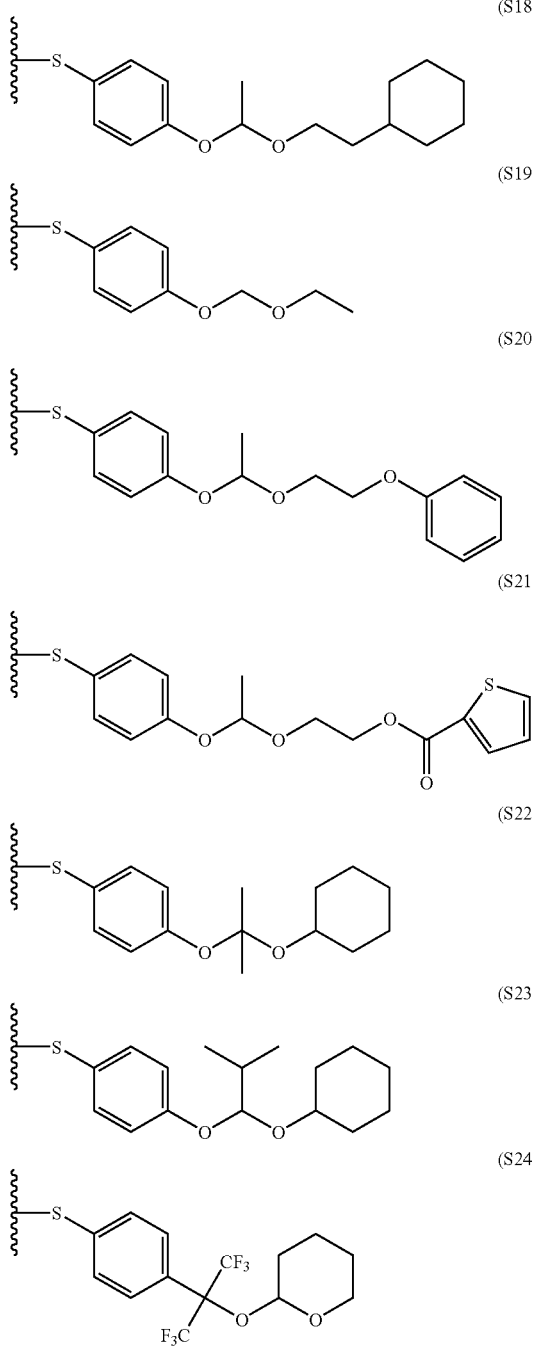

The polymer compound of the present invention having a structure represented by formula (1) at the main chain terminal is a novel compound.

The production method of the polymer compound of the present invention is described below.

The polymer compound of the present invention can be produced by polymerizing a polymerizable compound having an ethylenic double bond with use of a thiol compound having a hydroxyl group (e.g., hydroxyl group, phenol group) and a polymerization initiator, and reacting the obtained polymer compound (X) having a hydroxyl group at the terminal with a vinyl ether compound or a halomethyl ether compound.

The polymerization initiator used in the synthesis of the polymer compound (X) is described below.

The polymerization initiator is not particularly limited as long as it is an initiator generally used as a radical generator, but, for example, an azo compound such as 2,2'-azobisisobutyronitrile, 2,2'-azobis(2-methylbutyronitrile), dimethyl 2,2'-azobisisobutyrate, 1,1'-azobis(cyclohexane-1-carbonitrile) and 4,4'-azobis(4-cyanovaleric acid); and an organic peroxide such as decanoyl peroxide, lauroyl peroxide, benzoyl peroxide, bis(3,5,5-trimethylhexanoyl) peroxide, succinic acid peroxide and tert-butyl-oxy-2-ethylhexanoate may be used individually or in combination.

The thiol compound used in the synthesis of the polymer compound (X) is described below.

As for the thiol compound, a thiol compound having a hydroxyl group such as hydroxyl group and phenol group is used and in the case of a resist for an ArF excimer laser, a hydroxyl group is preferably contained.

The thiol compound is preferably a compound represented by the following formula (2).

In formula (2), $R_2$ represents a divalent linking group and has the same meaning as $R_2$ in formula (1).

Preferred examples of the thiol compound include 2-mercaptoethanol, 1-mercapto-2-propanol, 3-mercapto-1-propanol and 3-mercapto-2-butanol.

The synthesis method of the polymer compound of the present invention is described below.

The polymer compound of the present invention can be produced by reacting a vinyl ether compound or a halomethyl ether compound with the polymer compound (X) preferably with use of an acid catalyst (acetalization reaction).

As for the acid catalyst used in the synthesis of the polymer compound of the present invention, either an inorganic acid or an organic acid may be used. An organic acid is preferred because of no residual metal impurities, and a p-toluenesulfonic acid, a pyridinium p-toluene-sulfonate and the like are more preferred.

For the purpose of stopping the acetalization reaction, neutralization by a base compound is preferably performed. By performing the neutralization, the storage stability of the positive photosensitive composition can be prevented from being impaired due to remaining of an acid. The base compound used is not particularly limited as long as the acid added as a catalyst is neutralized and the salt is removed in the water washing step. Above all, an organic base compound is preferred because of no residual metal impurities, and specific examples thereof include triethylamine, trimethylamine, pyridine, aminopyridine, piperazine and imidazole, with triethylamine and pyridine being preferred. After the acetalization reaction is completed and the neutralization is performed, the salt remaining in the system is preferably removed using ultrapure water or the like.

The organic solvent used for the reaction is not particularly limited as long as it is an inactive solvent, but examples thereof include propylene glycol methyl ethyl acetate (PG-MEA), 2-heptanone, ethyl ethoxypropionate, methyl pyruvate, ethyl pyruvate and tetrahydrofuran. Among these, PGMEA and 2-heptanone are preferred.

The reaction solvent is usually used in an amount of 100 to 1,000 parts by mass per 100 parts by mass of the polymer compound (X).

The vinyl ether compound or halomethyl ether compound for use in the present invention is not particularly limited, but specific preferred examples thereof include ethyl vinyl ether, n-propyl vinyl ether, isopropyl vinyl ether, n-butyl vinyl ether, tert-butyl vinyl ether, cyclohexyl vinyl ether, n-hexyl vinyl ether, benzyl vinyl ether, cyclohexylethyl vinyl ether, phenoxyethyl vinyl ether, cyclohexylphenoxyethyl vinyl ether, 4-carbonylcyclohexylphenoxyethyl vinyl ether, tert-butylcyclohexylcarbonyloxyethyl vinyl ether, cyclohexylthioethyl vinyl ether and n-butylcyclohexylcarbonyloxyethyl vinyl ether. The compound may be sufficient if it substantially causes an acetalization reaction with the hydroxyl group in the polymer, and are not limited to those described above.

Specific preferred examples thereof include the following compounds, but the present invention is not limited thereto.

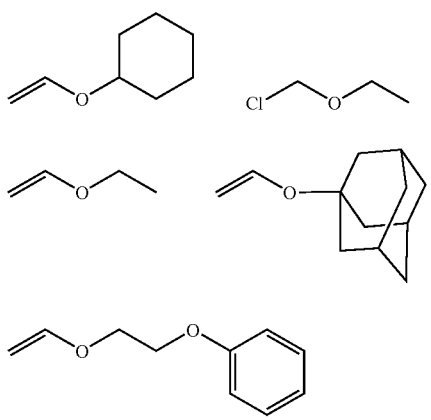

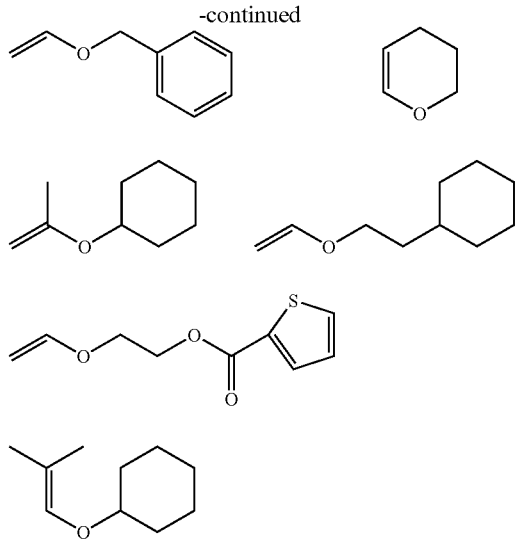

-continued

In the production method of the polymer compound (X), the thiol compound (S) and the polymerization initiator (I) are preferably used in amounts giving an addition molar ratio (I/S) of 10.0 or less. When the addition molar ratio (I/S) is 10.0 or less, the polymer compound where a residue derived from the polymerization initiator is introduced into the main chain terminal is decreased and the dissolution accelerating effect of the acid-decomposable group introduced into the terminal in the exposed area can be satisfactorily brought out.

The telomerization reaction using a chain transfer agent such as mercapto compound generally proceeds according to a scheme shown below and therefore, the initial molar ratio between the polymerization initiator and the chain transfer agent is important for the unit introduced into the polymer terminal.

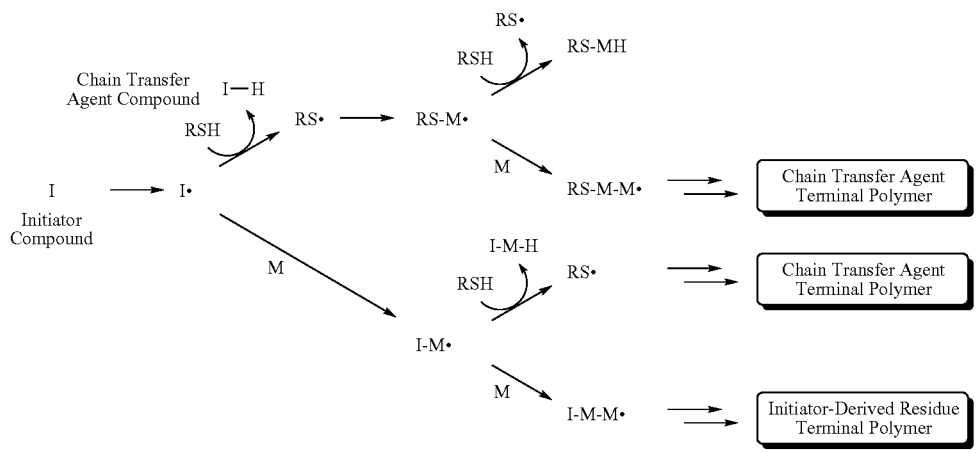

In the present invention, the acid-decomposable group at the terminal of the polymer compound must be broken and therefore, it is understood that the ratio in terms of the molar ratio of the thiol compound (chain transfer agent) is preferably larger than the polymerization initiator. In the present invention, the I/S value is 10.0 or less, preferably 5.0 or less and in view of the scheme above, is preferably 1.0 or less, more preferably 0.5 or less. In particular, when the I/S value is 1.0 or less, the ratio of the polymer compound where the structure (acid-decomposable terminal structure) represented by formula (1) is introduced into the main chain terminal becomes larger than the ratio of the polymer compound where the polymerization initiator-derived residue is introduced, and this is preferred. Accordingly, in the case where the polymer compound synthesized by the production method of the present invention is used as a resist composition, the dissolution accelerating effect by virtue of breakage of the terminal acid is more successfully exerted and the dissolution contrast between the exposed region and the unexposed region is enhanced, so that the resist can exhibit higher sensitivity than in conventional products. Also, the effect of improving the pattern collapse by flattening the resist pattern at the interfacial boundary between the exposed area and the unexposed area can be more remarkably exerted.

The amount of the thiol compound used is suitably from 0.1 to 50 mol %, preferably from 1 to 30 mol %, more preferably from 2.5 to 10 mol %, based on the total molar number of the raw material monomer. As the amount of the thiol compound added is larger, the content of the structure represented by formula (1) in the polymer compound increases, but the molecular weight of the polymer compound obtained becomes smaller. Therefore, when the polymer compound of the present invention is used as a resist composition, the amount added in the above-described range is preferred. The amount of the polymerization initiator added varies depending on the raw material monomer used in the polymerization reaction, the kind and amount of the chain transfer agent, and the polymerization conditions such as polymerization temperature or polymerization solvent and cannot be indiscriminately specified, but on the condition that the I/S ratio above is satisfied, the amount added is from 0.1 to 120 mol % (from 0.001 to 1.2 in terms of I/S ratio), preferably from 1 to 50 mol % (from 0.01 to 0.5 in terms of I/S ratio), more preferably from 10 to 30 mol % (from 0.1 to 0.3 in terms of I/S ratio), per mol of the chain transfer agent.

The raw material monomer used at the production of the polymer compound (X) is not particularly limited as long as, from the aspect of reaction, it is a polymerizable compound (monomer) having an ethylenic double bond, but in order to use the polymer compound as a positive photo-sensitive resin of which solubility in an alkali developer increases as a result of the acid-dissociatable protective group being dissociated under the action of an acid, the monomer contains, as an essential component, at least (A) a repeating unit having a structure which dissociates under the action of an acid to increase the solubility in an alkali developer (an "acid-decomposable repeating unit").

The repeating unit (A) having a structure which dissociates under the action of an acid to increase the solubility in an alkali developer means a structure heretofore generally used as a resist and can be obtained by polymerizing a monomer having a structure which dissociates under the action of an acid to increase the solubility in an alkali developer, or by polymerizing a monomer having an alkali-soluble structure and protecting the alkali-soluble group with an acid-dissociatable group.

The repeating unit (A) having a structure which dissociates under the action of an acid to increase the solubility in an alkali developer is preferably at least one repeating unit selected from the group consisting of a repeating unit having an alicyclic hydrocarbon-containing partial structure represented by any one of the following formulae (pI) to (pV) and a repeating unit represented by the following formula (II-AB).

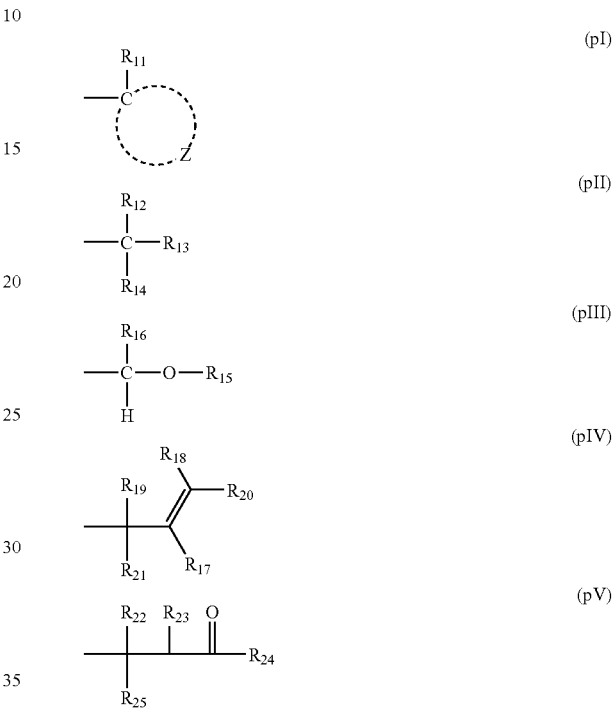

In formulae (pI) to (pV), $R_{11}$ represents an alkyl group.

Z represents an atomic group necessary for forming a cycloalkyl group together with the carbon atom.

$R_{12}$ to $R_{16}$ each independently represents an alkyl group or a cycloalkyl group.

$R_{17}$ to $R_{21}$ each independently represents a hydrogen atom, an alkyl group or a cycloalkyl group.

$R_{22}$ to $R_{25}$ each independently represents a hydrogen atom, an alkyl group or a cycloalkyl group. $R_{23}$ and $R_{24}$ may combine with each other to form a ring.

In formula (II-AB), $R_{11}'$ and $R_{12}'$ each independently represents a hydrogen atom, a cyano group, a halogen atom or an alkyl group.

Z' represents an atomic group for forming an alicyclic structure containing two bonded carbon atoms (C—C).

Here, Z' has at least one group (acid-decomposable group) which dissociates under the action of an acid to increase the solubility in an alkali developer.

Formula (II-AB) is preferably the following formula (II-AB1) or (II-AB2).

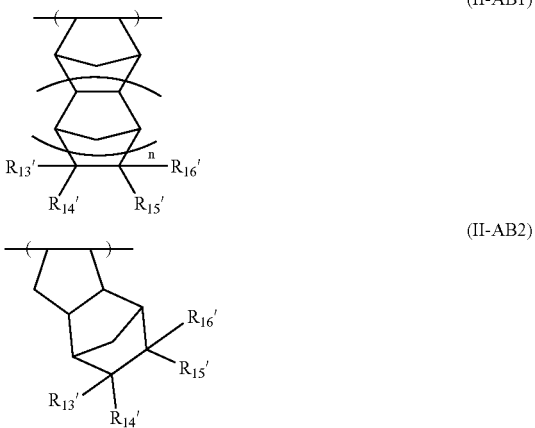

In formulae (II-AB1) and (II-AB2), $R_{13}'$ to $R_{16}'$ each independently represents a hydrogen atom, a halogen atom, a cyano group, —COOH, —COOR$_5$, an acid-decomposable group, —C(=O)—X-A'—R$_{17}'$, an alkyl group or a cycloalkyl group, provided that at least one of $R_{13}'$ to $R_{16}'$ represents an acid-decomposable group. At least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{11}$ to $R_{25}$ is preferably a linear or branched alkyl group having a carbon number of 1 to 4.

The cycloalkyl group of $R_{12}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

The alkyl group and cycloalkyl group above each may have a substituent.

Examples of the substituent of the alkyl group and cycloalkyl group include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like each may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). Among these, preferred is a structure where the hydrogen atom of a carboxylic acid group or a sulfonic acid group is replaced by the structure represented by any one of formulae (pI) to (pV).

The repeating unit having an alkali-soluble group protected with a structure represented by any one of formulae (pI) to (pV) is an acid-decomposable repeating unit and is preferably a repeating unit represented by the following formula (pA):

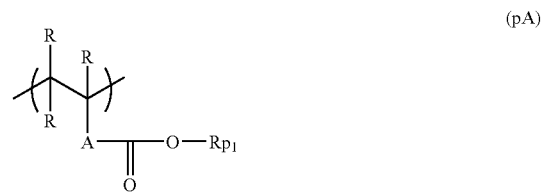

(pA)

In formula (pA), R represents a hydrogen atom, a halogen atom or a linear or branched alkyl group having a carbon number of 1 to 4, and the plurality of R's may be the same or different.

A represents a single bond, or a sole group or a combination of two or more groups selected from the group consisting of an alkylene group, an ether group, a thioether group, a carbonyl group, an ester group, an amido group, a sulfonamide group, a urethane group and a urea group. A is preferably a single bond.

$Rp_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below, but the present invention is not limited thereto.

(In the formulae, Rx represents H, CH$_3$, CF$_3$ or CH$_2$OH, and Rxa and Rxb each independently represents an alkyl group having a carbon number of 1 to 4.)

1

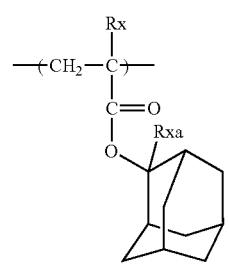

-continued
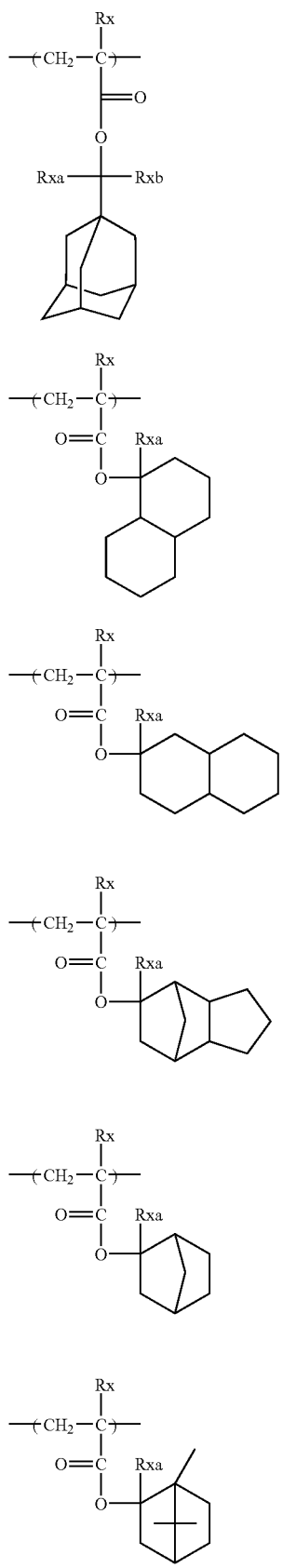
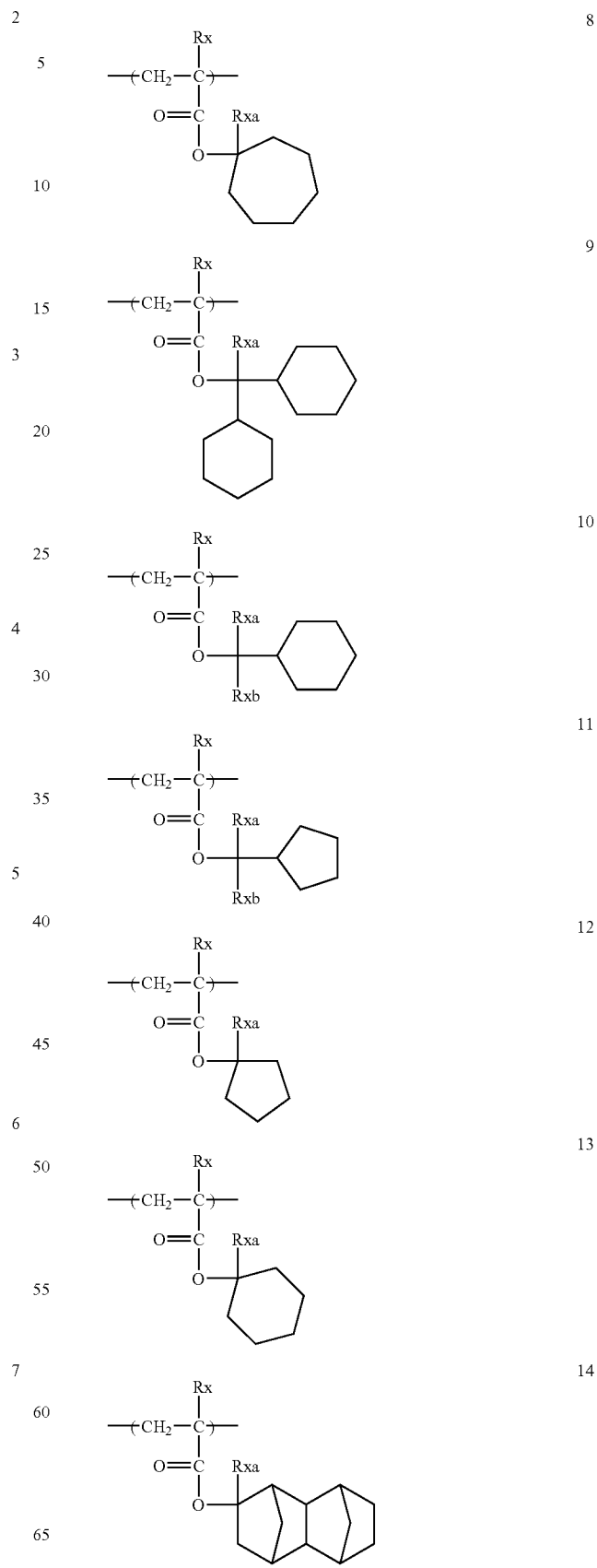

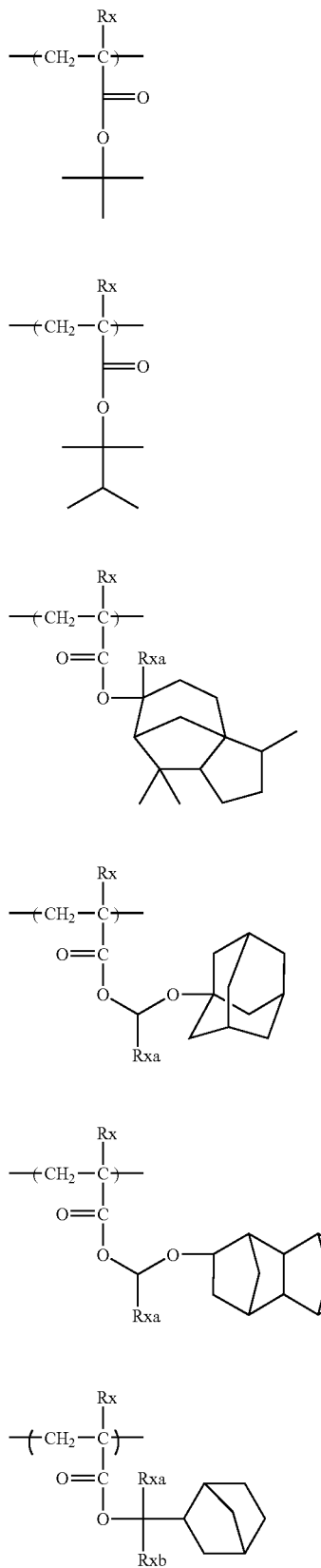
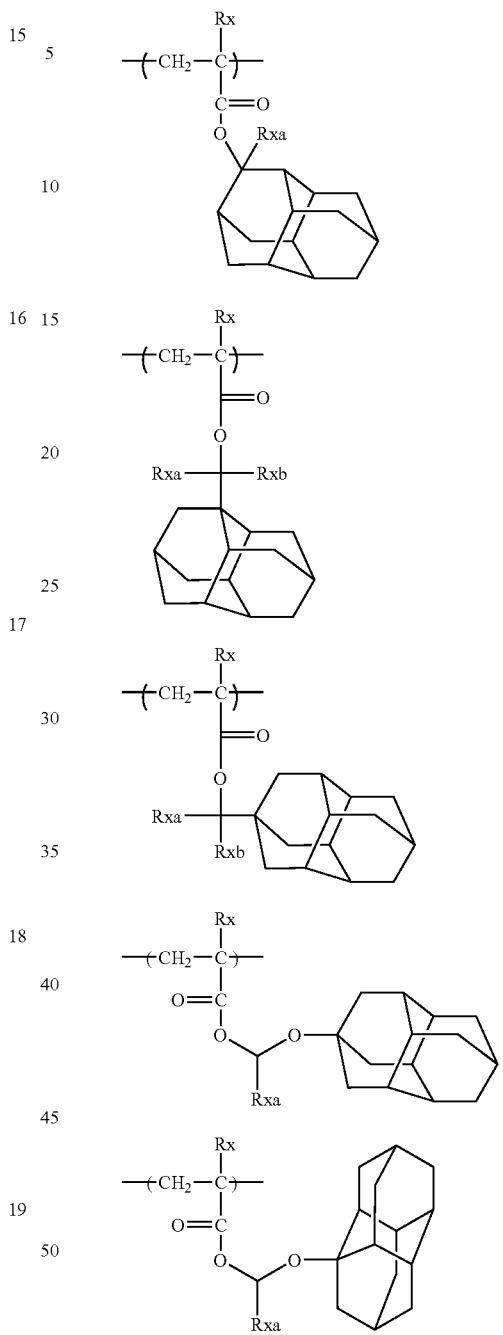

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group for forming a repeating unit comprising an alicyclic hydrocarbon which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of $R_{12}$ to $R_{25}$ in formulae (pI) to (pV).

The atomic group of Z' for forming an alicyclic structure has at least one acid-decomposable group.

The acid-decomposable group includes, for example, a group where the hydrogen atom of an alkali-soluble group such as carboxyl group and hydroxyl group is protected by a group which desorbs under the action of an acid.

Examples of the group which desorbs under the action of an acid include —$C(R_{36})(R_{37})(R_{38})$, —$C(R_{36})(R_{37})(OR_{39})$ and —$C(R_{01})(R_{02})(OR_{39})$.

In the formulae, $R_{36}$ to $R_{39}$ each independently represents an alkyl group, a cycloalkyl group, an aryl group, an aralkyl group or an alkenyl group. $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

The skeleton of the alicyclic hydrocarbon may have a substituent, and examples of the substituent include $R_{13}'$ to $R_{16}'$ in formulae (II-AB1) and (II-AB2).

In the polymer compound of the present invention, the acid-decomposable repeating unit may be contained as at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

As for the acid-decomposable repeating unit, one species may be used but two or more kinds of acid-decomposable repeating units differing in the carbon number of the group which splits off by the effect of an acid are preferably used in combination. By virtue of this, the resolving power and the exposure latitude can be well-balanced.

Various substituents $R_{13}'$ to $R_{16}'$ in formulae (II-AB1) and (II-AB2) may become substituents of the atomic group for forming an alicyclic structure in formula (II-AB) or the atomic group Z for forming a crosslinked alicyclic structure.

Specific examples of the repeating units represented by formulae (II-AB1) and (II-AB2) are set forth below, but the present invention is not limited to these specific examples.

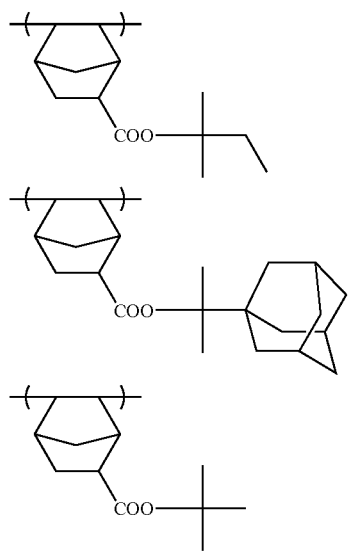

-continued

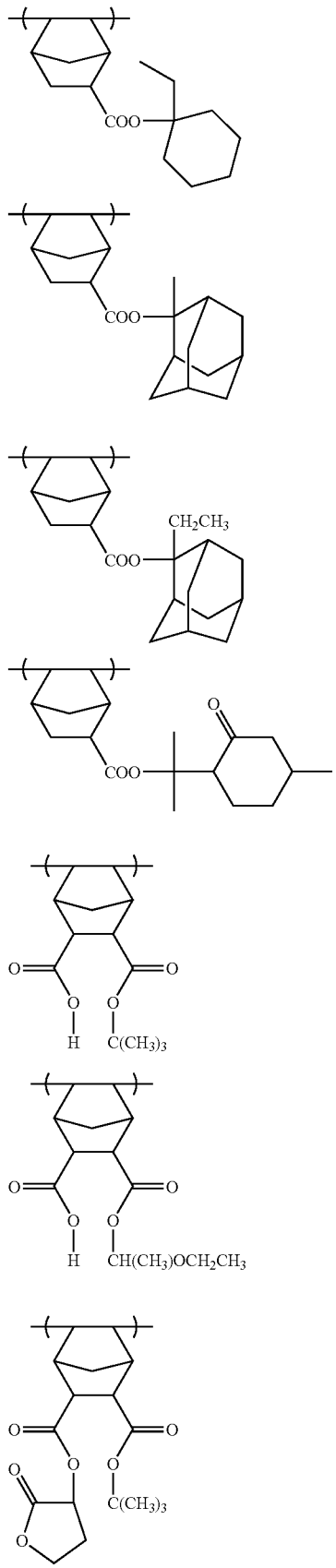

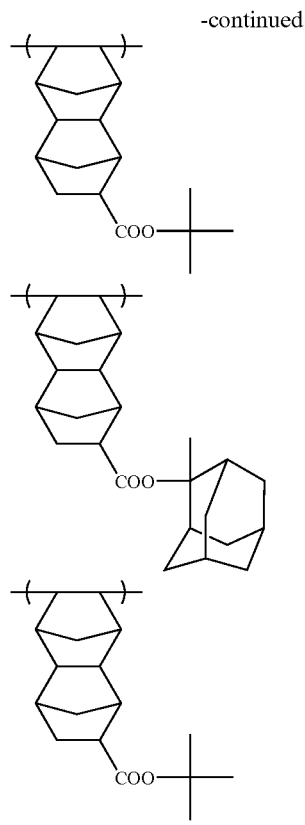

The repeating unit (A) is preferably a repeating unit having a monocyclic alicyclic hydrocarbon group.

The polymer compound produced by the production method of the present invention preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. It is more preferred to have a repeating unit containing a group having a lactone structure represented by any one of the following formulae (LC1-1) to (LC1-16). The group having a lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line edge roughness and development defect are improved.

LC1-1

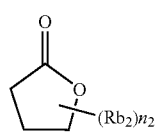

LC1-2

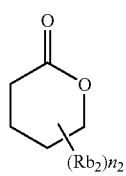

LC1-3

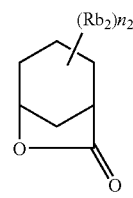

LC1-4

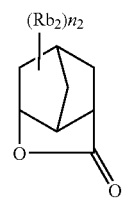

LC1-5

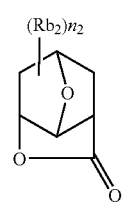

LC1-6

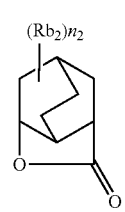

LC1-7

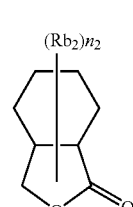

LC1-8

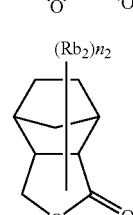

LC1-9

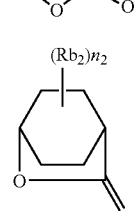

LC1-10

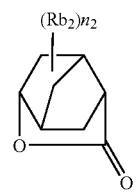

LC1-11

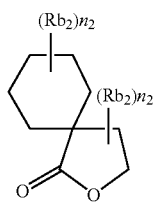

LC1-12

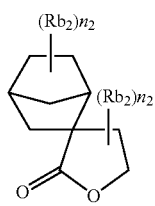

LC1-13

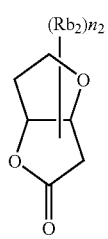

LC1-14

LC1-15

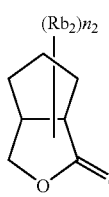

LC1-16

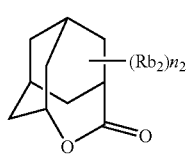

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of substituents ($Rb_2$) may be the same or different and also, the plurality of substituents ($Rb_2$) may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

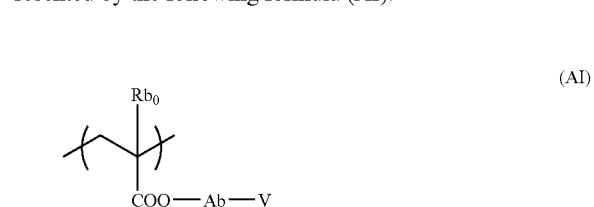

(AI)

In formula (AI), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group comprising a combination thereof. Ab is preferably a single bond or a linking group represented by -$Ab_1$-$CO_2$—. $Ab_1$ is a linear or branched alkylene group or a monocyclic or polycyclic cycloalkylene group, preferably a methylene group, an ethylene group, a cyclohexyl group, an adamantyl group or a norbornyl group.

V represents a group having a structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone structure is preferably from 15 to 60 mol %, more preferably from 20 to 50 mol %, still more preferably from 30 to 50 mol %, based on all repeating units in the polymer.

Specific examples of the repeating unit containing a group having a lactone structure are set forth below, but the present invention is not limited thereto.

(In the formulae, Rx is H, $CH_3$, $CH_2OH$ or $CF_3$.)

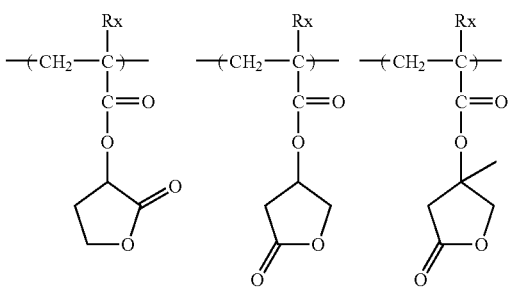

-continued
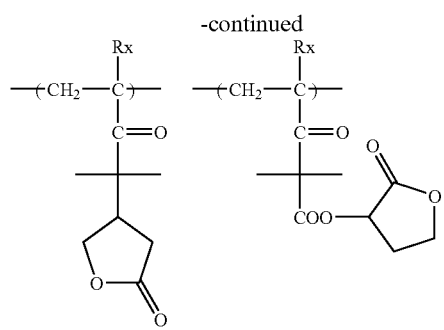
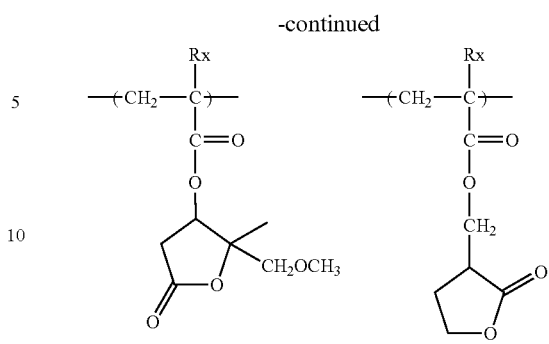
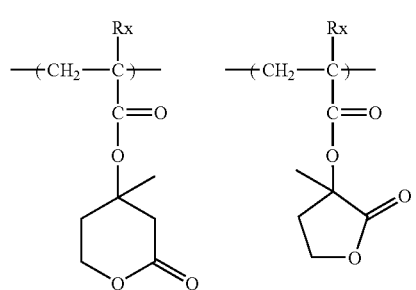
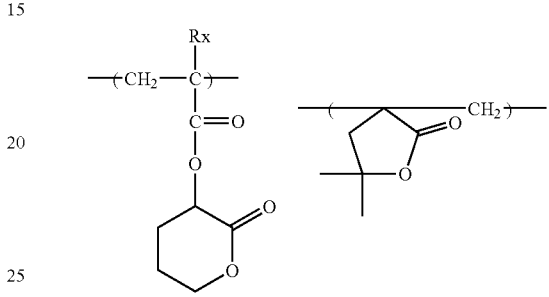
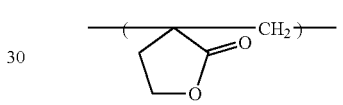
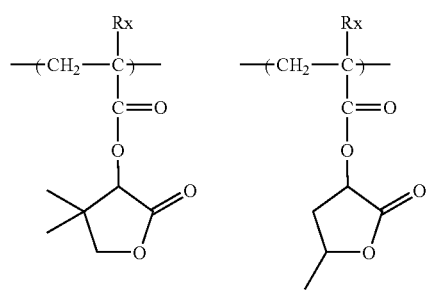
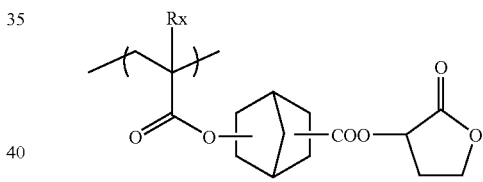
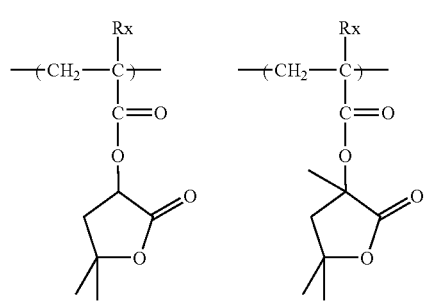
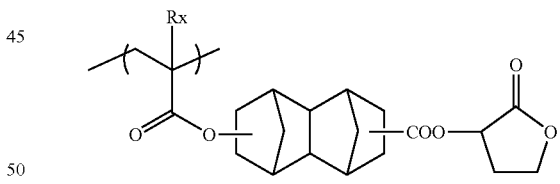
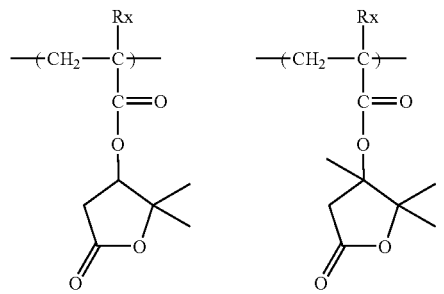
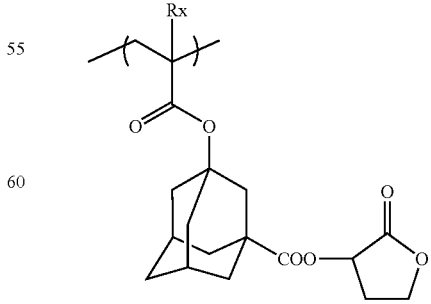
(In the formulae, Rx is H, $CH_3$, $CH_2OH$ or $CF_3$.)

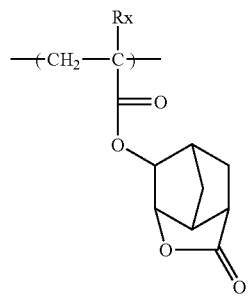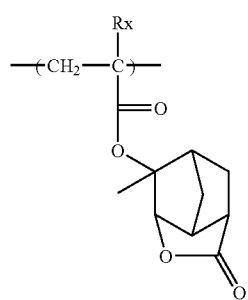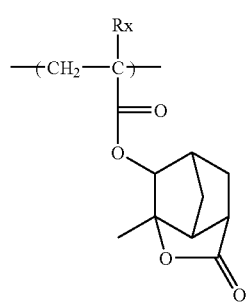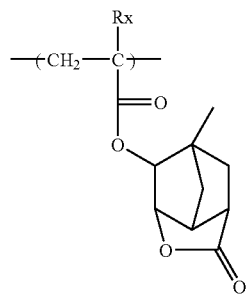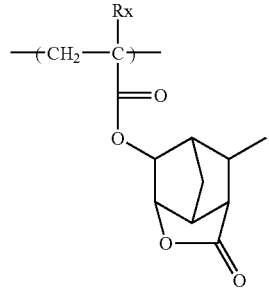
-continued
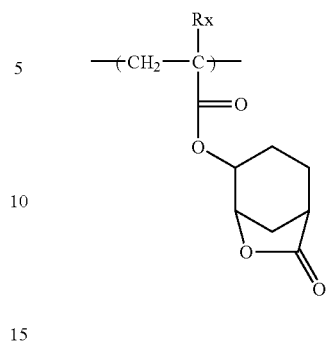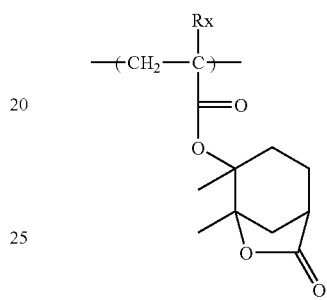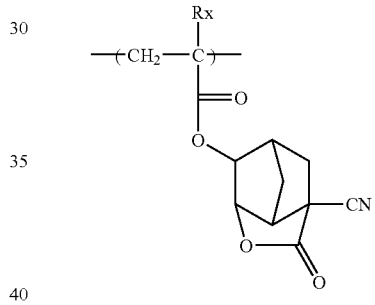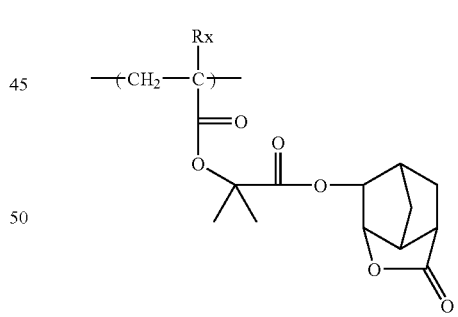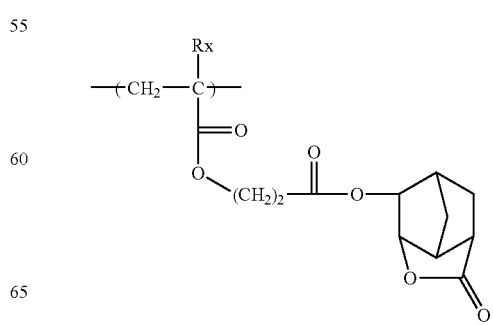

-continued
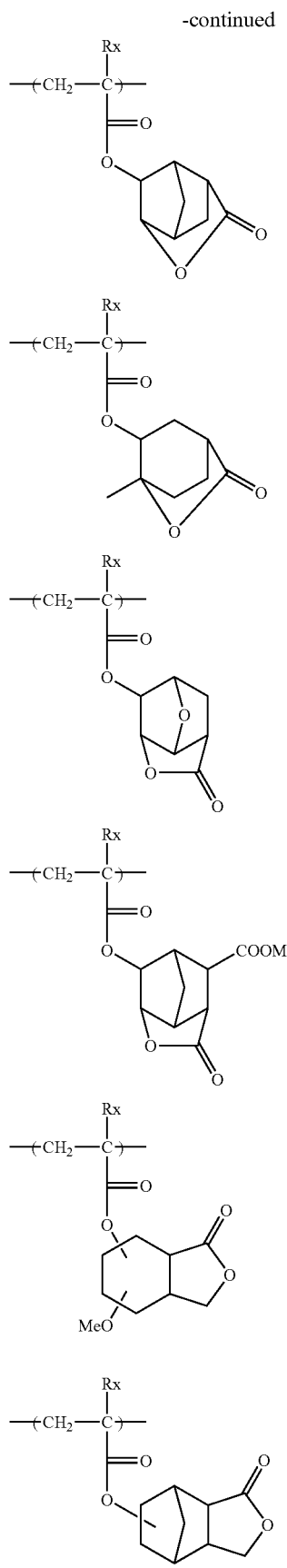
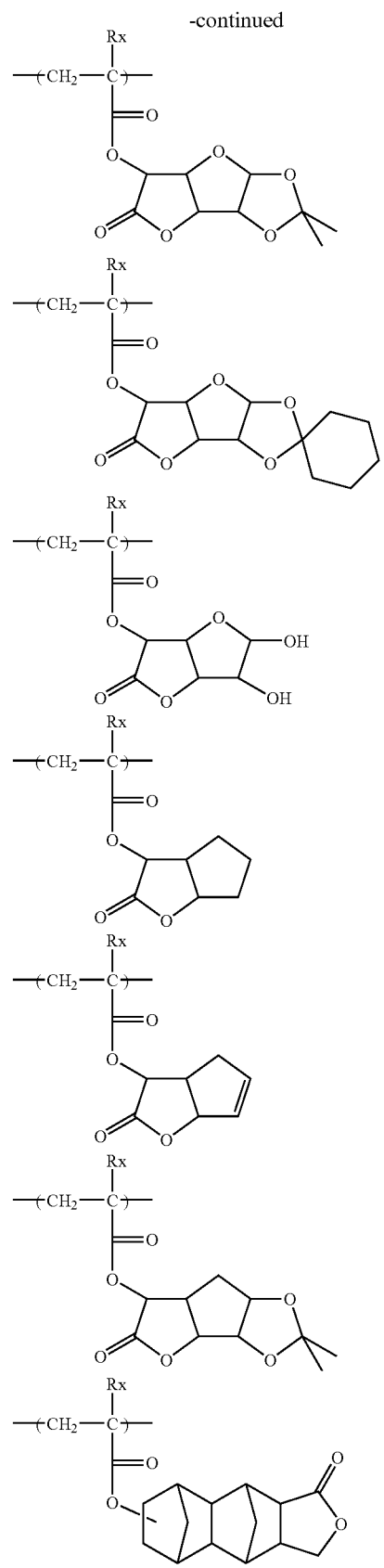
(In the formulae, Rx is H, $CH_3$, $CH_2OH$ or $CF_3$.)

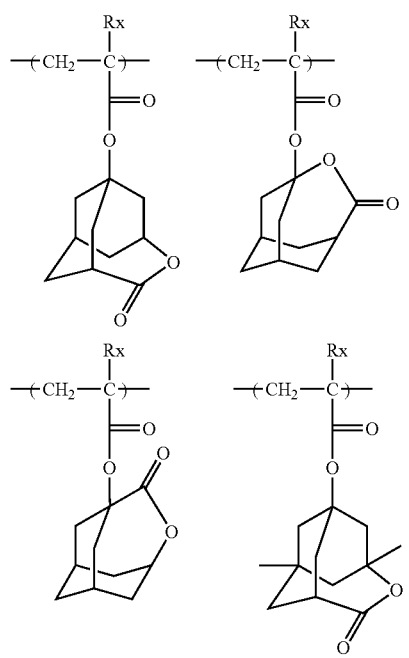
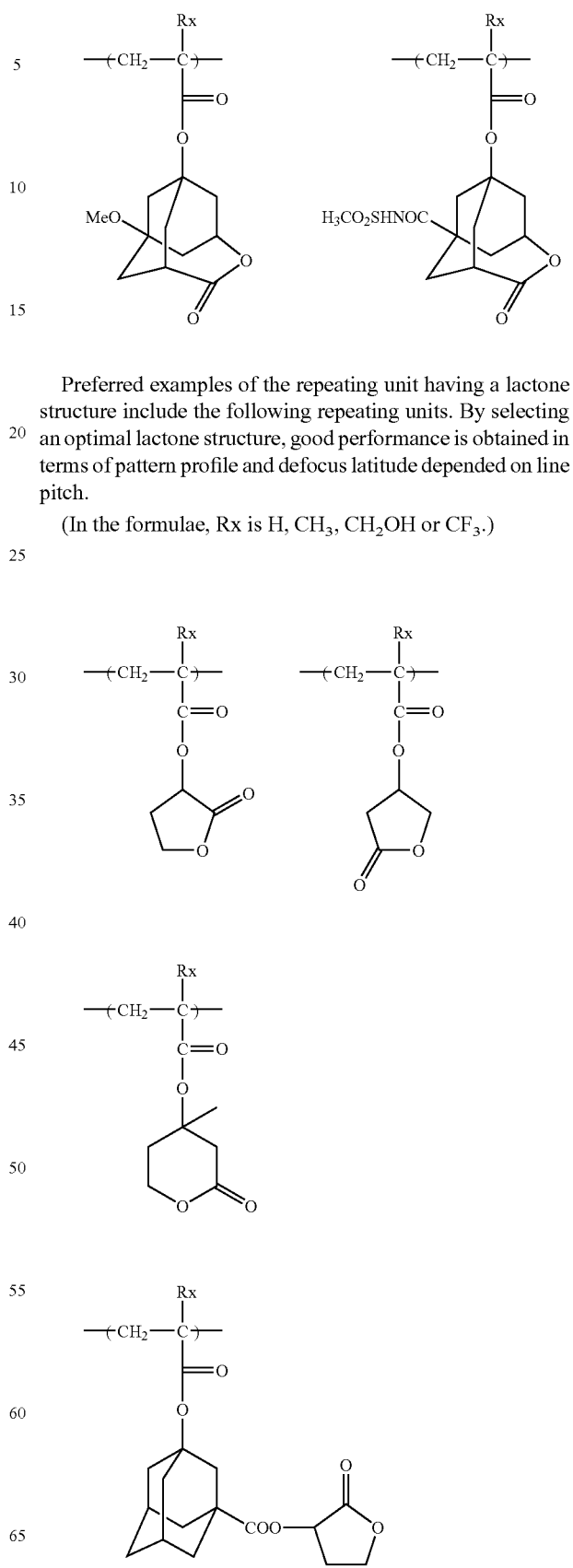
Preferred examples of the repeating unit having a lactone structure include the following repeating units. By selecting an optimal lactone structure, good performance is obtained in terms of pattern profile and defocus latitude depended on line pitch.
(In the formulae, Rx is H, $CH_3$, $CH_2OH$ or $CF_3$.)

-continued

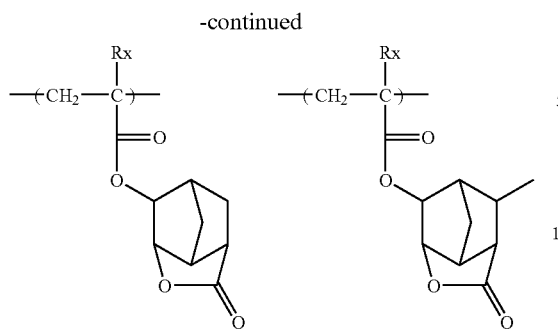
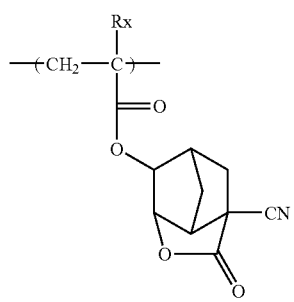
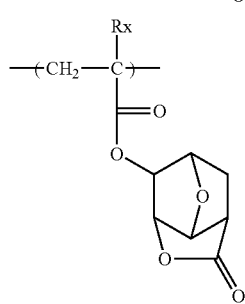
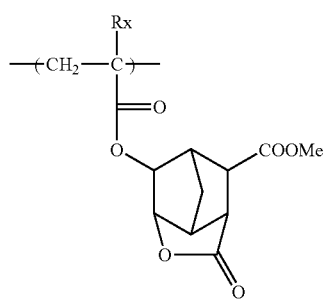
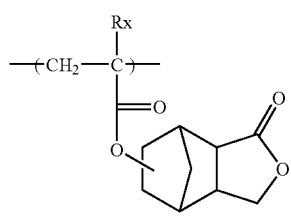
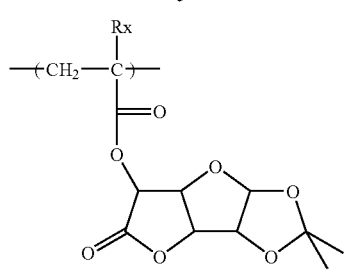

-continued

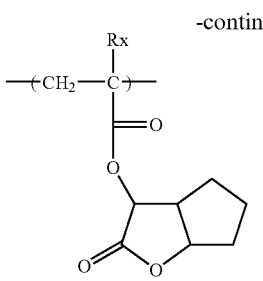

The polymer compound produced by the production method of the present invention preferably contains a repeating unit having an alicyclic hydrocarbon structure substituted by a polar group. By virtue of this repeating unit, the adhesion to substrate and the affinity for developer are enhanced. The alicyclic hydrocarbon structure of the alicyclic hydrocarbon structure substituted by a polar group is preferably an adamantyl group, a diamantyl group or a norbornane group. The polar group is preferably a hydroxyl group or a cyano group. The alicyclic hydrocarbon structure substituted by a polar group is preferably a partial structure represented by any one of the following formulae (VIIa) to (VIId).

(VIIa)

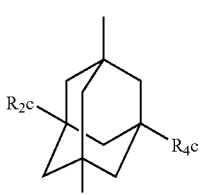

(VIIb)

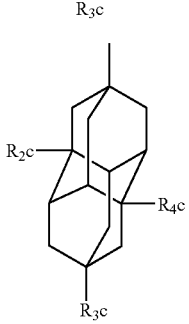

(VIIc)

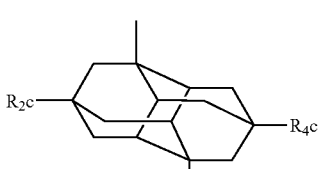

(VIId)

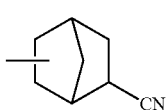

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a group represented by any one of formulae (VIIa) to (VIId) includes a repeating unit where at least one of $R_{13}'$ to $R_{16}'$ in formula (II-AB1) or (II-AB2) has a group represented by any one of formulae (VIIa) to (VIId) (for example, $R_5$ of —COOR$_5$ is a group represented by any one of formulae (VIIa) to (VIId)), and repeating units represented by the following formulae (AIIa) to (AIId).

The content of the repeating unit having an alicyclic hydrocarbon structure substituted by a polar group is preferably from 5 to 40 mol %, more preferably from 5 to 30 mol %, still more preferably from 10 to 25 mol %, based on all repeating units in the polymer.

Specific examples of the repeating unit having a structure represented by formula (AIIa) or (AIIb) are set forth below, but the present invention is not limited thereto.

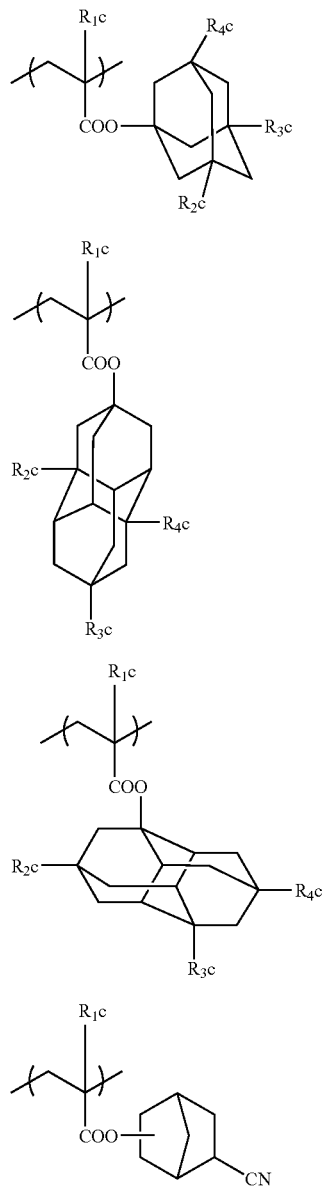

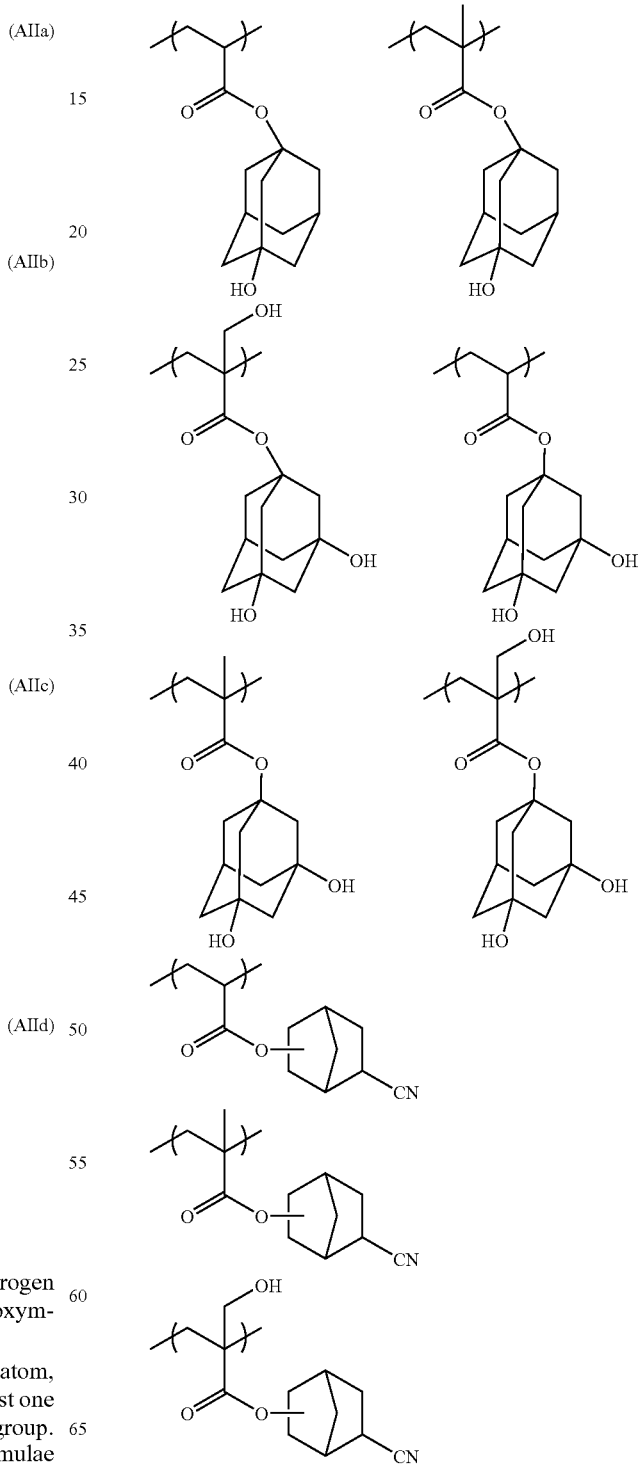

In formulae (AIIa) to (AIId), $R_{1c}$ represents a hydrogen atom, a methyl group, a trifluoromethyl group or a hydroxymethyl group.

$R_{2c}$ to $R_{4c}$ each independently represents a hydrogen atom, a hydroxyl group or a cyano group, provided that at least one of $R_{2c}$ to $R_{4c}$ represents a hydrogen atom or a cyano group. $R_{2c}$ to $R_{4c}$ have the same meanings as $R_{2c}$ to $R_{4c}$ in formulae (VIIa) to (VIIc).

-continued

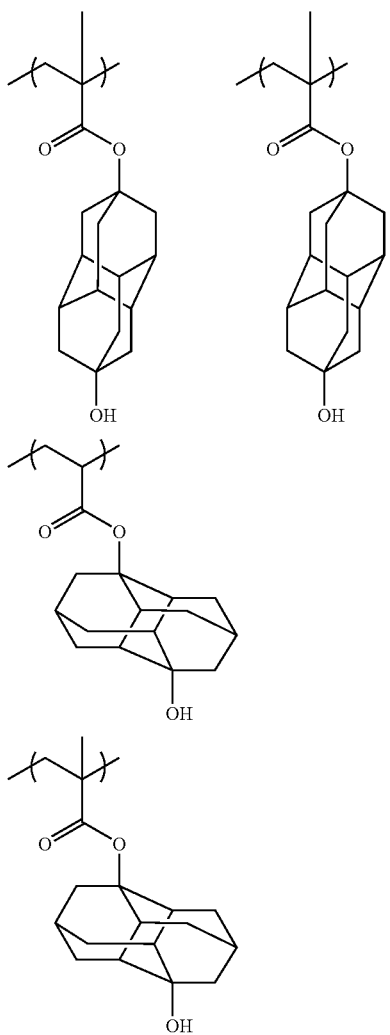

The polymer compound produced by the production method of the present invention may contain a repeating unit represented by the following formula (VIII).

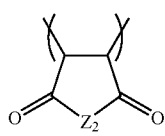
(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

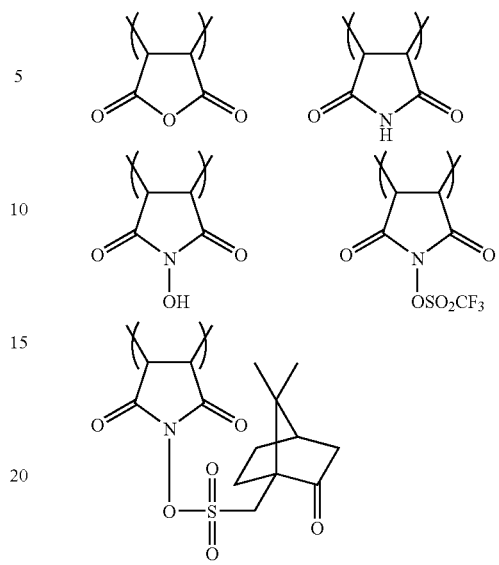

The polymer compound produced by the production method of the present invention preferably contains a repeating unit having an alkali-soluble group. The alkali-soluble group includes a carboxyl group, a sulfonamide group, a sulfonylimide group, a bis-sulfonylimide group and an aliphatic alcohol substituted by an electron-withdrawing group at the α-position (preferably a structure represented by the following formula (F1)). It is more preferred to contain a repeating unit having a carboxyl group or a sulfonamide group.

(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom. It is preferred that $R_{50}$ to $R_{55}$ all are a fluorine atom.

By virtue of containing a repeating unit having an alkali-soluble group, the resolution increases in the usage of forming contact holes. As for the repeating unit having an alkali-soluble group, a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is particularly preferred.

The content of the repeating unit having an alkali-soluble group is preferably from 1 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx represents H, CH₃, CF₃ or CH₂OH).

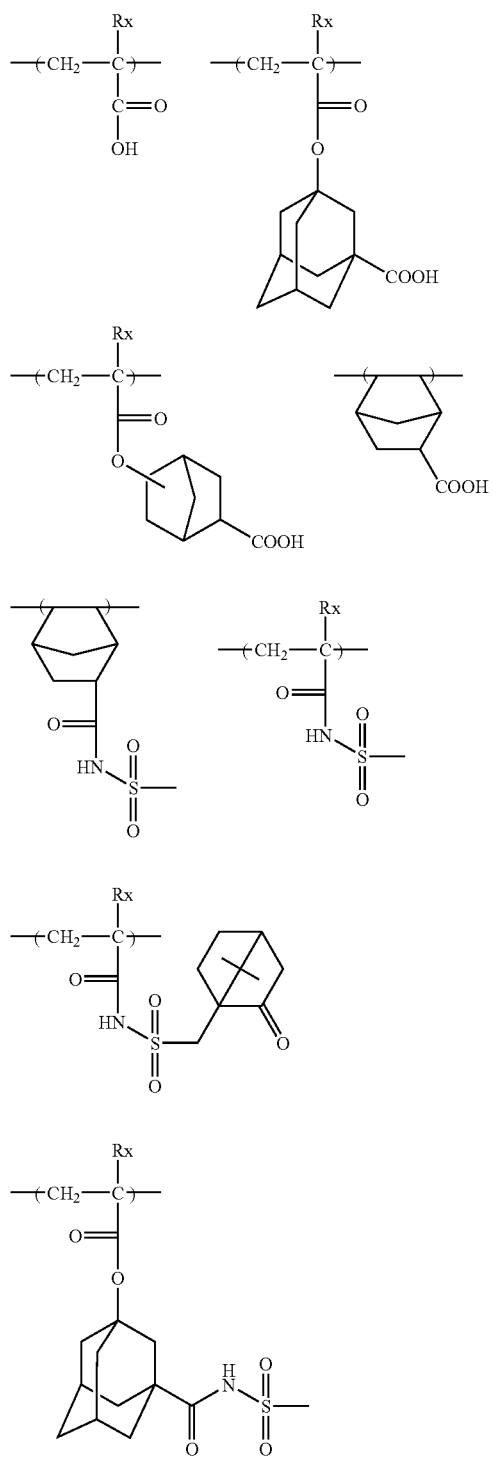

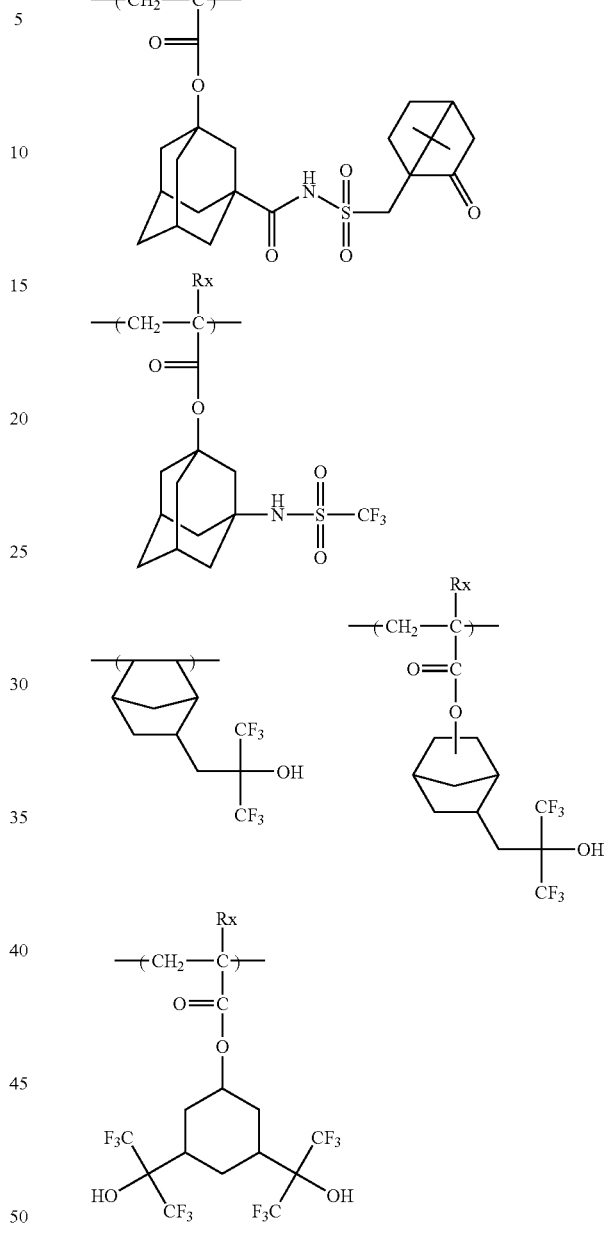

The polymer compound produced by the production method of the present invention may further contain a repeating unit having an alicyclic hydrocarbon structure and not exhibiting acid decomposability. By containing such a repeating unit, the dissolving out of low molecular components from the resist film to the immersion liquid at the immersion exposure can be reduced. Examples of this repeating unit include 1-adamantyl (meth)acrylate, tricyclodecanyl (meth)acrylate and cyclohexyl (meth)acrylate.

The polymer compound produced by the production method of the present invention may contain, in addition to the above-described repeating structural units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the polymer compound, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the polymer compound produced by the production method of the present invention, the molar ratio of respective repeating structural units contained is appropriately set to control the dry etching resistance of resist, suitability for standard developer, adhesion to substrate, resist profile and performances generally required of the resist, such as resolving power, heat resistance and sensitivity.

The preferred embodiment of the polymer compound produced by the production method of the present invention includes the followings:

(1) a polymer compound containing a repeating unit having an alicyclic hydrocarbon-containing partial structure represented by any one of formulae (pI) to (pV) (side chain type),
preferably a polymer compound containing a (meth)acrylate repeating unit having a structure represented by any one of formulae (pI) to (pV), and
(2) a polymer compound containing a repeating unit represented by formula (II-AB) (main chain type).

The polymer compound of (2) further includes:
(3) a polymer compound having a repeating unit represented by formula (II-AB), a repeating unit by a maleic anhydride derivative, and a repeating unit by a (meth)acrylate (hybrid type).

In the polymer compound produced by the production method of the present invention, the content of the acid-decomposable repeating unit is preferably from 10 to 60 mol %, more preferably from 20 to 50 mol %, still more preferably from 25 to 40 mol %, based on all repeating structural units.

In the polymer compound produced by the production method of the present invention, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the polymer compound produced by the production method of the present invention, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit based on the monomer as the further copolymerization component in the resin can also be appropriately set according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the positive photosensitive composition of the present invention for exposure with ArF, the resin preferably has no aromatic group in view of transparency to ArF light.

The polymer compound produced by the production method of the present invention is preferably a polymer compound where all repeating units are composed of a (meth)acrylate repeating unit. In this case, all repeating units may be a methacrylate repeating unit, all repeating units may be an acrylate repeating unit, or the repeating units may be a mixture of methacrylate/acrylate repeating units, but the content of the acrylate repeating unit is preferably 50 mol % or less based on all repeating units.

The polymer compound produced by the production method of the present invention is more preferably a copolymerization polymer comprising from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having an alicyclic hydrocarbon structure substituted by a polar group, or a copolymerization polymer additionally comprising from 0 to 20 mol % of other repeating units.

In particular, the polymer compound is preferably a copolymerization polymer comprising from 20 to 50 mol % of the acid-decomposable repeating unit represented by any one of the following formulae (ARA-1) to (ARA-5), from 20 to 50 mol % of the repeating unit having a lactone group represented by any one of the following formulae (ARL-1) to (ARL-6), and from 5 to 30 mol % of the repeating unit having an alicyclic hydrocarbon structure substituted by a polar group represented by any one of the following formulae (ARH-1) to (ARH-3), or a copolymerization polymer further comprising from 5 to 20 mol % of the repeating unit containing a carboxyl group or a structure represented by formula (F1) and the repeating unit having an alicyclic hydrocarbon structure and not exhibiting acid decomposability.

In the formulae, $Rxy_1$ represents a hydrogen atom or a methyl group, and $Rxa_1$ and $Rxb_1$ each independently represents a methyl group or an ethyl group.

ARA-1

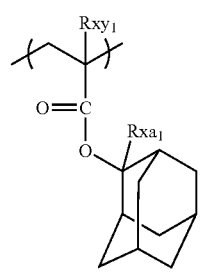

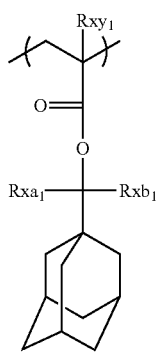
ARA-2
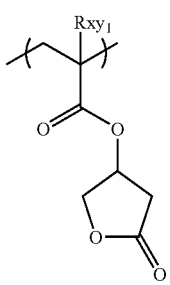
ARL-3
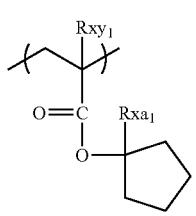
ARA-3
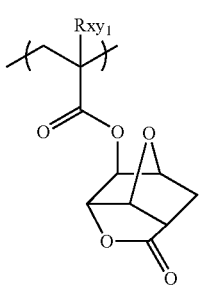
ARL-4
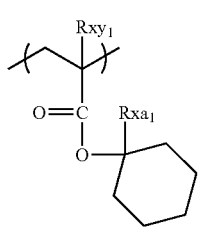
ARA-4
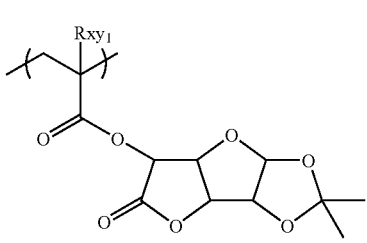
ARL-5
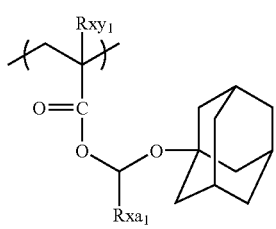
ARA-5
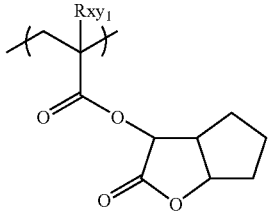
ARL-6
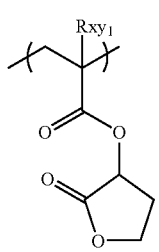
ARL-1
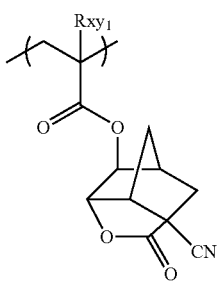
ARL-7
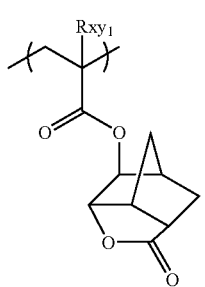
ARL-2
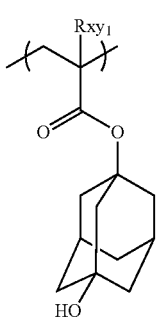
ARH-1

-continued

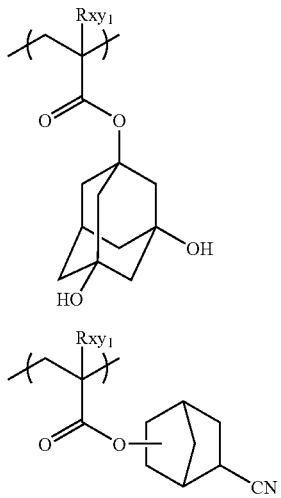

ARH-2

ARH-3

In the polymer compound of the present invention, the combination of the structure represented by formula (1) and the acid-decomposable repeating unit (A) is preferably a combination where one of the substituents $R_3$ and $R_4$ in the structure represented by formula (1) is an alkyl group with the other being a hydrogen atom and at least one of the substituents $Rxa_1$ and $Rxb_1$ in the acid-decomposable repeating units (ARA-1) to (ARA-5) is a methyl group.

Also, a compound where the substituent $R_1$ in the structure represented by formula (1) is a polycyclic alicyclic group and the acid-decomposable repeating unit (A) has a monocyclic alicyclic group is preferred.

In the case of irradiating the positive photo-sensitive composition of the present invention with KrF laser light, electron beam, X-ray or high energy beam at a wavelength of 50 nm or less (e.g., EUV), the polymer compound is preferably an acid-decomposable resin having a hydroxystyrene-based repeating unit (hereinafter sometimes referred to as a "hydroxystyrene-based acid-decomposable resin"). Preferred examples of the hydroxystyrene-based acid-decomposable resin include a copolymer of hydroxystyrene/hydroxystyrene protected by a group which desorbs under the action of an acid, a hydroxystyrene/tertiary alkyl (meth)acrylate copolymer, a copolymer of hydroxystyrene/hydroxystyrene protected by a group which desorbs under the action of an acid/tertiary alkyl (meth)acrylate, a copolymer of hydroxystyrene/hydroxystyrene protected by a group which desorbs under the action of an acid/styrene, a hydroxystyrene/tertiary alkyl (meth)acrylate/styrene copolymer, and a copolymer of hydroxystyrene/hydroxystyrene protected by a group which desorbs under the action of an acid/tertiary alkyl (meth)acrylate/styrene.

In the hydroxystyrene-based acid-decomposable resin, the content of the acid-decomposable group is expressed by B/(B+S) using the number (B) of acid-decomposable groups in the resin and the number (S) of alkali-soluble groups not protected by a group which desorbs under the action of an acid. The content is preferably from 0.01 to 0.7, more preferably from 0.05 to 0.50, still more preferably from 0.05 to 0.40.

The polymer compound (X) can be polymerized by an ordinary method, for example, by radical polymerization. Examples of the polymerization method in general include a batch polymerization method of dissolving monomer species and an initiator in a solvent and heating the solution, thereby effecting the polymerization, and a dropping polymerization method of adding dropwise a solution containing monomer species, a thiol compound and a polymerization initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive photosensitive composition of the present invention. By the use of this solvent, production of particles during storage can be suppressed.

The polymerization reaction is preferably performed in an inert gas atmosphere such as nitrogen and argon.

As for the thiol compound and polymerization initiator, the above-described thiol compound and polymerization initiator can be used.

After the completion of reaction, the reactant is poured in a solvent, and the desired polymer compound (X) is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 60 to 100° C.

The polymer compound of the present invention can be produced by subsequently reacting the polymer compound (X) with a vinyl ether compound or a halomethyl ether compound (acetalization reaction)

The weight average molecular weight of the polymer compound of the present invention is preferably from 1,000 to 200,000, more preferably from 3,000 to 20,000, and most preferably from 5,000 to 15,000, in terms of polystyrene as measured by the GPC method. When the weight average molecular weight is from 1,000 to 200,000, deterioration of heat resistance, dry etching resistance and developability can be prevented and at the same time, the film-forming property can be prevented from deteriorating due to increase in the viscosity.

The molecular weight distribution is usually from 1 to 5, preferably from 1 to 3, more preferably from 1 to 2. As the molecular weight distribution is smaller, the resolution and resist profile are more excellent, the side wall of the resist pattern is smoother, and the performance in terms of roughness is higher.

In the positive photosensitive composition of the present invention, as regards all polymer compounds for use in the present invention, the blending amount in the composition as a whole is preferably from 60 to 99 mass %, more preferably from 80 to 98 mass %, based on the entire solid content.

Also, in the present invention, as for the polymer compound, one species may be used or a plurality of species may be used in combination.

Specific examples of the repeating units in the polymer compound of the present invention are set forth below, but the present invention is not limited thereto.

(1)
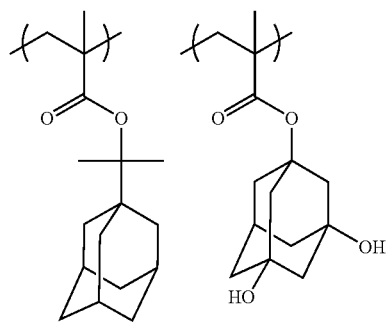
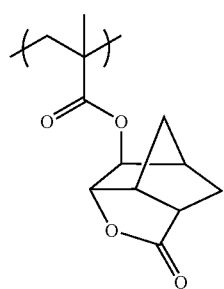
(2)
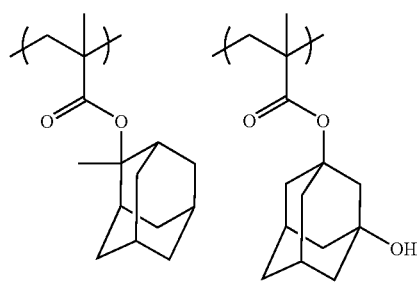
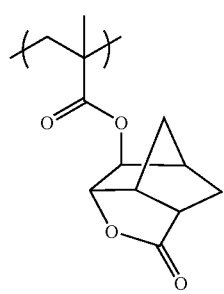
(3)
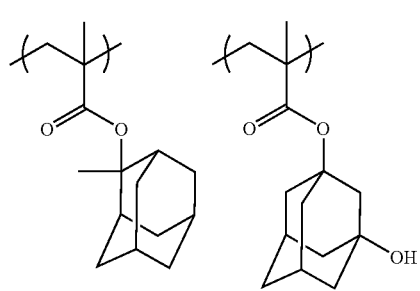
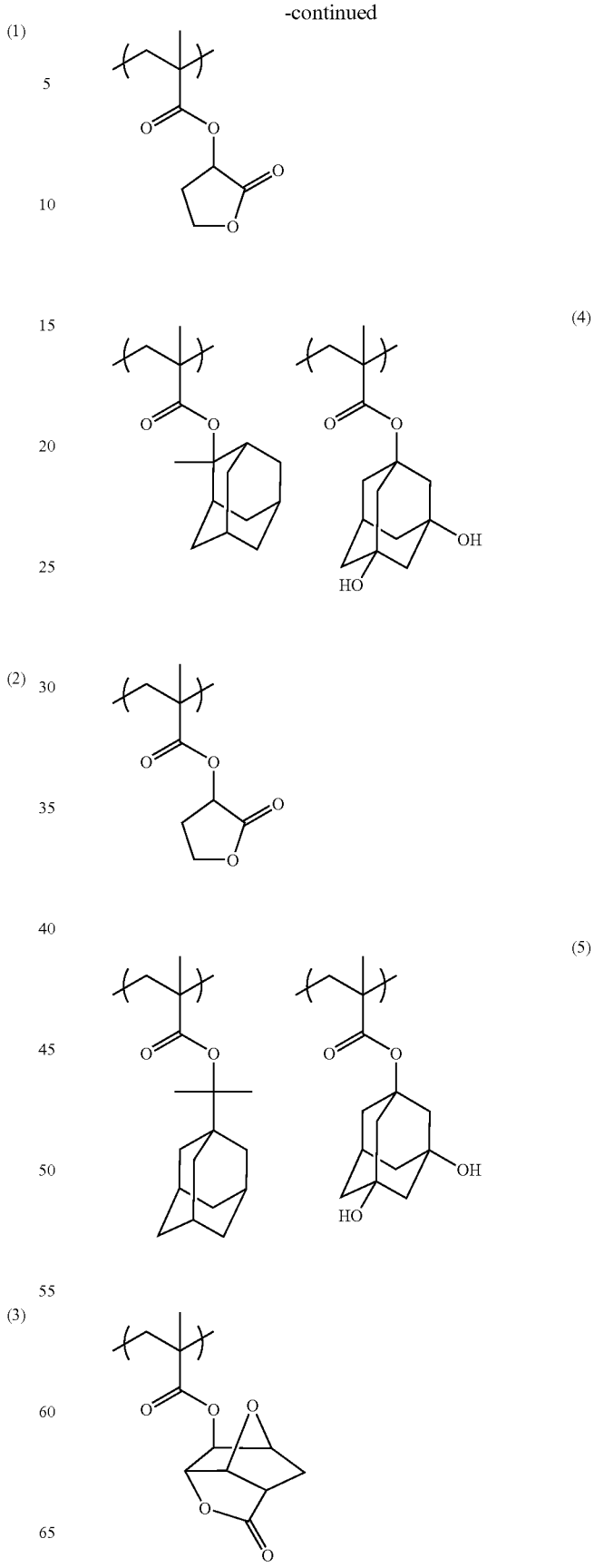

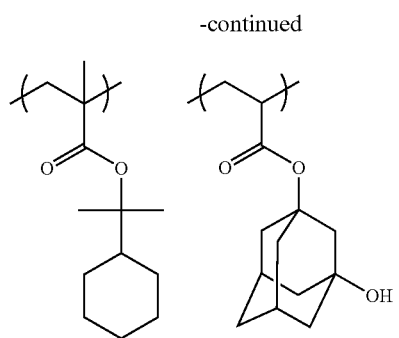
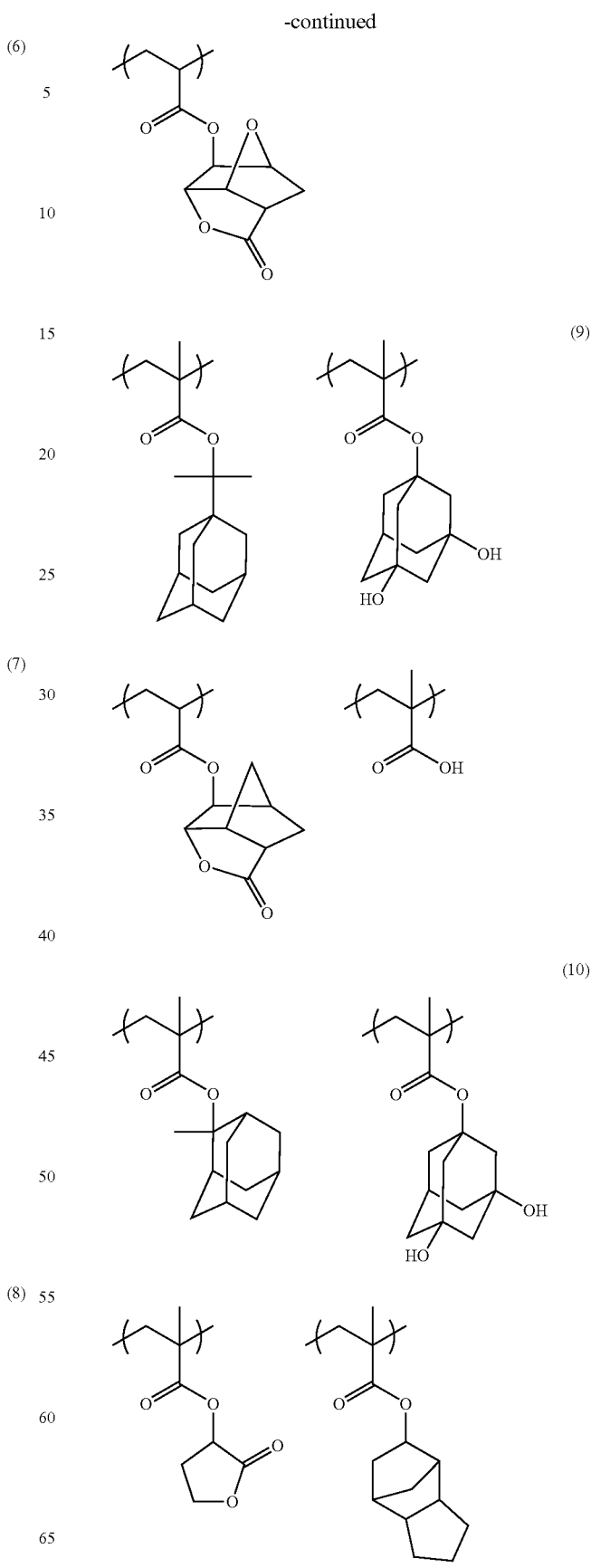

-continued
(11)
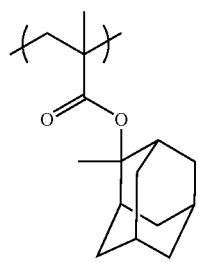 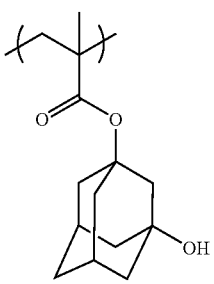
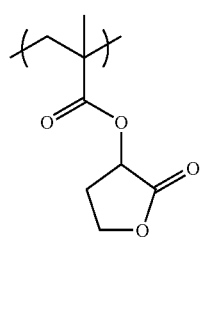 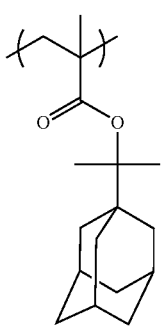
(12)
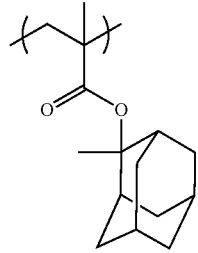 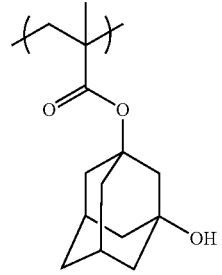
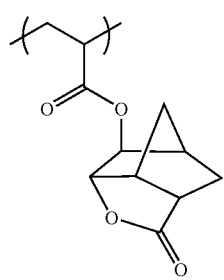 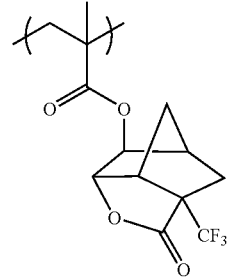
(13)
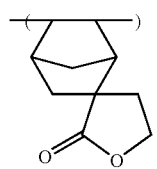 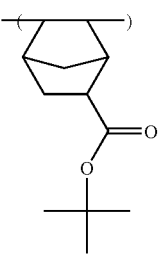
-continued
(14)
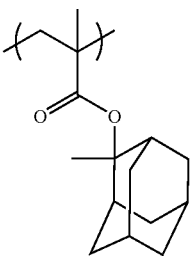 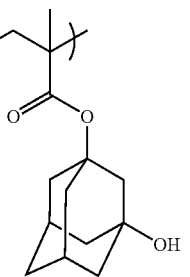
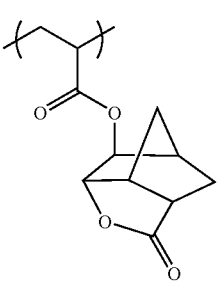 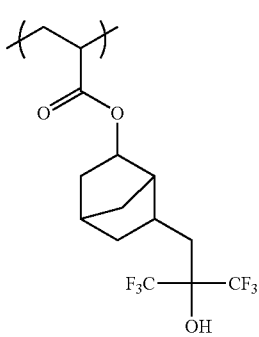
(15)
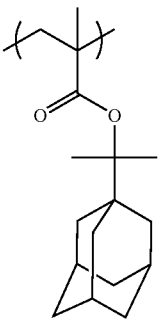 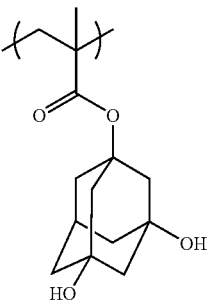
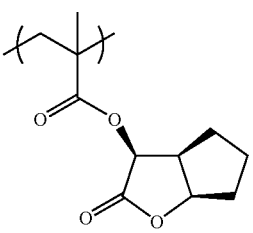 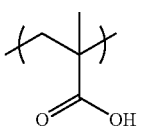
(16)
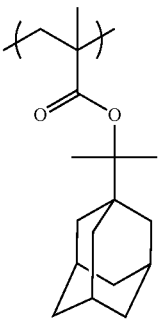 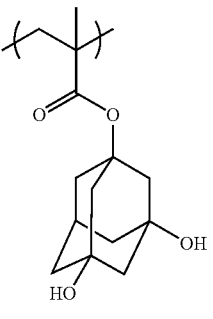

-continued
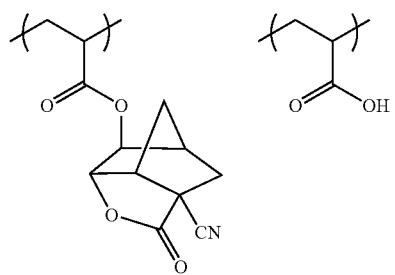
(17)
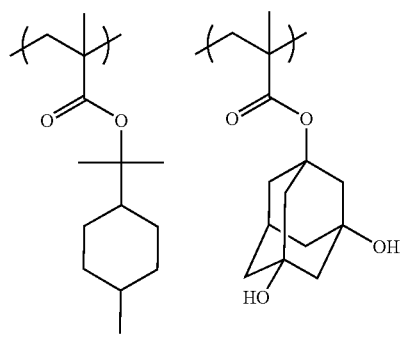
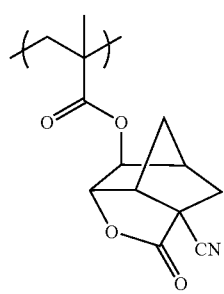
(18)
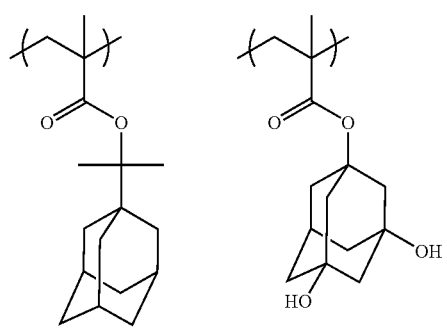
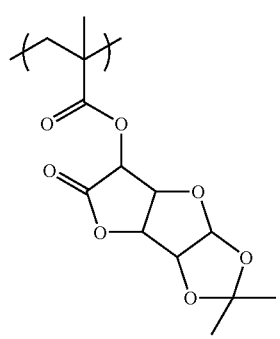
-continued
(19)
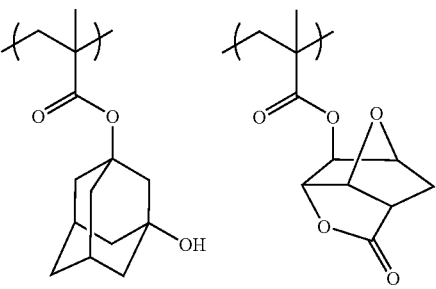
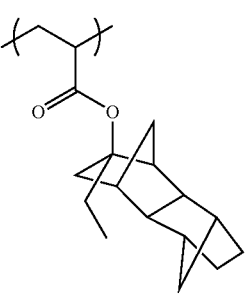
(20)
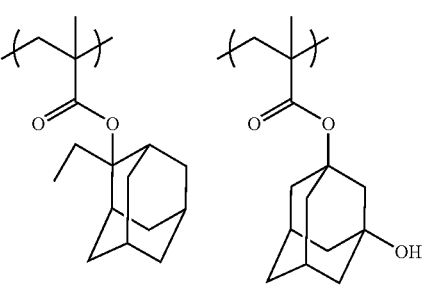
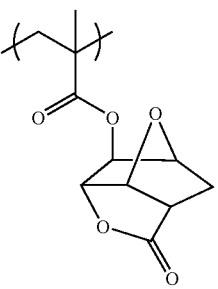
(21)
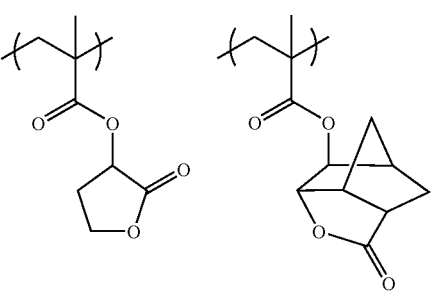

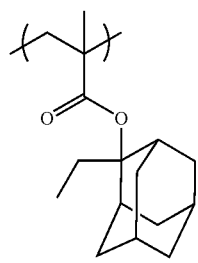
(22)
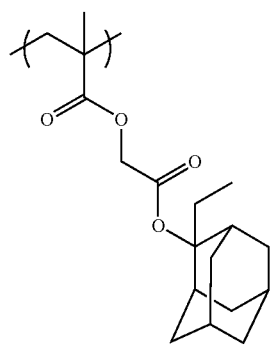
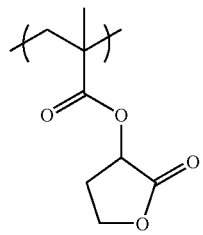
(23)
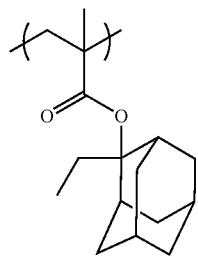
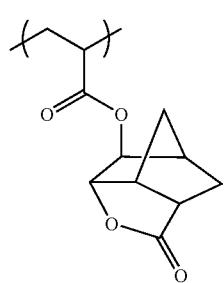
(24)
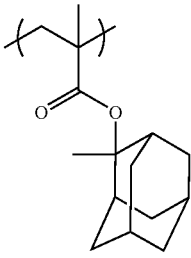 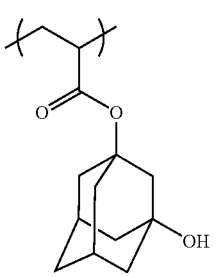
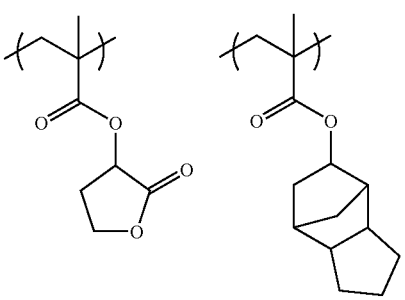
(25)
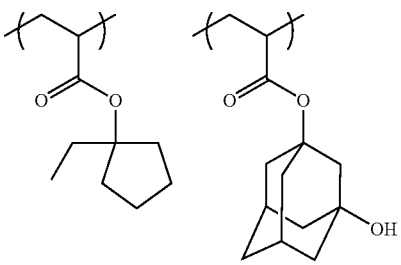
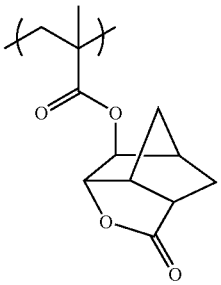
(R-1)
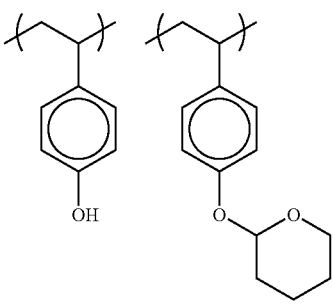

-continued
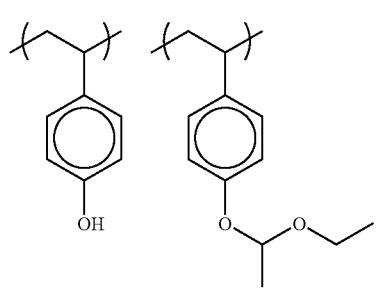 (R-2)
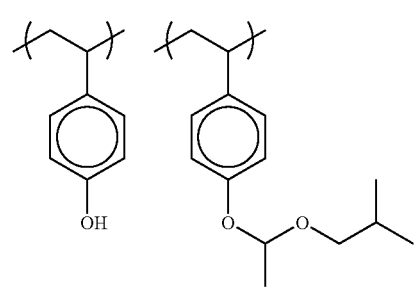 (R-3)
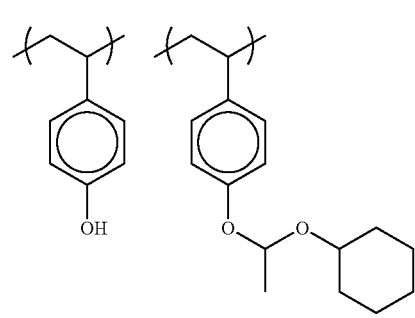 (R-4)
(R-5)
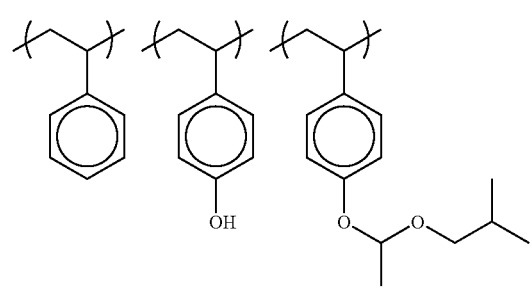 (R-6)
-continued
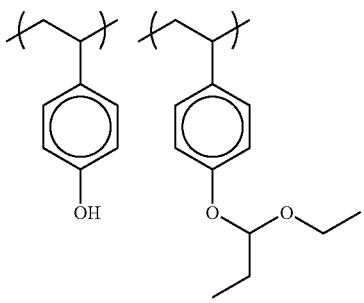 (R-7)
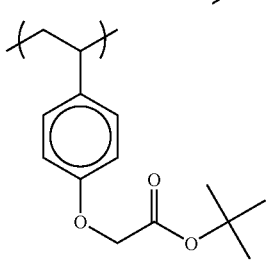
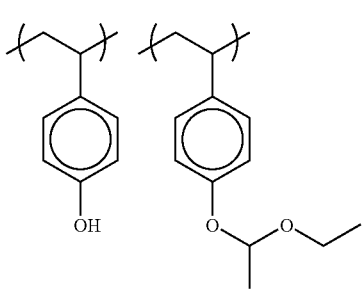 (R-8)
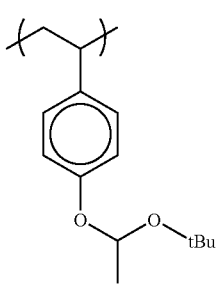
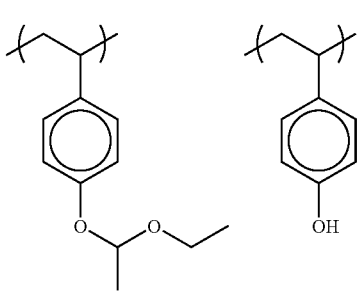 (R-9)
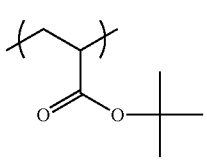

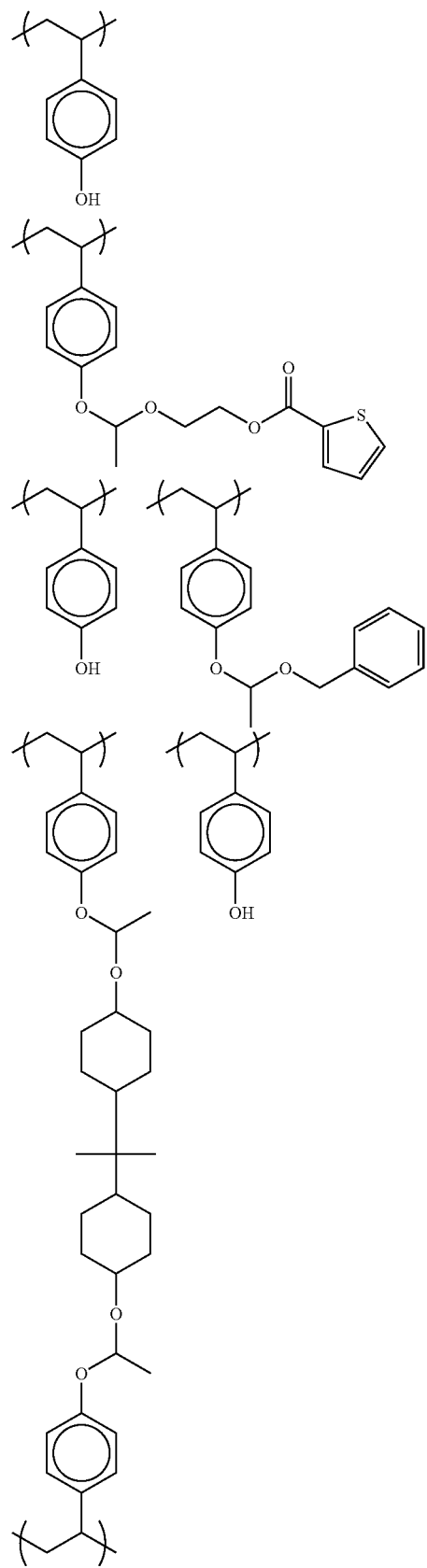
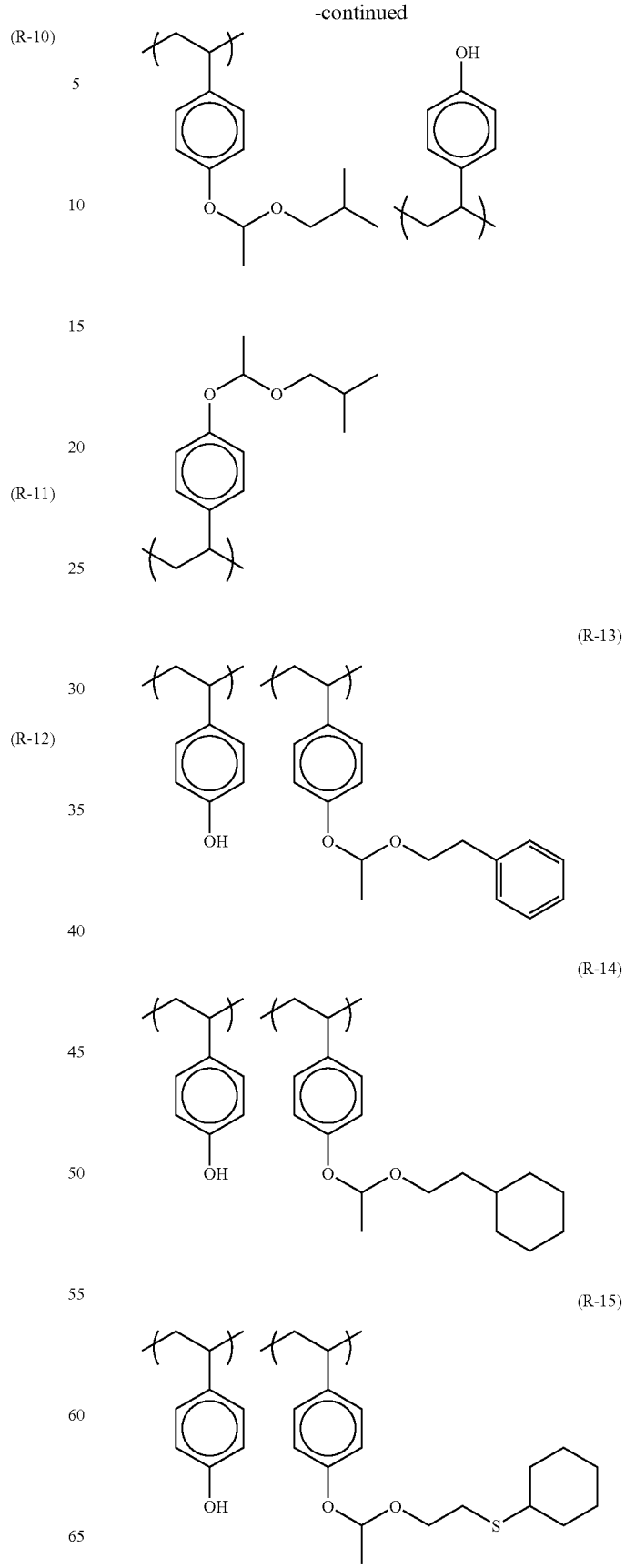

-continued
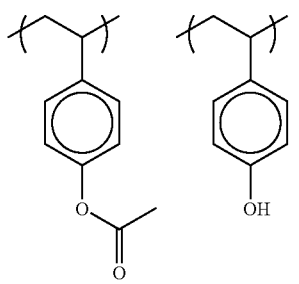
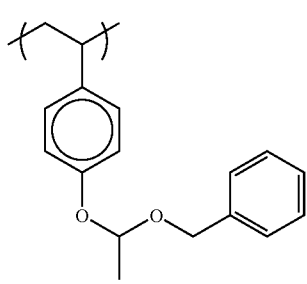
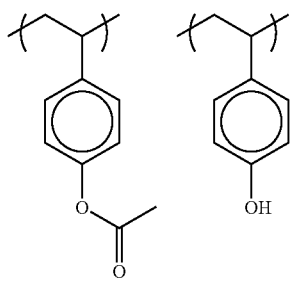
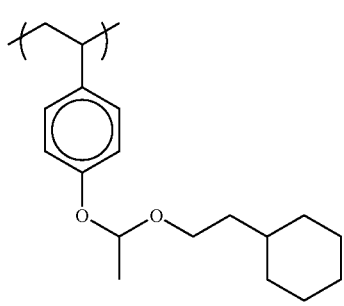
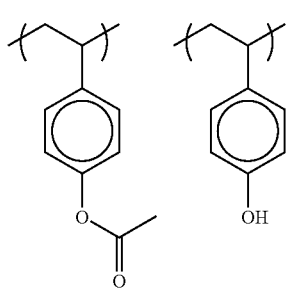
-continued
(R-16)
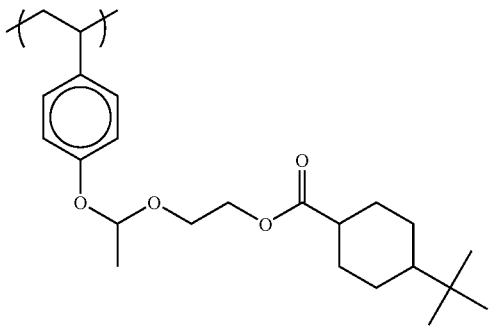
(R-17)
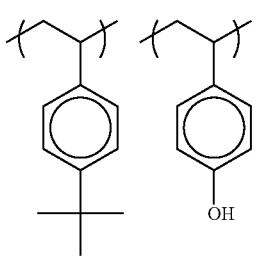
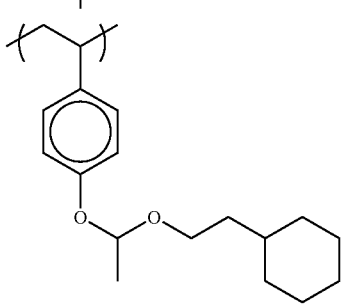
(R-18)
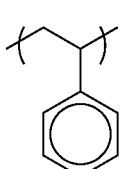
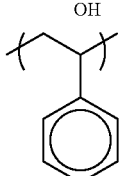
(R-19)
(R-20)
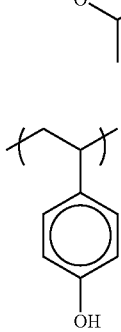
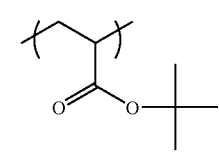
(R-21)

(R-22)
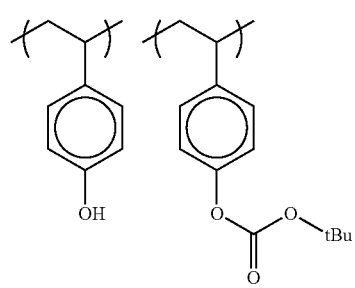
(R-23)
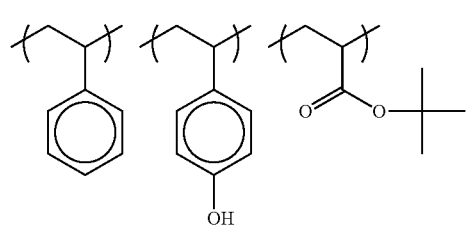
(R-24)
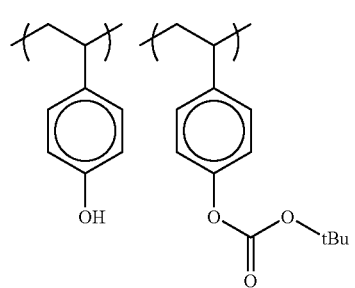
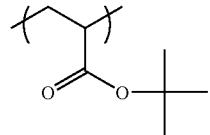
(R-25)
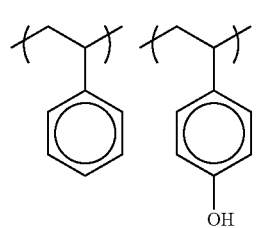
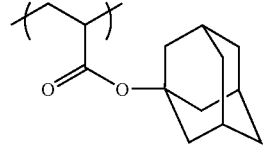
(R-26)
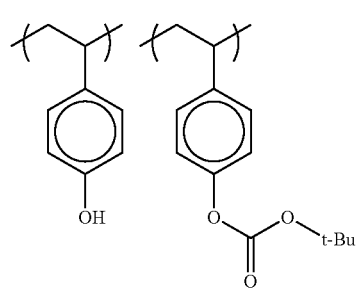
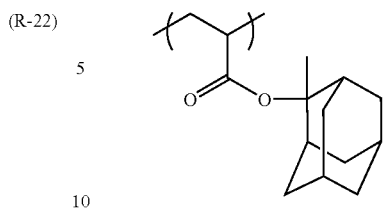
(R-27)
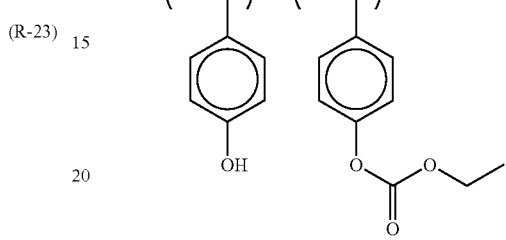
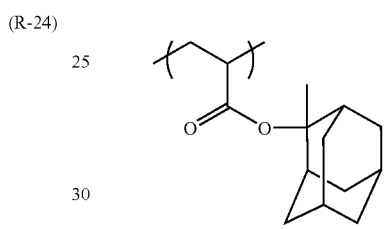
(R-28)
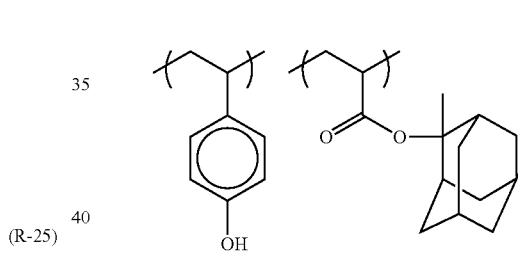
(R-29)
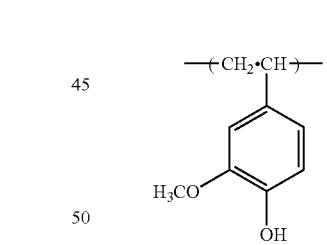
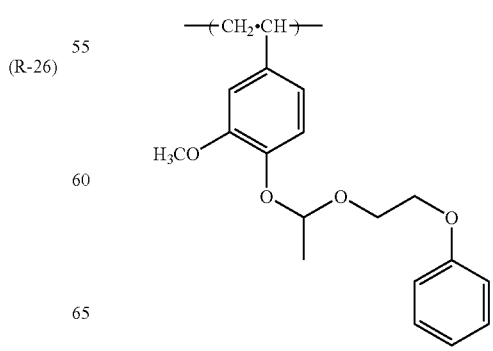

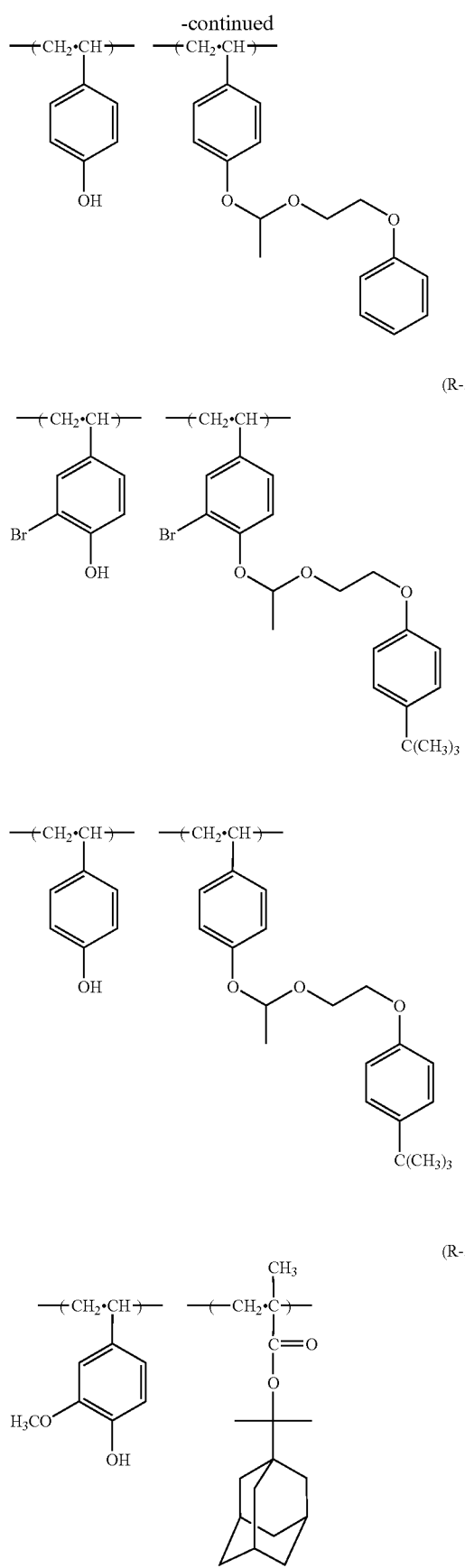
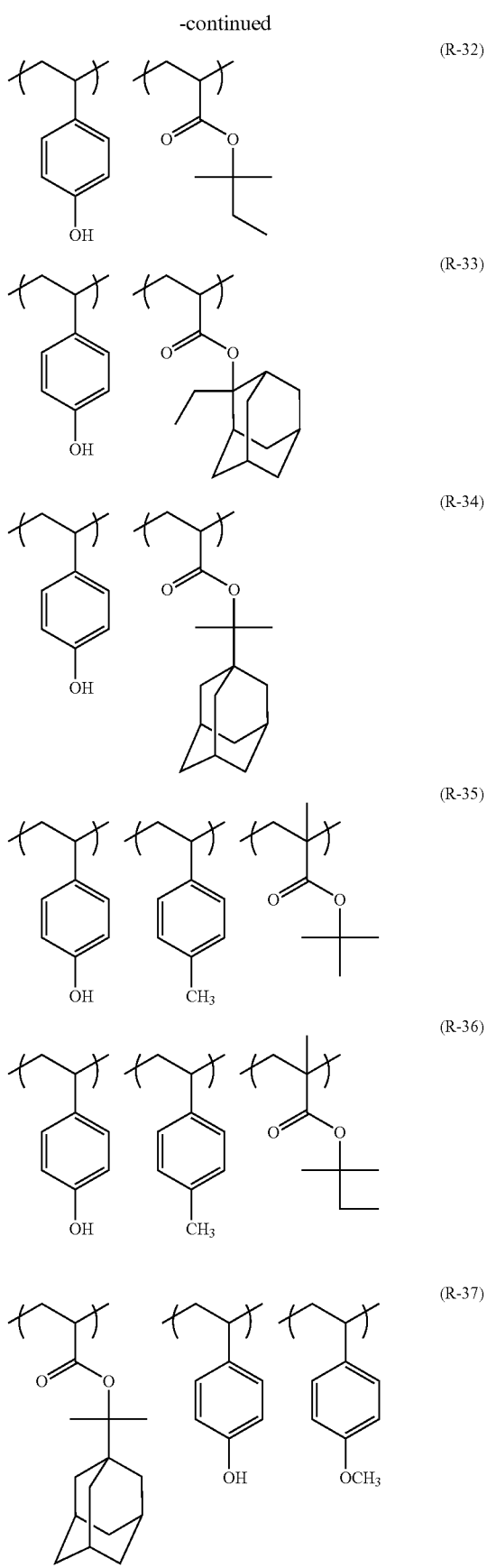

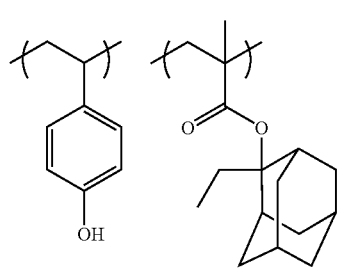 (R-38)
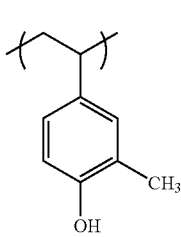 (R-43)
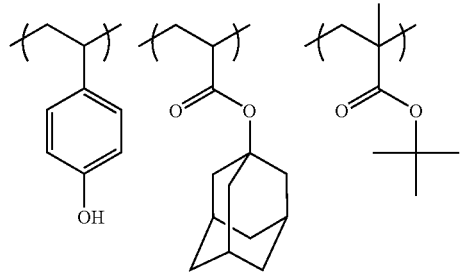 (R-39)
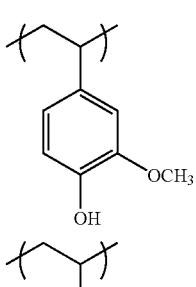 (R-44)
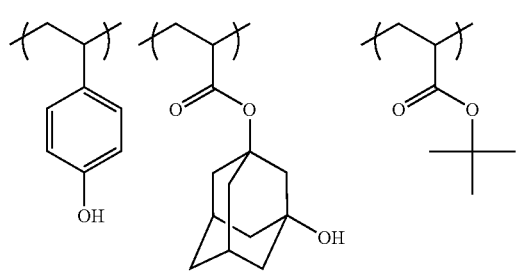 (R-40)
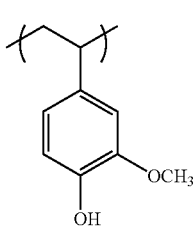 (R-45)
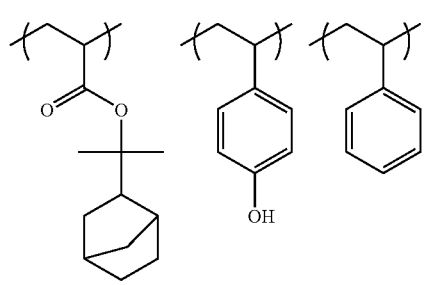 (R-41)
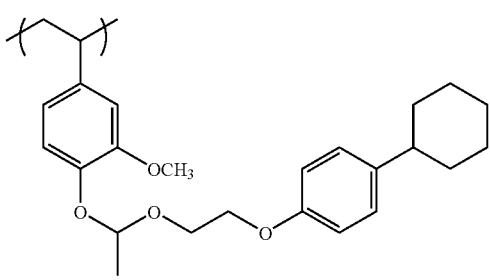
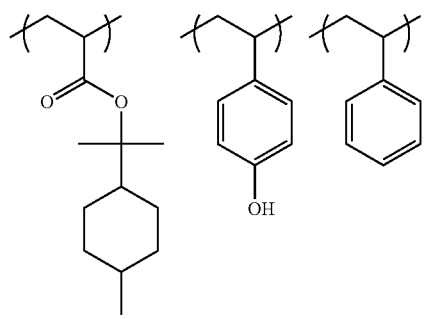 (R-42)
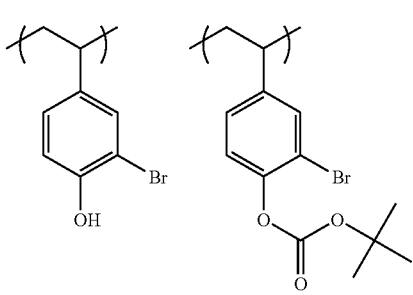 (R-46)

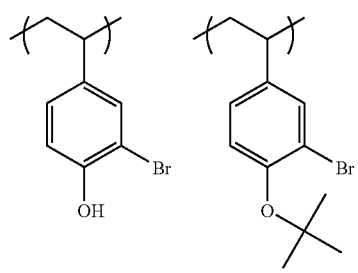
(R-47)
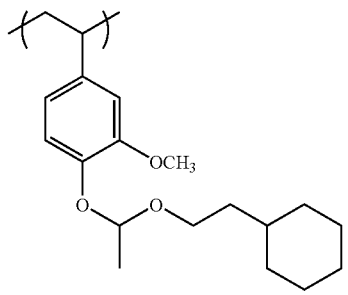
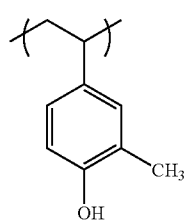
(R-48)
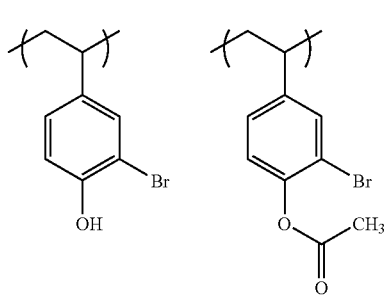
(R-51)
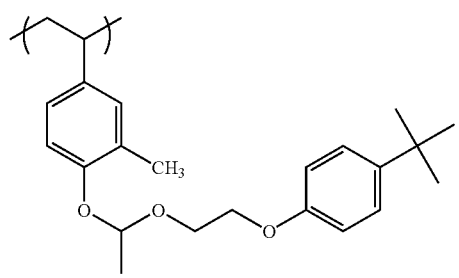
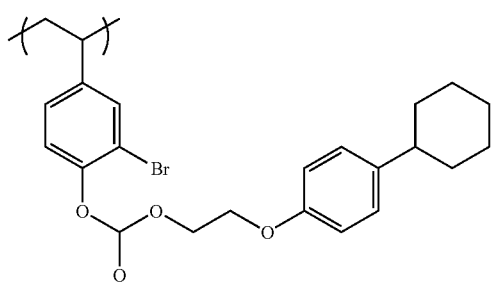
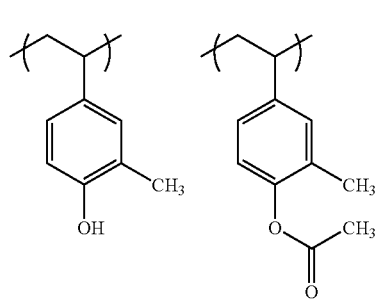
(R-49)
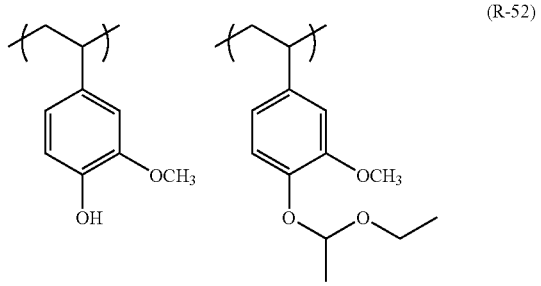
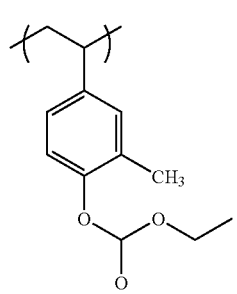
(R-52)
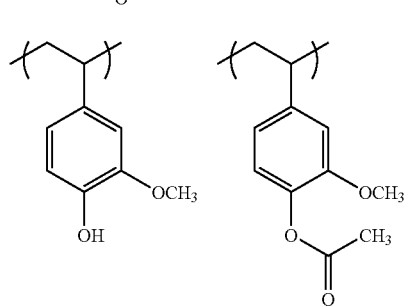
(R-50)
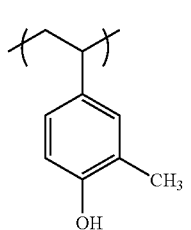
(R-53)

-continued
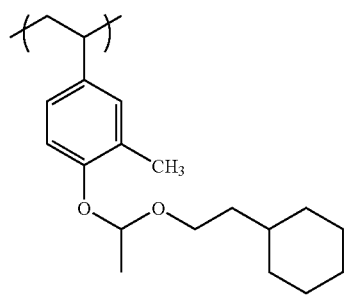
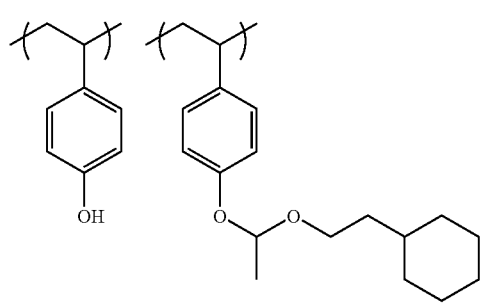
(R-54)
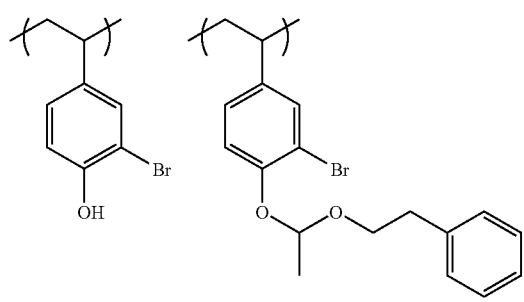
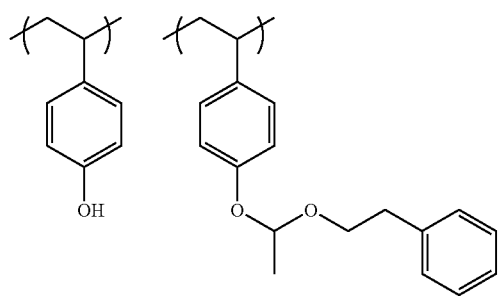
(R-55)
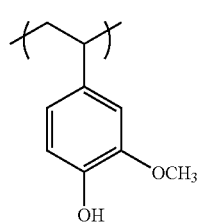
-continued
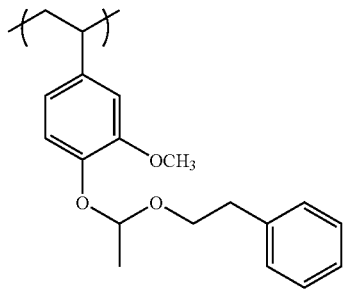
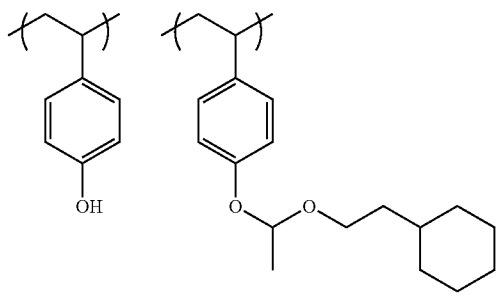
(R-56)
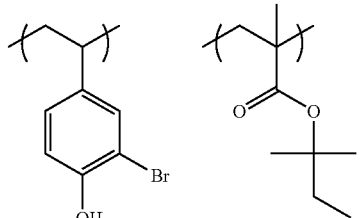
(R-57)
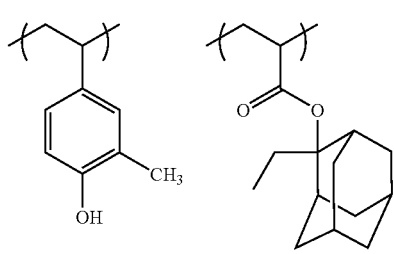
(R-58)
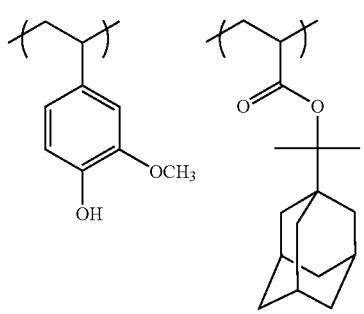
(R-59)
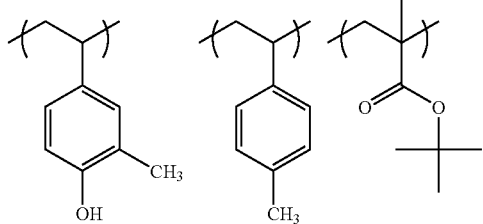

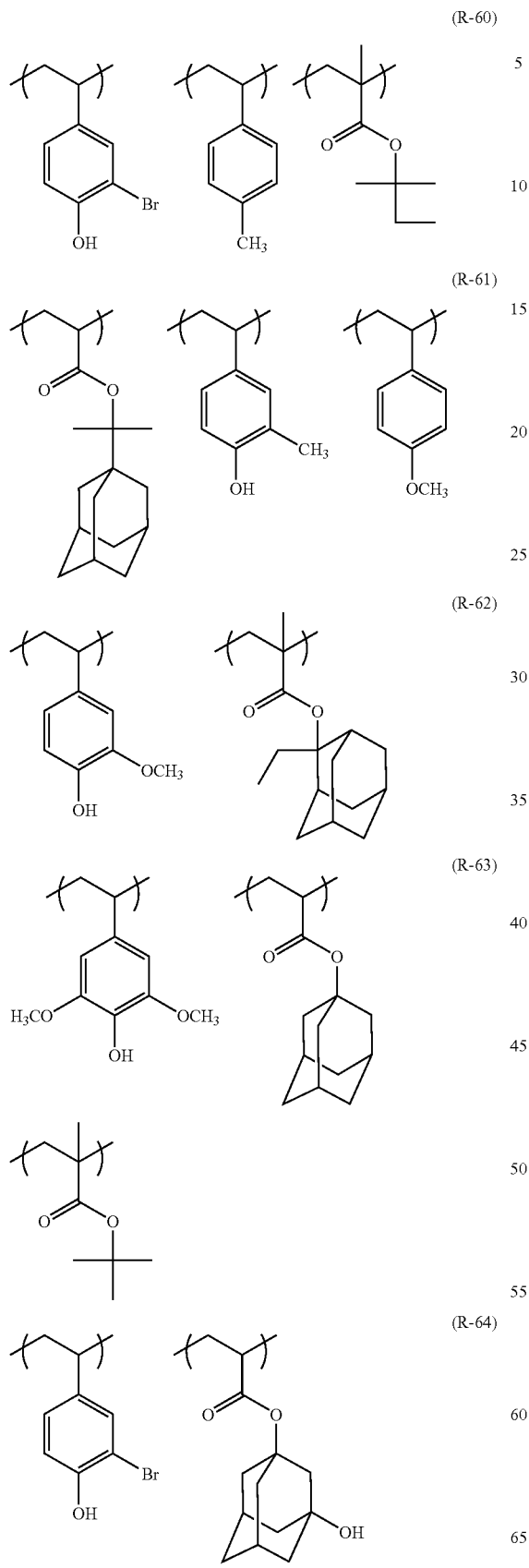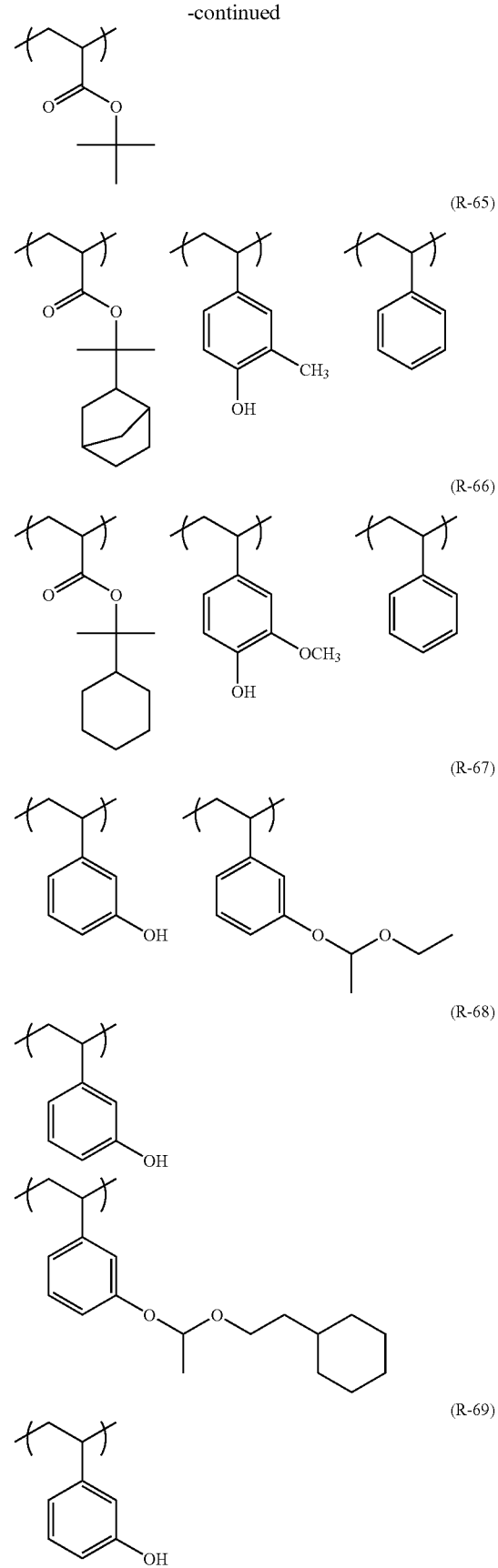

-continued
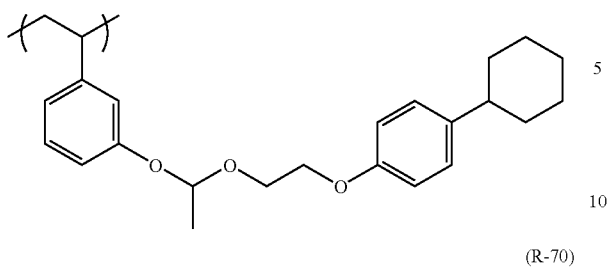
(R-70)
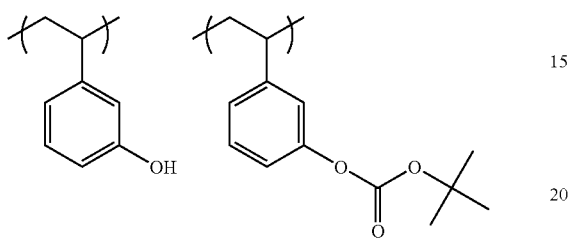
(R-71)
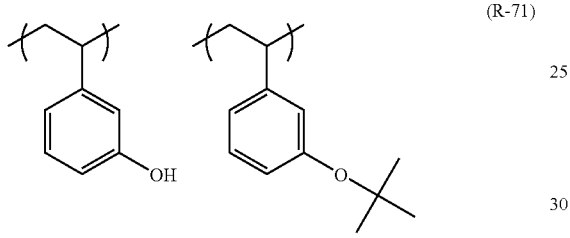
(R-72)
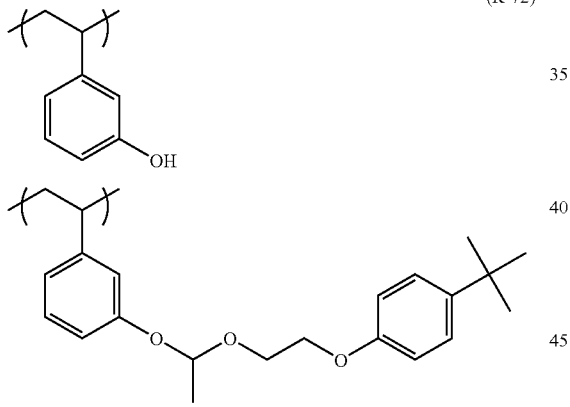
(R-73)
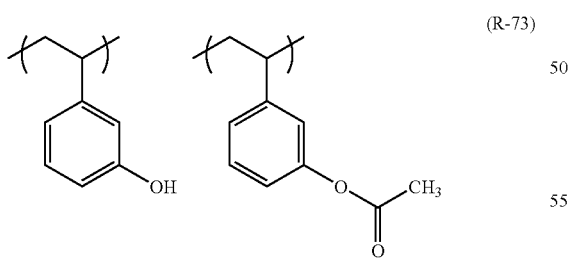
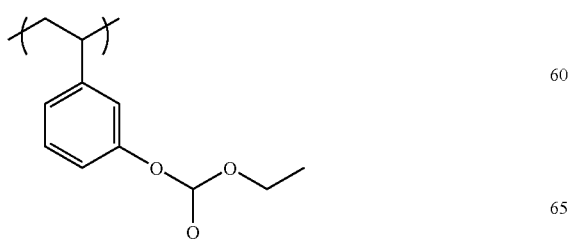
-continued
(R-74)
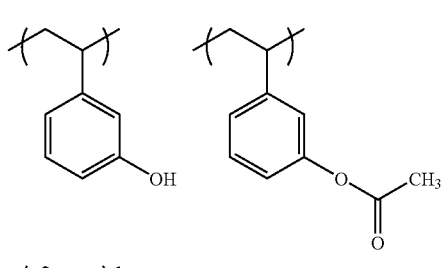
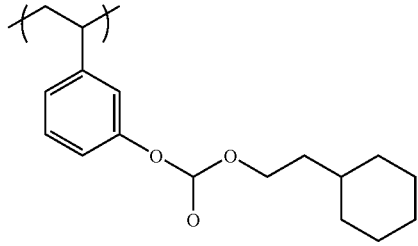
(R-75)
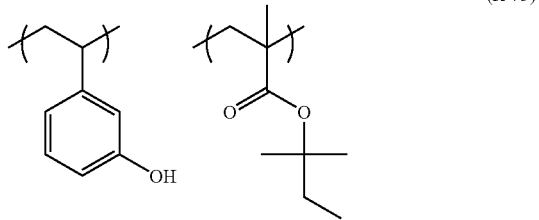
(R-76)
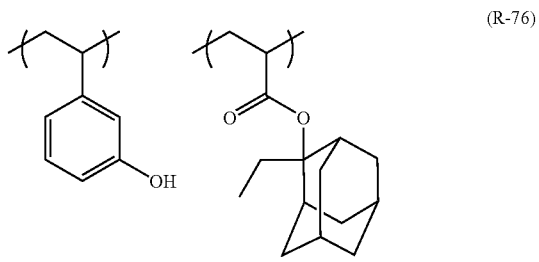
(R-77)
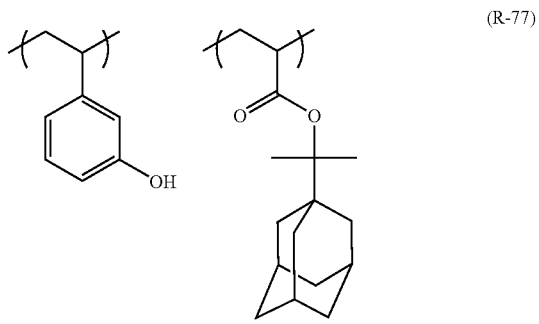
(R-78)
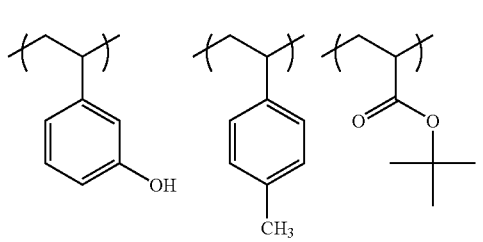

(R-79)
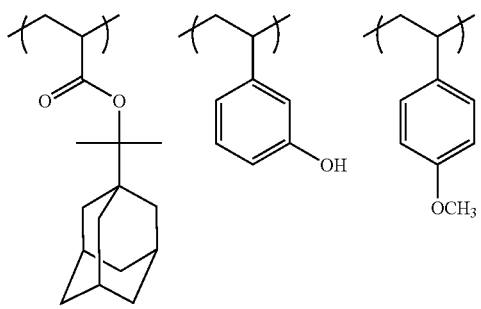
(R-80)
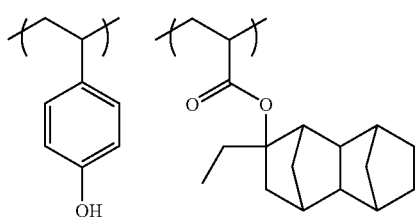
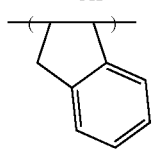
(R-81)
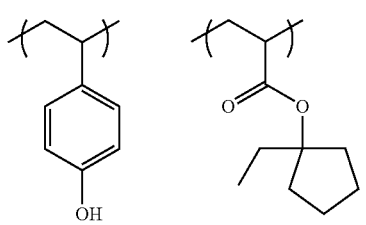
(R-82)
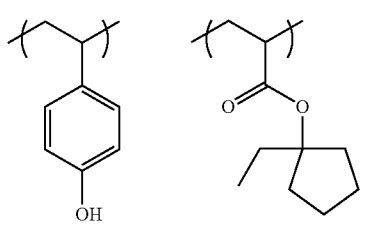
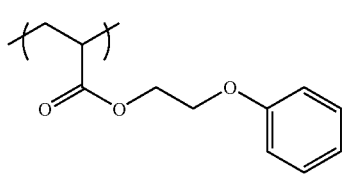
(R-83)
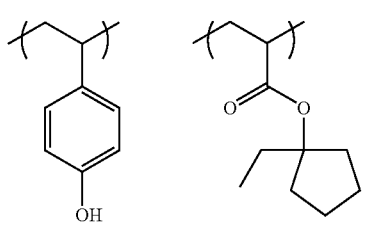
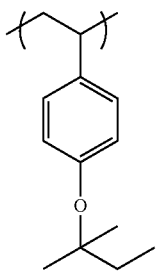
(R-84)
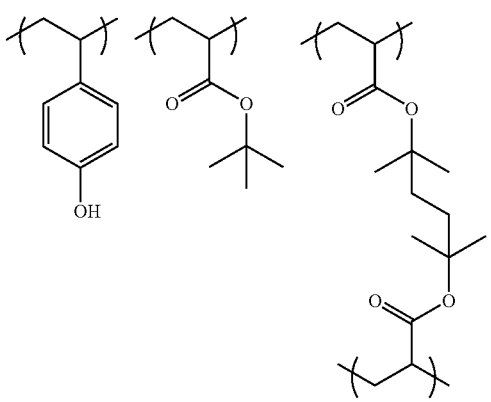
(R-85)
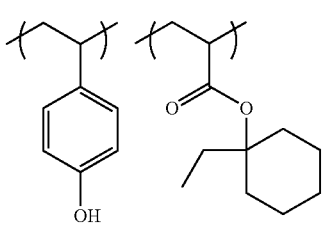
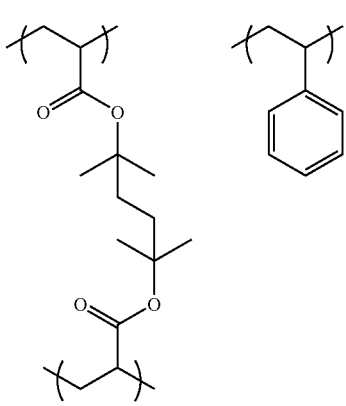
(R-86)
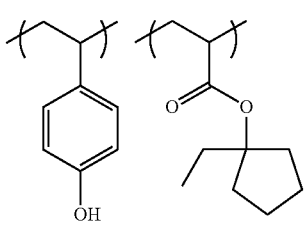

-continued

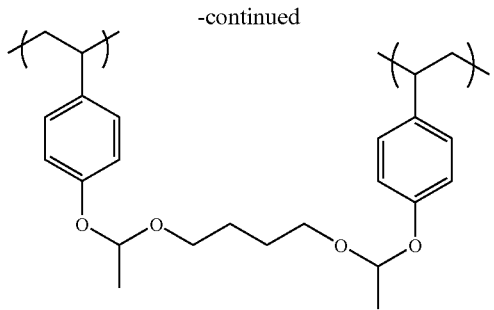

The polymer compound produced by the production method of the present invention is used suitably for a positive photosensitive composition.

The components other than the polymer compound of the present invention, used in the positive photosensitive composition, are described below.

Compound Capable of Generating an Acid Upon Irradiation with Actinic Rays or Radiation:

The positive photosensitive composition of the present invention contains a compound capable of generating an acid upon irradiation with actinic rays or radiation (sometimes referred to as a "photoacid generator").

As regards the photoacid generator, a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist and the like, or a mixture thereof may be appropriately selected and used.

Examples thereof include diazonium salt, phosphonium salt, sulfonium salt, iodonium salt, imidosulfonate, oxime sulfonate, diazodisulfone, disulfone and o-nitrobenzyl sulfonate.

Also, a compound where the group or compound capable of generating an acid upon irradiation with actinic rays or radiation is introduced into the polymer main or side chain, such as compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, the compounds represented by the following formulae (ZI), (ZII) and (ZIII) are preferred.

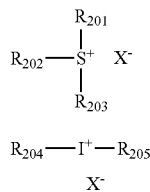

ZI

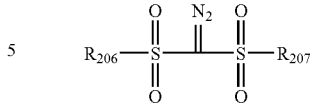

ZII

ZIII

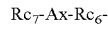

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. An organic anion containing a carbon atom is preferred.

The preferred organic anion includes the organic anions represented by the following formulae (AN1) to (AN4).

AN1

AN2

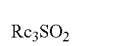

AN3

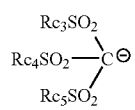

AN4

In formulae (AN1) and (AN2), $Rc_1$ represents an organic group.

In formulae (AN1) and (AN2), the organic group of $Rc_1$ includes an organic group having a carbon number of 1 to 30 and is preferably an alkyl, cycloalkyl or aryl group which may be substituted, or a group where a plurality of these groups are connected through a single bond or a linking group such as —O—, —$CO_2$—, —S—, —$SO_3$— and —$SO_2N(Rd_1)$—. $Rd_1$ represents a hydrogen atom or an alkyl group and may form a ring structure with the alkyl, cycloalkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom preferably has a hydrogen atom without all hydrogen atoms being substituted by a fluorine atom, and the number of hydrogen atoms is preferably larger than the number of fluorine atoms. The absence of a perfluoroalkyl group having a carbon number of 5 or more enables reduction in the toxicity to ecology.

The more preferred embodiment of $Rc_1$ is a group represented by the following formula.

$Rc_7$-Ax-$Rc_6$-

In the formula above, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a single bond or a divalent linking group (preferably —O—, —CO$_2$—, —S—, —SO$_3$— or —SO$_2$N(Rd$_1$)—). Rd$_1$ represents a hydrogen atom or an alkyl group and may combine with Rc$_7$ to form a ring structure.

Rc$_7$ is a hydrogen atom, a fluorine atom, a linear or branched, monocyclic or polycyclic alkyl group which may be substituted, or an aryl group which may be substituted. The alkyl group, cycloalkyl group and aryl group, which each may be substituted, preferably contain no fluorine atom as the substituent.

In formulae (AN3) and (AN4), Rc$_3$, Rc$_4$ and Rc$_5$ each independently represents an organic group.

Rc$_3$ and Rc$_4$ may combine to form a ring.

In formulae (AN3) and (AN4), the preferred organic groups for Rc$_3$, Rc$_4$ and Rc$_5$ are the same as the preferred organic groups in Rc$_1$.

In the case where Rc$_3$ and Rc$_4$ combine and form a ring, the group formed after Rc$_3$ and Rc$_4$ are combined includes an alkylene group and an arylene group and is preferably a perfluoroalkylene group having a carbon number of 2 to 4. When Rc$_3$ and Rc$_4$ combine to form a ring, this is preferred because the acidity of the acid generated upon irradiation with light increases and the sensitivity is enhanced.

In formula (ZI), the carbon number of the organic group as R$_{201}$, R$_{202}$ and R$_{203}$ is generally from 1 to 30, preferably from 1 to 20.

Two members out of R$_{201}$ to R$_{203}$ may combine to form a ring structure, and the ring may contain an oxygen atom, a sulfur atom, an ester bond, an amide bond or a carbonyl group. The group formed after two members out of R$_{201}$ to R$_{203}$ are combined includes an alkylene group (e.g., butylene, pentylene).

Specific examples of the organic group as R$_{201}$, R$_{202}$ and R$_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of R$_{201}$ to R$_{203}$ in the compound represented by formula (ZI) is bonded to at least one of R$_{201}$ to R$_{203}$ in another compound represented by formula (ZI).

The component (ZI) is more preferably a compound (ZI-1), (ZI-2) or (ZI-3) described below.

The compound (ZI-1) is an arylsulfonium compound where at least one of R$_{201}$ to R$_{203}$ in formula (ZI) is an aryl group, that is, a compound having an arylsulfonium as the cation.

In the arylsulfonium compound, R$_{201}$ to R$_{203}$ all may be an aryl group or a part of R$_{201}$ to R$_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of R$_{201}$ to R$_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members R$_{201}$ to R$_{203}$ or may be substituted to all of these three members. In the case where R$_{201}$ to R$_{203}$ are an aryl group, the substituent is preferably substituted at the p-position of the aryl group.

The compound (ZI-2) is described below.

The compound (ZI-2) is a compound where R$_{201}$ to R$_{203}$ in formula (ZI) each independently represents an aromatic ring-free organic group. The aromatic ring as used herein includes an aromatic ring containing a heteroatom.

The aromatic ring-free organic group as R$_{201}$ to R$_{203}$ generally has a carbon number of 1 to 30, preferably from 1 to 20.

R$_{201}$ to R$_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as R$_{201}$ to R$_{203}$ may be linear or branched and is preferably a linear or branched alkyl group having a carbon number of 1 to 10 (e.g., methyl, ethyl, propyl, butyl, pentyl). The alkyl group as R$_{201}$ to R$_{203}$ is more preferably a linear or branched 2-oxoalkyl group or an alkoxymethyl group.

The cycloalkyl group as R$_{201}$ to R$_{203}$ is preferably a cycloalkyl group having a carbon number of 3 to 10 (e.g., cyclopentyl, cyclohexyl, norbornyl).

The 2-oxoalkyl group as R$_{201}$ to R$_{203}$ may be linear, branched or cyclic and is preferably a group having >C=O at the 2-position of the above-described alkyl group or cycloalkyl group.

The alkoxy group in the alkoxycarbonylmethyl group as R$_{201}$ to R$_{203}$ is preferably an alkyl group having a carbon number of 1 to 5 (e.g., methoxy, ethoxy, propoxy, butoxy, pentoxy).

R$_{201}$ to R$_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

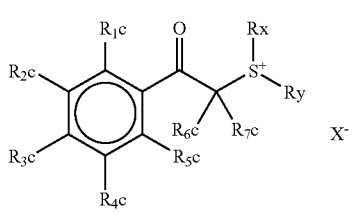

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion and is the same as $X^-$ in formula (ZI).

The alkyl group as $R_{1c}$ to $R_{7c}$ may be linear or branched and is, for example, an alkyl group having a carbon number of 1 to 20, preferably a linear or branched alkyl group having a carbon number of 1 to 12 (e.g., methyl, ethyl, linear or branched propyl, linear or branched butyl, linear or branched pentyl).

The cycloalkyl group as $R_{1c}$ to $R_{7c}$ is preferably a cycloalkyl group having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (e.g., methoxy, ethoxy, linear or branched propoxy, linear or branched butoxy, linear or branched pentoxy), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of this construction, the solubility in a solvent is more enhanced and production of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxymethyl group.

The cycloalkyl group as $R_x$ and $R_y$ is the same as the cycloalkyl group of $R_{1c}$ to $R_{7c}$. The cycloalkyl group as $R_x$ and $R_y$ is preferably a cyclic 2-oxoalkyl group.

The linear, branched or cyclic 2-oxoalkyl group includes a group having >C=O at the 2-position of the alkyl group or cycloalkyl group as $R_{1c}$ to $R_{7c}$.

The alkoxy group in the alkoxycarbonylmethyl group is the same as the alkoxy group as $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group of $R_{204}$ to $R_{207}$ may be linear or branched and is preferably a linear or branched alkyl group having a carbon number of 1 to 10 (e.g., methyl, ethyl, propyl, butyl, pentyl)

The cycloalkyl group of $R_{204}$ to $R_{207}$ is preferably a cycloalkyl group having a carbon number of 3 to 10 (e.g., cyclopentyl, cyclohexyl, norbornyl).

$R_{204}$ to $R_{207}$ each may have a substituent, and examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with actinic rays or radiation, the compounds represented by the following formulae (ZIV), (ZV) and (ZVI) are also preferred.

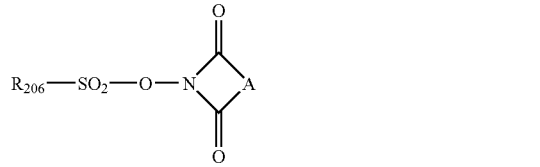

In formulae (ZIV) to (ZVI), $Ar_3$ and $Ar_4$ each independently represents an aryl group.

$R_{206}$ represents an alkyl group, a cycloalkyl group or an aryl group.

$R_{207}$ and $R_{20}$ each independently represents an alkyl group, a cycloalkyl group, an aryl group, or an electron-withdrawing group. $R_{207}$ is preferably an aryl group. $R_{208}$ is preferably an electron-withdrawing group, more preferably a cyano group or a fluoroalkyl group.

A represents an alkylene group, a cycloalkylene group, an alkenylene group or an arylene group.

Among the compounds capable of generating an acid upon irradiation with actinic rays or radiation, the compounds represented by formulae (ZI) to (ZIII) are preferred, the compound represented by formula (ZI) is more preferred, and the compounds represented by formulae (ZI-1) to (ZI-3) are still more preferred.

Furthermore, a compound capable of generating an acid represented by any one of the following formulae (AC1) to (AC3) upon irradiation with actinic rays or radiation is preferred.

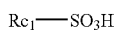

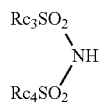

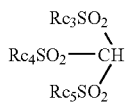

That is, a preferred embodiment of the photoacid generator is a compound where in the structure represented by formula (ZI), X⁻ is an anion selected from (AN1), (AN3) and (AN4).

Out of the compounds capable of decomposing upon irradiation with actinic rays or radiation to generate an acid, particularly preferred examples are set forth below.

(z1)
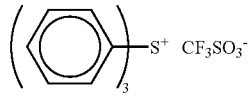

(z2)
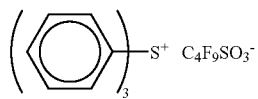

(z3)
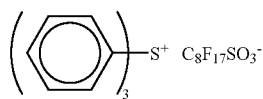

(z4)
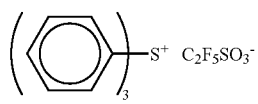

(z5)
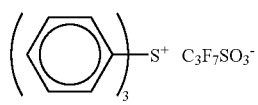

(z6)
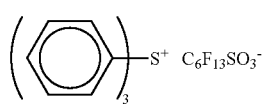

(z7)
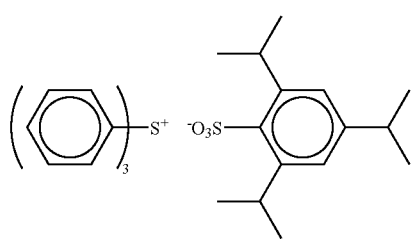

(z8)
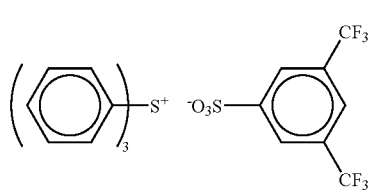

AC1

AC2

AC3

-continued (z9)
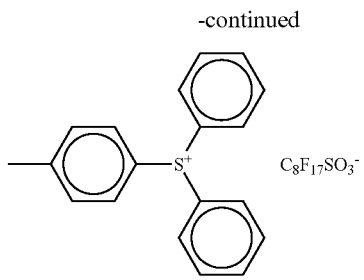

(z10)
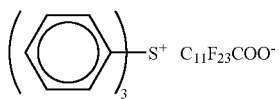

(z11)
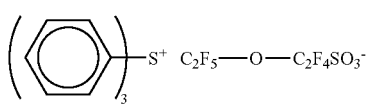

(z12)
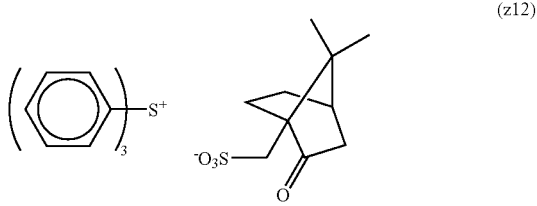

(z13)
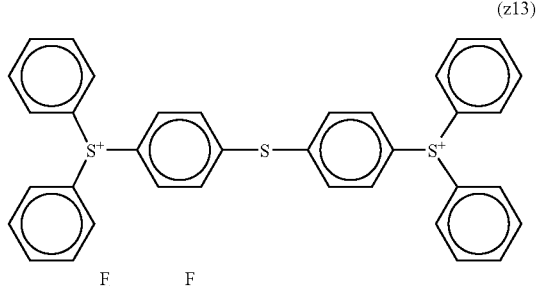

(z14)
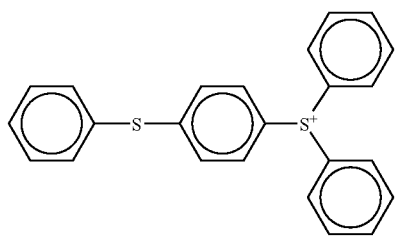

(z15)
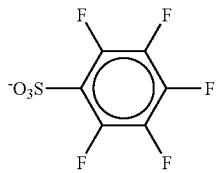

-continued
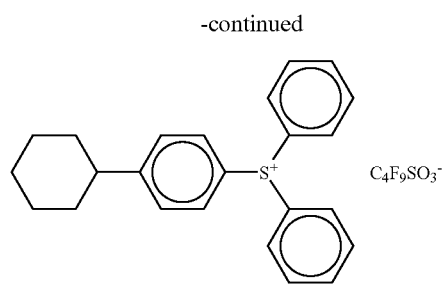 (z16)
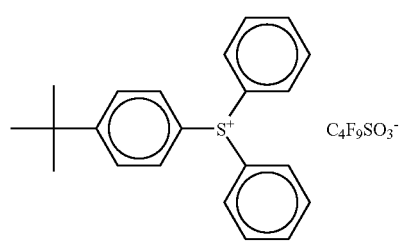 (z17)
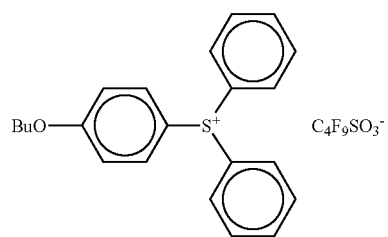 (z18)
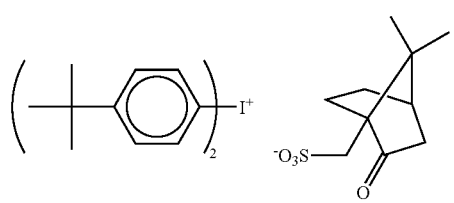 (z19)
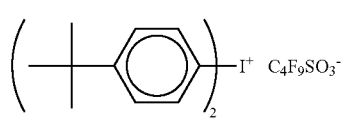 (z20)
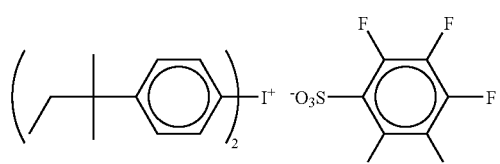 (z21)
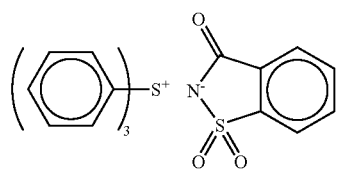 (z22)
-continued
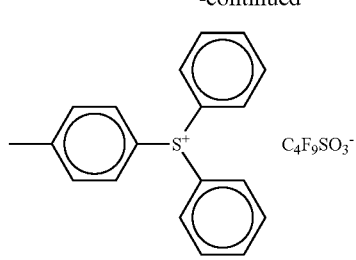 (z23)
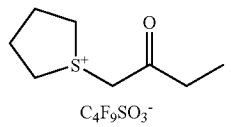 (z24)
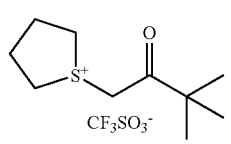 (z25)
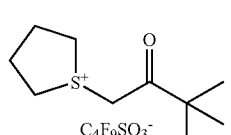 (z26)
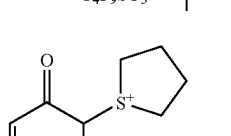 (z27)
 (z28)
(z29)
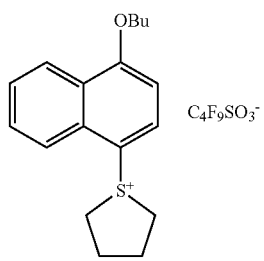 (z30)
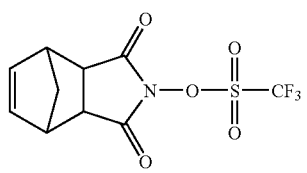 (z31)

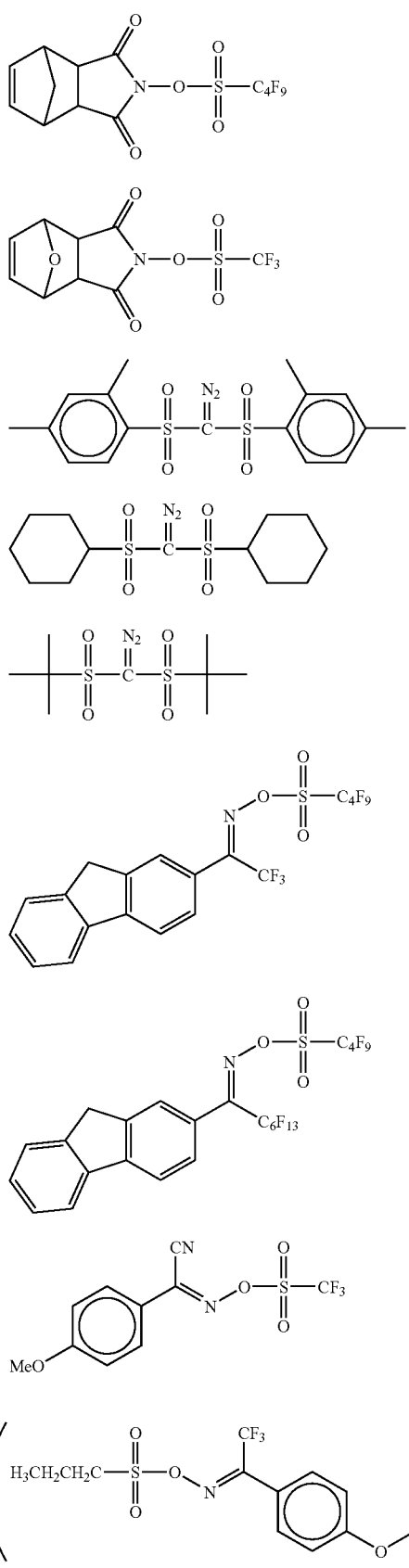

-continued
(z49)
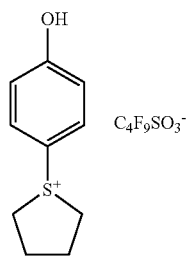
(z50)
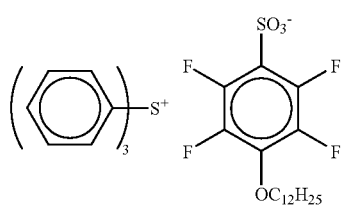
(z51)
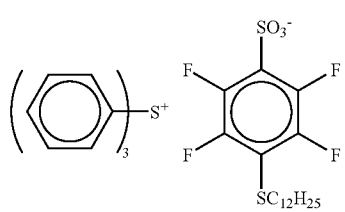
(z52)
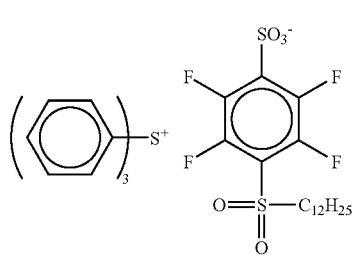
(z53)
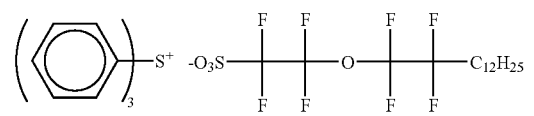
(z54)
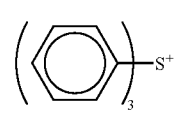
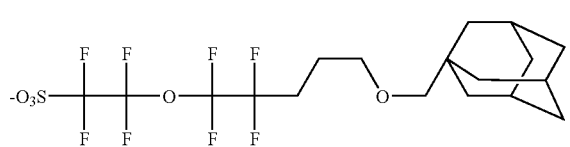
(z55)
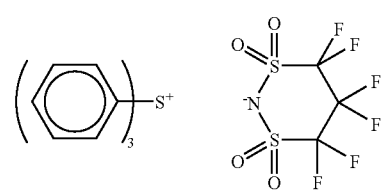
-continued
(z56)
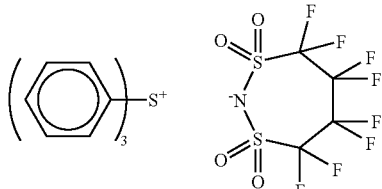
(z57)
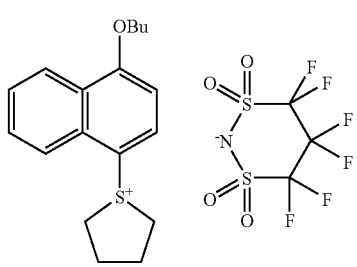
(z58)
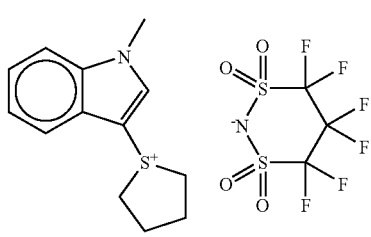
(z59)
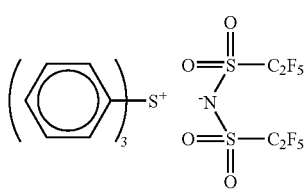
(z60)
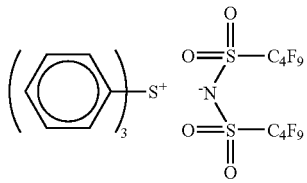
(z61)
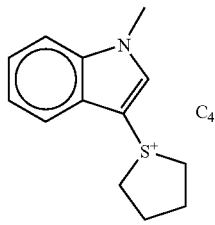
(z62)
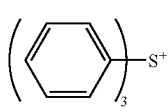
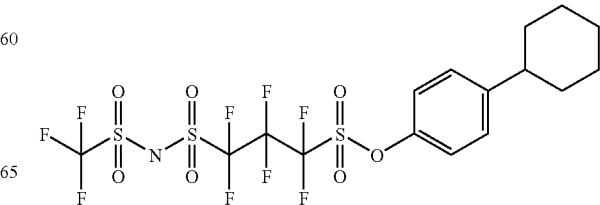

-continued
(z63) 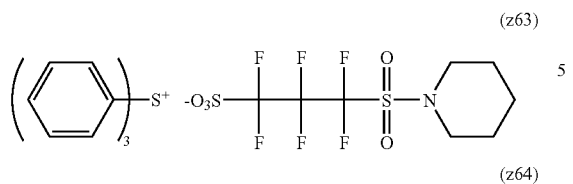
(z64) 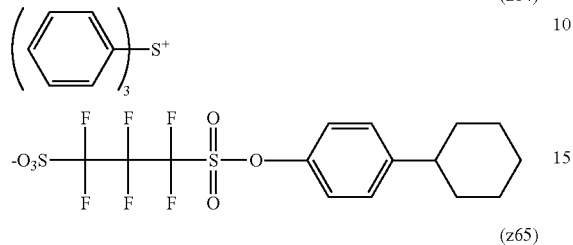
(z65) 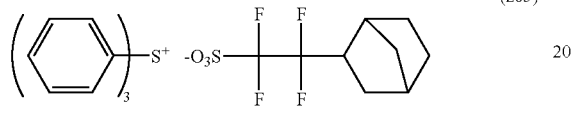
(z66) 
(z67) 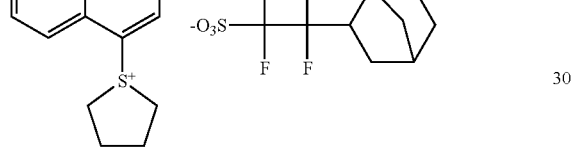
(z68) 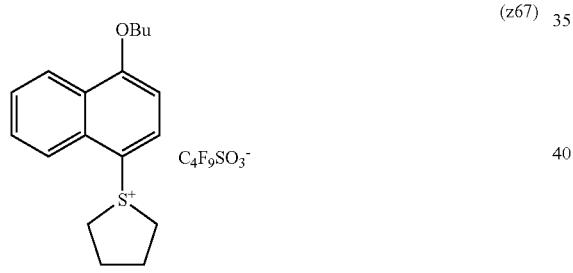
(z69) 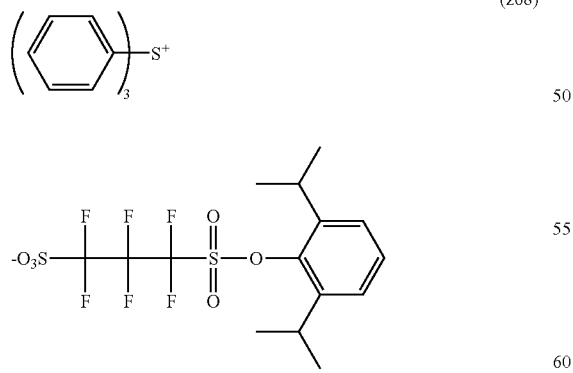
-continued
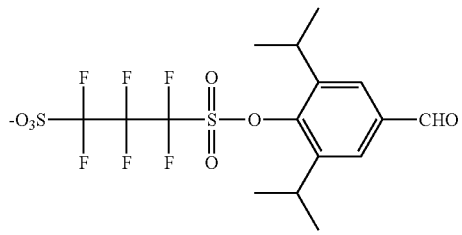
(z70) 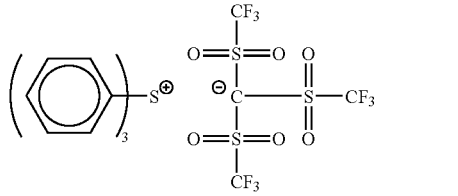
(z71)
(z72) 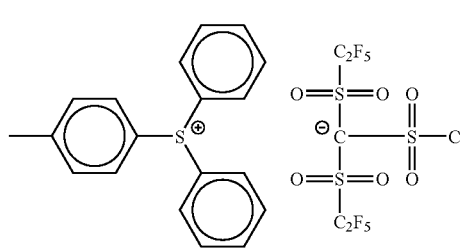
(z73) 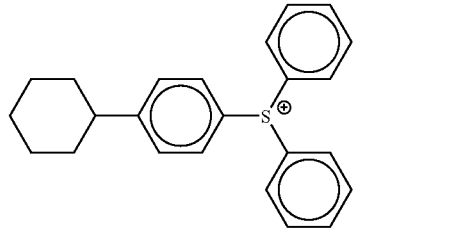
(z74)

-continued
(z68)
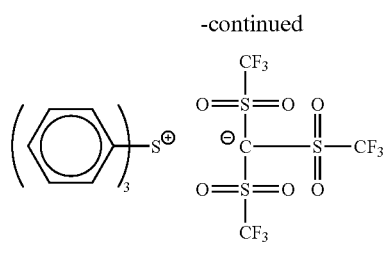
(z69)
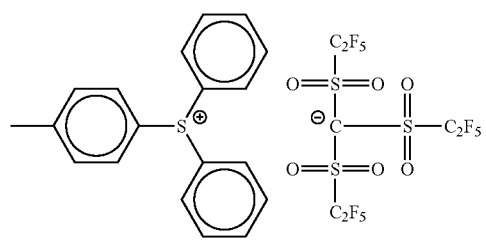
(z70)
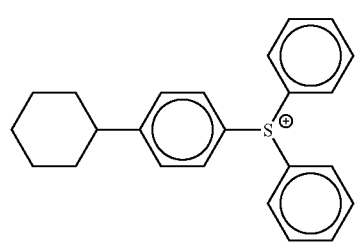
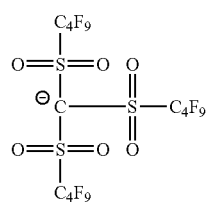
(z71)
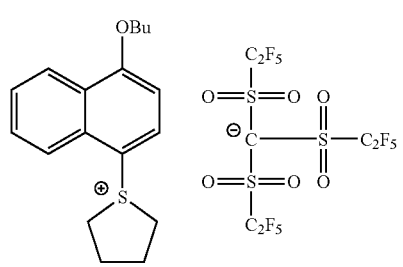
(z72)
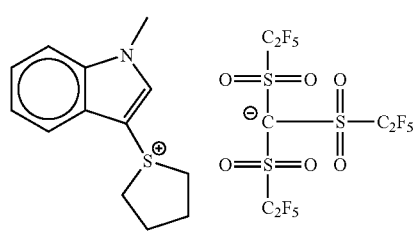
(z72′)
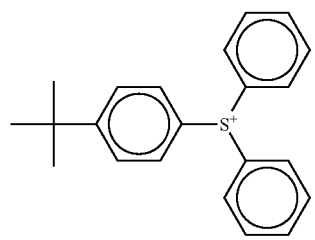
-continued
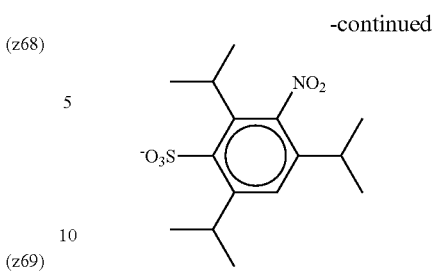
(z73)
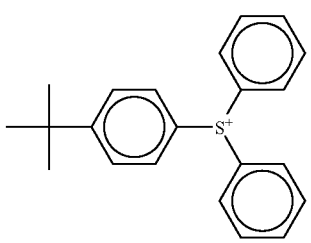
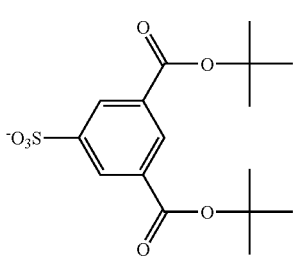
(z74)
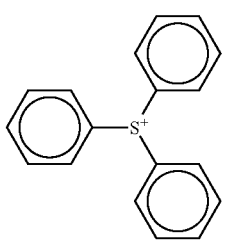
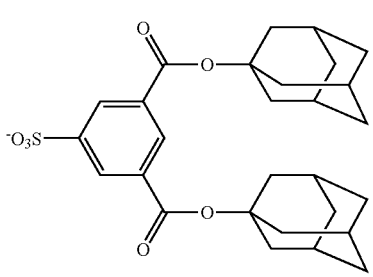
(z75)
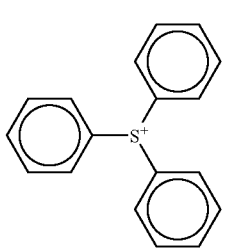

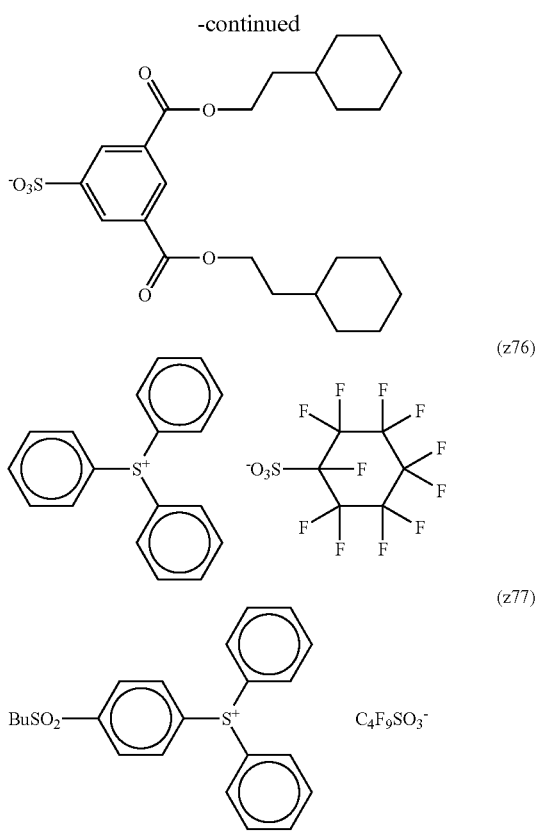

As for the photoacid generator, one species may be used alone, or two or more species may be used in combination. In the case of using two or more species in combination, compounds capable of generating two kinds of organic acids differing in the total number of atoms except for hydrogen atom by 2 or more are preferably combined.

The content of the photoacid generator in the composition is preferably from 0.1 to 20 mass %, more preferably from 0.5 to 10 mass %, still more preferably from 1 to 7 mass %, based on the entire solid content of the positive photosensitive composition.

Resin not Having a Group Capable of Decomposing Under the Action of an Acid:

The positive photosensitive composition of the present invention may contain a resin not having a group capable of decomposing under the action of an acid.

The term "not having a group capable of decomposing under the action of an acid" means that the resin exhibits no or very low decomposability for the action of an acid in the image forming process where the positive photosensitive composition of the present invention is usually used, and is substantially free of a group contributing to the image formation utilizing the acid decomposition. Such a resin includes a resin having an alkali-soluble group, and a resin having a group capable of decomposing under the action of an alkali to increase the solubility in an alkali developer.

The resin not having a group capable of decomposing under the action of an acid is preferably a resin having at least one repeating unit derived from a (meth)acrylic acid derivative and/or an alicyclic olefin derivative.

The alkali-soluble group contained in the resin not having a group capable of decomposing under the action of an acid is preferably a carboxyl group, a phenolic hydroxyl group, an aliphatic hydroxyl group substituted by an electron-withdrawing group at the 1- or 2-position, an electron-withdrawing group-substituted amino group (e.g., sulfonamide, sulfonimide, bis-sulfonylimide), or an electron-withdrawing group-substituted methylene or methine group (for example, a methylene or methine group substituted by at least two members selected from a ketone group and an ester group).

The group capable of decomposing under the action of an alkali to increase the solubility in an alkali developer, which is contained in the resin not having a group capable of decomposing under the action of an acid, is preferably a lactone group or an acid anhydride group, more preferably a lactone group.

The resin not having a group capable of decomposing under the action of an acid may further contain a functional group-containing repeating unit other than those described above. As for the other functional group-containing repeating unit, an appropriate functional group may be introduced in consideration of dry etching resistance, hydrophilicity/hydrophobicity, interaction and the like. Examples of the other repeating unit include a constitutional unit having a polar functional group such as hydroxyl group, cyano group, carbonyl group and ester group, a repeating unit having a monocyclic or polycyclic hydrocarbon structure, a repeating unit having a silicon atom, a halogen atom or a fluoroalkyl group, and a repeating unit having a plurality of these functional groups.

Specific preferred examples of the resin not having a group capable of decomposing under the action of an acid are set forth below, but the present invention is not limited thereto.

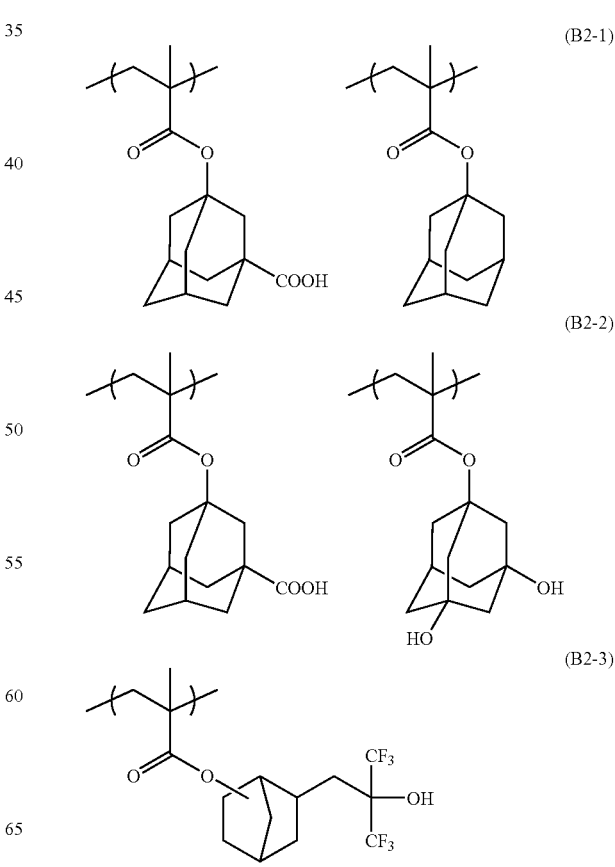

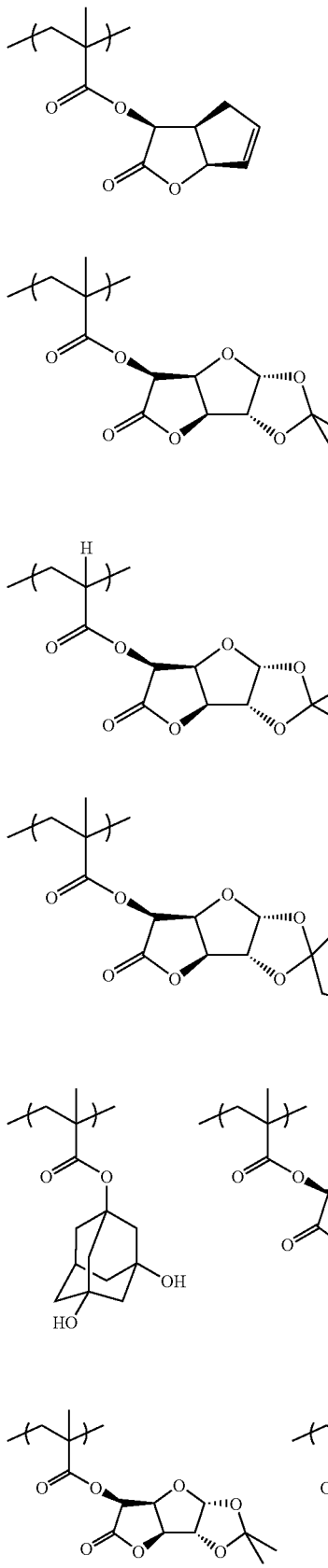

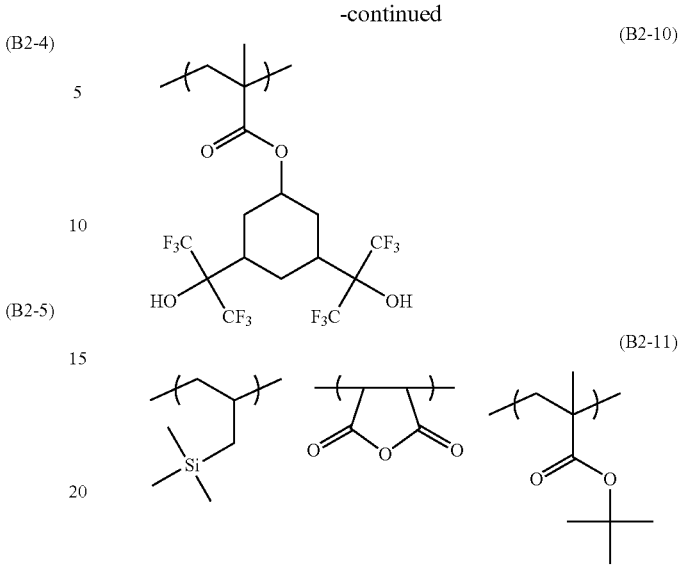

The amount added of the resin not having a group capable of decomposing under the action of an acid is from 0 to 30 mass %, preferably from 0 to 20 mass %, more preferably from 0 to 15 mass %, based on the polymer compound.

Dissolution controlling compound containing at least one member selected from an alkali-soluble group, a hydrophilic group and an acid-decomposable group and having a molecular weight of 3,000 or less:

In the positive photosensitive composition of the present invention, a dissolution controlling compound containing at least one member selected from an alkali-soluble group, a hydrophilic group and an acid-decomposable group and having a molecular weight of 3,000 or less (hereinafter sometimes referred to as a "dissolution controlling compound") may be added.

The dissolution controlling compound is preferably a compound containing an alkali-soluble group such as carboxyl group, sulfonylimide group and hydroxyl group substituted by a fluoroalkyl group at the α-position, a compound containing a hydrophilic group such as hydroxyl group, lactone group, cyano group, amide group, pyrrolidone group and sulfonamide group, or a compound containing a group capable of decomposing under the action of an acid to release an alkali-soluble group or a hydrophilic group. The group capable of decomposing under the action of an acid to release an alkali-soluble group or a hydrophilic group is preferably a group in which a carboxyl group or a hydroxyl group is protected by an acid-decomposable group. As regards the dissolution controlling compound, for the purpose of not decreasing the transparency to light at 220 nm or less, it is preferred to use an aromatic ring-free compound or use an aromatic ring-containing compound in an added amount of 20 wt % or less based on the solid content of the composition.

The dissolution controlling compound is preferably a carboxylic acid compound having an alicyclic hydrocarbon structure, such as adamantane (di)carboxylic acid, norbornane carboxylic acid and cholic acid, a compound obtained by protecting the carboxylic acid thereof with an acid-decomposable group, a polyol such as sugars, or a compound obtained by protecting the hydroxyl group thereof with an acid-decomposable group.

The molecular weight of the dissolution controlling compound for use in the present invention is 3,000 or less, preferably from 300 to 3,000, more preferably from 500 to 2,500.

The amount of the dissolution controlling compound added is preferably from 3 to 40 mass %, more preferably from 5 to 20 mass %, based on the solid content of the positive photosensitive composition.

Specific examples of the dissolution controlling compound are set forth below, but the present invention is not limited thereto.

TE-1
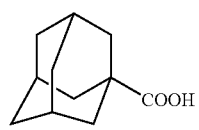

TE-2
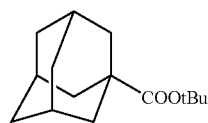

TE-3
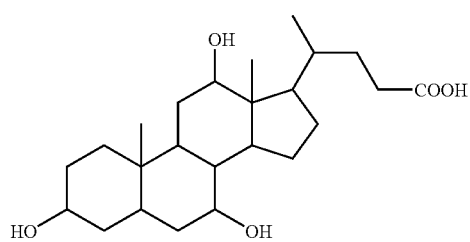

TE-4
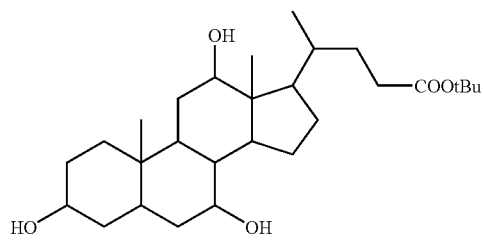

TE-5
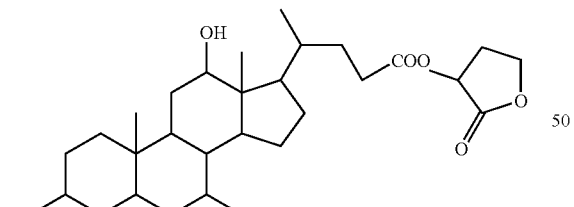

TE-6
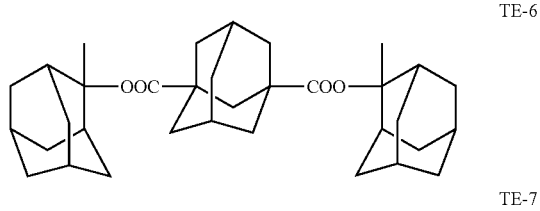

TE-7
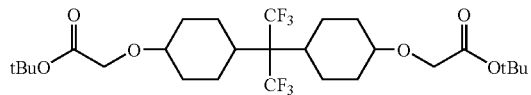

-continued

TE-8
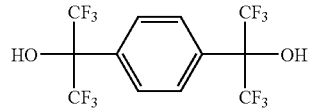

TE-9
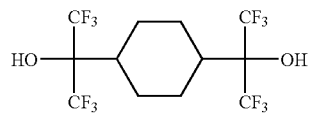

TE-10
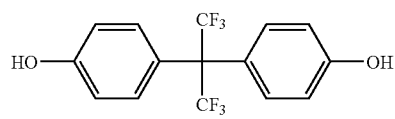

TE-11
HO—(CH$_2$)$_{12}$—OH

TE-12
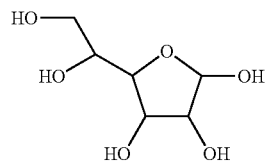

TE-13
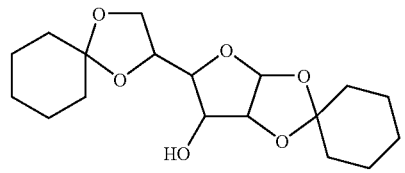

TE-14
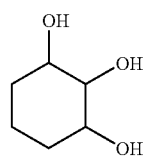

TE-15
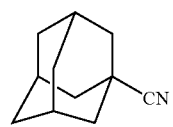

TE-16
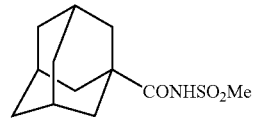

Basic Compound:

For the purpose of reducing changes in performance with the lapse of time from exposure to heating or for controlling the in-film diffusion of the acid generated by exposure, the positive photosensitive composition of the present invention preferably contains a basic compound.

The basic compound includes a nitrogen-containing basic compound and an onium salt compound. As for the structure of the nitrogen-containing basic compound, a compound having a partial structure represented by any one of the following formulae (A) to (E) is preferred.

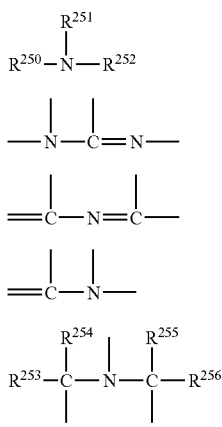

(A)
(B)
(C)
(D)
(E)

In formula (A), $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent, and the alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20. These may contain an oxygen atom, a sulfur atom or a nitrogen atom in the alkyl chain.

In formula (E), $R^{253}$, $R^{254}$, $R^{255}$ and $R^{256}$ each independently represents an alkyl group having a carbon number of 1 to 6, or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo-[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and 2-oxoalkyl group-containing sulfonium hydroxide, and specific examples thereof include triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure becomes a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One species or two or more species of these basic compounds are used. The amount of the basic compound used is usually from 0.001 to 10 mass %, preferably from 0.01 to 5 mass %, based on the solid content of the positive photosensitive composition. From the standpoint of obtaining a sufficiently high addition effect, the amount of the basic compound used is preferably 0.001 mass % or more, and in view of sensitivity or developability of the unexposed area, the amount used is preferably 10 mass % or less.

Fluorine-Containing and/or Silicon-Containing Surfactant:

The positive photosensitive composition of the present invention preferably further contains any one fluorine-containing and/or silicon-containing surfactant (a fluorine-containing surfactant, a silicon-containing surfactant, or a surfactant containing both a fluorine atom and a silicon atom), or two or more species thereof.

When the positive photosensitive composition of the present invention contains a fluorine-containing and/or silicon-containing surfactant, in use of an exposure light source of emitting light at 250 nm or less, particularly 220 nm or less, a resist pattern assured of good adhesion and less development defect can be obtained with good sensitivity and resolution.

Examples of the fluorine-containing and/or silicon-containing surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants may also be directly used.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound produced by a telomerization process (also called a telomer process) or an oligomerization process (also called an oligomer process) may be used. The fluoro-aliphatic compound can be synthesized by the method described in JP-A-2002-90991.

The polymer having a fluoro-aliphatic group is preferably a copolymer of fluoro-aliphatic group-containing monomer with (poly(oxyalkylene)) acrylate and/or (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of fluoro-aliphatic group-containing monomer with (poly(oxyalkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of $C_6F_{13}$ group-containing acrylate (or methacrylate) with (poly(oxyalkylene)) acrylate (or methacrylate), a copolymer of $C_6F_{13}$ group-containing acrylate (or methacrylate) with (poly(oxyethylene)) acrylate (or methacrylate) and (poly(oxypropylene)) acrylate (or methacrylate), a copolymer of $C_8F_{17}$ group-containing acrylate (or methacrylate) with (poly(oxyalkylene)) acrylate (or methacrylate), and a copolymer of $C_8F_{17}$ group-containing acrylate (or methacrylate) with (poly(oxyethylene)) acrylate (or methacrylate) and (poly(oxypropylene)) acrylate (or methacrylate).

The amount of the fluorine-containing and/or silicon-containing surfactant used is preferably from 0.0001 to 2 mass %, more preferably from 0.001 to 1 mass %, based on the entire amount of the positive photosensitive composition (excluding the solvent).

Surface Hydrophobing Resin:

The positive photosensitive composition of the present invention may contain a surface hydrophobing resin.

In the case where a resist film comprising the positive photosensitive composition of the present invention is exposed through immersion liquid, a surface hydrophobing resin may be further added to the positive photosensitive composition, if desired. By this addition, the receding contact angle on the resist film surface and in turn, the followability to immersion liquid can be enhanced. The surface hydrophobing resin may be any resin as long as the receding contact angle on the surface is enhanced by its addition, but a resin having at least either one of a fluorine atom and a silicon atom is preferred. The amount of the surface hydrophobing resin added may be appropriately adjusted to give a resist film having a receding contact angle of 60 to 80° but is preferably from 0.1 to 5 mass %.

Organic Solvent:

The positive photosensitive composition of the present invention is used by dissolving the components described above in a predetermined organic solvent.

Examples of the organic solvent which can be used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

In the present invention, one organic solvent may be used alone or some organic solvents may be mixed and used, but it is preferred to use a mixed solvent containing two or more kinds of solvents having different functional groups. By the use of a mixed solvent, the solubility of raw materials is increased and not only the production of particles with aging can be suppressed but also a good pattern profile can be obtained. The functional group contained in the solvent is preferably an ester group, a lactone group, a hydroxyl group, a ketone group or a carbonate group. As for the mixed solvent having different functional groups, the following mixed solvents (S1) to (S5) are preferred:

(S1) a mixed solvent obtained by mixing a hydroxyl group-containing solvent and a hydroxyl group-free solvent;

(S2) a mixed solvent obtained by mixing a solvent having an ester structure and a solvent having a ketone structure;

(S3) a mixed solvent obtained by mixing a solvent having an ester structure and a solvent having a lactone structure;

(S4) a mixed solvent obtained by mixing a solvent having an ester structure, a solvent having a lactone structure, and a hydroxyl group-containing solvent; and (S5) a mixed solvent containing a solvent having an ester structure, a solvent having a carbonate structure, and a hydroxyl group-containing solvent.

By the use of such a mixed solvent, production of particles during storage of the resist solution can be reduced, and generation of a defect at the coating can be suppressed.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the hydroxyl group-free solvent include propylene glycol monomethyl ether acetate, ethyl ethoxy propionate, 2-heptanone, γ-butyrolactone, cyclohexanone, butyl acetate, N-methylpyrrolidone, N,N-dimethylacetamide and dimethyl sulfoxide. Among these, propylene glycol monomethyl ether acetate, ethyl ethoxy propionate, 2-heptanone, γ-butyrolactone, cyclohexanone and butyl acetate are preferred, and propylene glycol monomethyl ether acetate, ethyl ethoxy propionate, 2-heptanone and cyclohexanone are more preferred.

Examples of the solvent having a ketone structure include cyclohexanone and 2-heptanone, with cyclohexanone being preferred.

Examples of the solvent having an ester structure include propylene glycol monomethyl ether acetate, ethyl ethoxy propionate and butyl acetate, with propylene glycol monomethyl ether acetate being preferred.

Examples of the solvent having a lactone structure include γ-butyrolactone.

Examples of the solvent having a carbonate structure include propylene carbonate and ethylene carbonate, with propylene carbonate being preferred.

The mixing ratio (by mass) of the hydroxyl group-containing solvent to the hydroxyl group-free solvent is from 1/99 to 99/1, preferably from 10/90 to 90/10, more preferably from 20/80 to 60/40. A mixed solvent containing 50 mass % or more of the hydroxyl group-free solvent is particularly preferred in view of coating uniformity.

The mixing ratio (by mass) of the solvent having an ester structure to the solvent having a ketone structure is from 1/99 to 99/1, preferably from 10/90 to 90/10, more preferably from 40/60 to 80/20. A mixed solvent containing 50 mass % or more of the solvent having an ester structure is particularly preferred in view of coating uniformity.

The mixing ratio (by mass) of the solvent having an ester structure to the solvent having a lactone structure is from 70/30 to 99/1, preferably from 80/20 to 99/1, more preferably from 90/10 to 99/1. A mixed solvent containing 70 mass % or more of the solvent having an ester structure is particularly preferable in view of aging stability.

In the case of mixing the solvent having an ester structure, the solvent having a lactone structure and the hydroxyl group-containing solvent, the mixed solvent preferably contains from 30 to 80 mass % of the solvent having an ester structure, from 1 to 20 mass % of the solvent having a lactone structure, and from 10 to 60 mass % of the hydroxyl group-containing solvent.

In the case of mixing the solvent having an ester structure, the solvent having a carbonate structure and the hydroxyl group-containing solvent, the mixed solvent preferably contains from 30 to 80 mass % of the solvent having an ester structure, from 1 to 20 mass % of the solvent having a carbonate structure, and from 10 to 60 mass % of the hydroxyl group-containing solvent.

A preferred embodiment of the solvent is a solvent containing an alkylene glycol monoalkyl ether carboxylate (preferably propylene glycol monomethyl ether acetate). A mixed solvent of an alkylene glycol monoalkyl ether carboxylate and another solvent is more preferred, and the another solvent is at least one solvent having a functional group selected from a hydroxyl group, a ketone group, a lactone group, an ester group, an ether group and a carbonate group, or a plurality of these functional groups in combination. In particular, the mixed solvent is preferably a mixed solvent containing at least one member selected from ethyl lactate, γ-butyrolactone, propylene glycol monomethyl ether, butyl acetate and cyclohexanone, and propylene glycol monomethyl ether acetate.

By selecting an optimal solvent, the performance in terms of development defect can be improved.

<Other Additives>

If desired, the positive photosensitive composition of the present invention may further contain, for example, a dye, a plasticizer, a surfactant other than the fluorine-containing and/or silicon-containing surfactant above, a photosensitizer, and a compound capable of accelerating the dissolution in a developer.

The compound capable of accelerating the dissolution in a developer, which can be used in the present invention, is a low molecular compound containing two or more phenolic OH groups or one or more carboxy groups and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the polymer. The amount added is preferably 50 mass % or less in the light of suppressing the development residue or preventing the pattern deformation at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

In the present invention, a surfactant other than the fluorine-containing and/or silicon-containing surfactant above may also be added. Specific examples thereof include a non-ionic surfactant such as polyoxyethylene alkyl ethers, polyoxyethylene alkylallyl ethers, polyoxyethylene•polyoxypropylene block copolymers, sorbitan fatty acid esters and polyoxyethylene sorbitan fatty acid esters.

One of these surfactants may be added alone, or some species thereof may be added in combination.

(Pattern Forming Method)

The positive photosensitive composition of the present invention is used by dissolving the above-described components in a predetermined organic solvent, preferably in the mixed solvent above, filtering the solution, and coating it on a predetermined support as follows. The filter used for filtration is preferably a filter made of polytetrafluoroethylene, polyethylene or nylon and having a pore size of 0.1 micron or less, more preferably 0.05 microns or less, still more preferably 0.03 microns or less.

For example, the positive photosensitive composition is coated on a substrate (e.g., silicon/silicon dioxide-coated substrate) as used in the production of a precision integrated circuit device, by an appropriate coating method such as spinner or coater, and dried to form a photo-sensitive film.

The photosensitive film formed is irradiated with actinic rays or radiation through a predetermined mask and preferably after baking (heating), subjected to development and rinsing, whereby a good pattern can be obtained.

At the irradiation with actinic rays or radiation, the exposure may be performed by filling a liquid (immersion medium) having a refractive index higher than that of air between the photosensitive film and the lens (immersion exposure). By this exposure, the resolution can be enhanced. The immersion medium used may be any liquid as long as it has a refractive index higher than that of air, but pure water is preferred. Also, an overcoat layer may be further provided on the photosensitive film so as to prevent the immersion medium from coming into direct contact with the photosensitive film at the immersion exposure. By virtue of this overcoat layer, dissolving out of the composition from the photosensitive film into the immersion medium can be suppressed and the development defect can be reduced.

Before forming the photosensitive film, an anti-reflection film may be previously provided by coating on the substrate.

The antireflection film used may be either an inorganic film type such as titanium, titanium dioxide, titanium nitride, chromium oxide, carbon and amorphous silicon, or an organic film type comprising a light absorbent and a polymer material. Also, the organic anti-reflection film may be a commercially available organic antireflection film such as DUV30 Series and DUV-40 Series produced by Brewer Science, Inc., and AR-2, AR-3 and AR-5 produced by Shipley Co., Ltd.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less. Specific examples thereof include KrF excimer laser light (248 nm), ArF excimer laser light (193 nm), F2 excimer laser light (157 nm), X-ray and electron beam, and ArF excimer laser light, F2 excimer laser light, EUV (13 nm) and electron beam are preferred.

In the development step, an alkali developer is used as follows. The alkali developer for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto. Incidentally, the weight average molecular weight (Mw) and dispersity (Mw/Mn) of the polymer compound obtained were determined from the results of measurement by gel permeation chromatography (GPC).

Synthesis Example 1

Synthesis of Polymer Compound (X1)

In a nitrogen stream, 4.8 g of cyclohexanone was changed into a three-neck flask, and the flask was heated to 80° C. Thereto, a solution prepared by dissolving 4.49 g of Monomer A shown below, 2.52 g of Monomer B, 4.95 g of Monomer C, 0.0985 g of a polymerization initiator (azobisisobutyronitrile (AIBN), produced by Wako Pure Chemical Industries, Ltd.) and 0.234 g of 2-mercaptoethanol in 43.0 g of cyclohexanone was added dropwise over 6 hours. After the completion of dropwise addition, the reaction was further allowed to proceed at 80° C. for 2 hours. The resulting reaction solution was allowed to cool and then added dropwise to 500 ml of methanol over 20 minutes, and the precipitated powder was collected by filtration and dried to obtain 8.0 g of Polymer Compound (X1). The obtained Polymer Compound (X1) had a weight average molecular weight of 7,050 in terms of standard polystyrene and a dispersity (Mw/Mn) of 1.5.

Monomer A:

Monomer A:

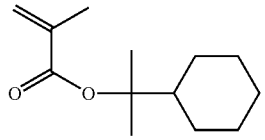

Monomer B:

Monmer B:

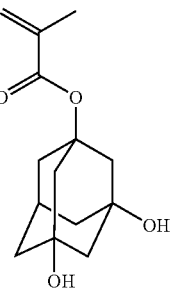

Monomer C:

Monomer C:

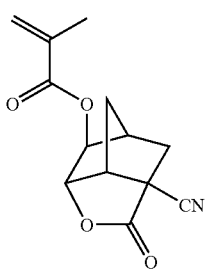

2-Mercaptoethanol:

Synthesis Example 2

Synthesis of Polymer Compound (R'-1)

In Polymer Compound (X1) (3.0 g) and 0.42 g of Vinyl Ether (V1) shown below were dissolved in 50 ml of THF and after adding 40 mg of p-toluenesulfonic acid, the resulting solution was stirred at room temperature for 4 hours. After the completion of reaction, the reaction solution was neutralized with triethylamine and added dropwise to a mixed solution of 450 ml of methanol/50 ml of water. The precipitated powder was collected by filtration and dried to obtain 2.8 g of the objective Polymer Compound (R'-1). The obtained polymer compound (R'-1) had a weight average molecular weight of 7,200 in terms of standard polystyrene and a dispersity (Mw/Mn) of 1.6.

Polymer Compound (R'-1):

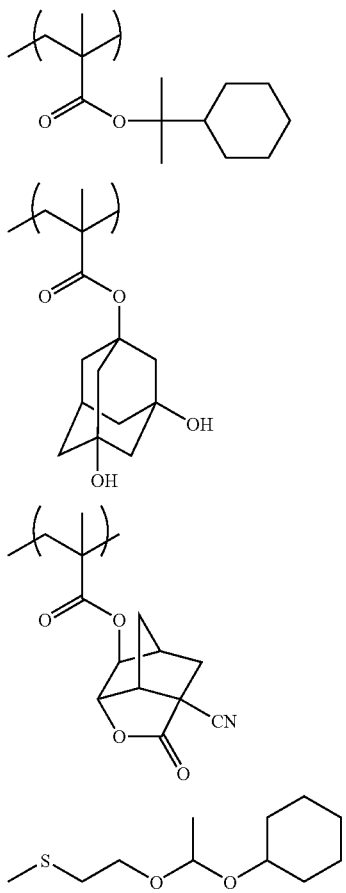

V1:

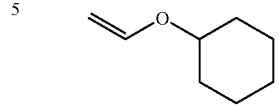

Polymer Compounds (R'-2) to (R'-17) were synthesized in the same manner.

The thiol compound, polymer terminal structure, polymerization initiator with its amount used, addition molar ratio (I/S value), repeating unit, weight average molecular weight (Mw) and dispersity (Mw/Mn) in each of Polymer Compounds (R'-1) to (R'-17) are shown in Table 1 below. In Table 1, the contents of the thiol compound (S) and polymerization initiator (I) are shown by mol % of each compound based on the total monomer molar number.

Synthesis Example 3

Synthesis of Comparative Polymer Compound (CR-1)

In a nitrogen stream, 4.8 g of cyclohexanone was changed into a three-neck flask, and the flask was heated to 80° C. Thereto, a solution prepared by dissolving 4.49 g of Monomer A, 2.52 g of Monomer B, 4.95 g of Monomer C and 0.657 g of a polymerization initiator (azobisisobutyronitrile (AIBN), produced by Wako Pure Chemical Industries, Ltd.) in 43.0 g of cyclohexanone was added dropwise over 6 hours. After the completion of dropwise addition, the reaction was further allowed to proceed at 80° C. for 2 hours. The resulting reaction solution was allowed to cool and then added dropwise to 500 ml of methanol over 20 minutes, and the precipitated powder was collected by filtration and dried to obtain 8.2 g of the objective Comparative Polymer Compound (CR-1). The obtained Comparative Polymer Compound (CR-1) had a weight average molecular weight of 7,650 in terms of standard polystyrene and a dispersity (Mw/Mn) of 1.8.

TABLE 1

| Polymer Compound | Thiol Compound (S) | Polymer Terminal Structure | Polymerization Initiator and Its (1) Content (mol %) | Addition Molar Ratio (I/S value) | Repeating Unit | Molecular Weight | Dispersity |
|---|---|---|---|---|---|---|---|
| R'-1 | HS∼OH | ∼S∼O∼O∼cyclohexyl | AIBN (1.0) | 0.17 | A-6 | 7200 | 1.6 |
| R'-2 | HS∼OH | ∼S∼O∼O∼adamantyl | AIBN (1.0) | 0.17 | A-6 | 7700 | 1.5 |
| R'-3 | HS∼OH | ∼S∼O∼tetrahydropyranyl | AIBN (1.0) | 0.17 | A-6 | 8000 | 1.5 |

TABLE 1-continued

| Polymer Compound | Thiol Compound (S) | Polymer Terminal Structure | Polymerization Initiator and Its (1) Content (mol %) | Addition Molar Ratio (I/S value) | Repeating Unit | Molecular Weight | Dispersity |
|---|---|---|---|---|---|---|---|
| R'-4 | HS~~OH | ~S~O~O~ (ethyl) | AIBN (1.0) | 0.17 | A-6 | 7300 | 1.4 |
| R'-5 | HS~~OH | ~S~O~O~benzyl | AIBN (1.0) | 0.17 | A-6 | 7700 | 1.6 |
| R'-6 | HS~~OH | ~S~O~O~cyclohexylethyl | AIBN (1.0) | 0.17 | A-6 | 7500 | 1.6 |
| R'-7 | HS~~OH | ~S~O~O~ethyl | AIBN (1.05) | 0.23 | A-2 | 8000 | 1.4 |
| R'-8 | HS~CH(CH3)~OH | ~S~(CH(CH3))~O~O~~O~phenyl | AIBN (0.8) | 0.15 | A-3 | 8500 | 1.6 |
| R'-9 | HS~~OH | ~S~O~O~~O~C(=O)~thiophene | AIBN (1.0) | 0.20 | A-4 | 7500 | 1.5 |
| R'-10 | HS~~OH | ~S~O~C(CH3)~O~cyclohexyl | V-601 (2.0) | 0.80 | A-5 | 8200 | 1.5 |
| R'-11 | HS~CH(CH3)~OH | ~S~CH(CH3)~O~CH(iPr)~O~cyclohexyl | AIBN (1.125) | 0.17 | A-1 | 7300 | 1.6 |
| R'-12 | HS-C6H4-C(CF3)2-OH | ~S-C6H4-C(CF3)2-O-CH2-O-ethyl | AIBN (0.8) | 0.15 | A-7 | 7700 | 1.5 |
| R'-13 | HS~~OH | ~S~O~O~cyclohexyl | AIBN (1.0) | 0.17 | A-10 | 7300 | 1.5 |

TABLE 1-continued

| Polymer Compound | Thiol Compound (S) | Polymer Terminal Structure | Polymerization Initiator and Its (1) Content (mol %) | Addition Molar Ratio (I/S value) | Repeating Unit | Molecular Weight | Dispersity |
|---|---|---|---|---|---|---|---|
| R'-14 | HS–CH2CH2–OH | –S–CH2CH2–O–CH(CH3)–O–adamantyl | AIBN (1.0) | 0.17 | A-8 | 7700 | 1.5 |
| R'-15 | HS–CH2CH2–OH | –S–CH2CH2–O–tetrahydropyranyl | AIBN (1.0) | 0.17 | A-9 | 7500 | 1.6 |
| R'-16 | HS–CH2CH2–OH | –S–CH2CH2–O–CH(CH3)–O–Et | AIBN (1.0) | 0.17 | A-11 | 7700 | 1.4 |
| R'-17 | HS–CH2CH2–OH | –S–CH2CH2–O–CH(CH3)–O–CH2–Ph | AIBN (1.0) | 0.17 | A-12 | 7500 | 1.5 |

In Table 1, Polymerization Initiator (V-601) indicates dimethyl-2,2'-azobis(2-methylpropionate).

Repeating Units (A-1) to (A-12) are as follows.

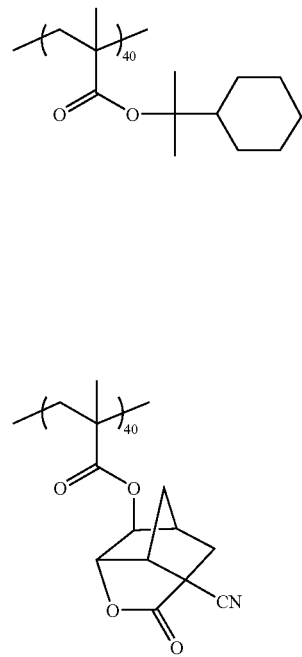

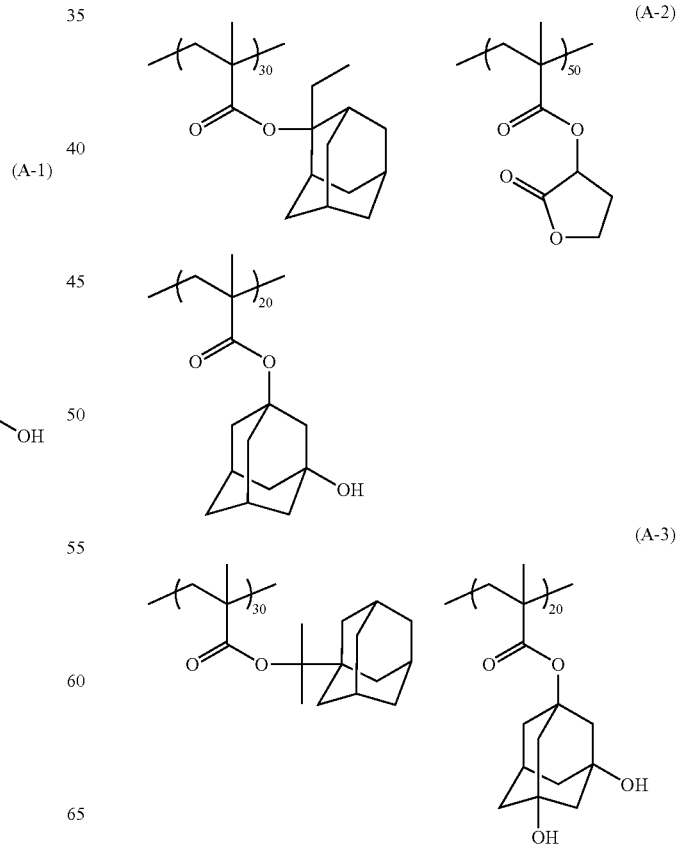

-continued
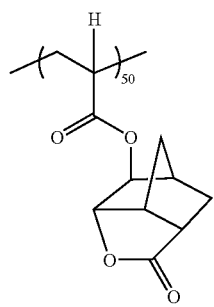
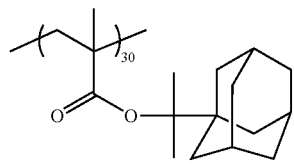
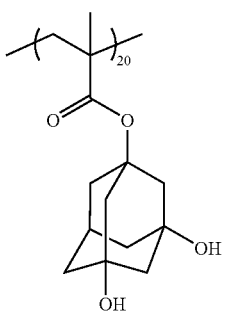
(A-4)
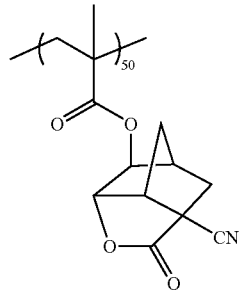
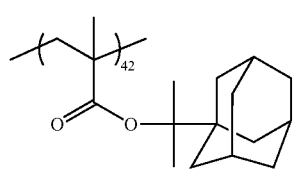
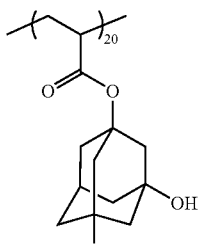
(A-5)
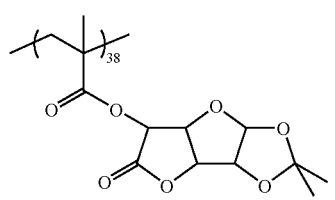
-continued
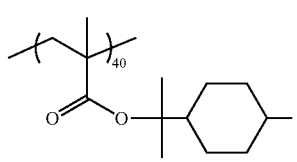
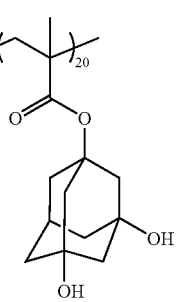
(A-6)
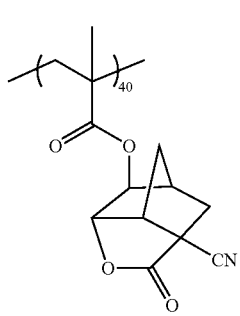
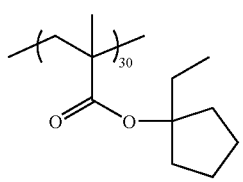
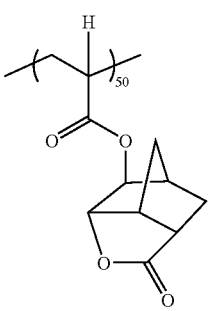
(A-7)
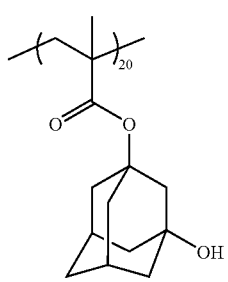
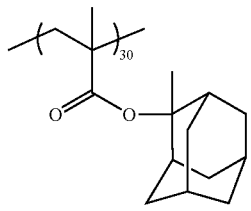
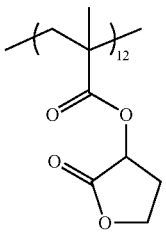
(A-8)

-continued

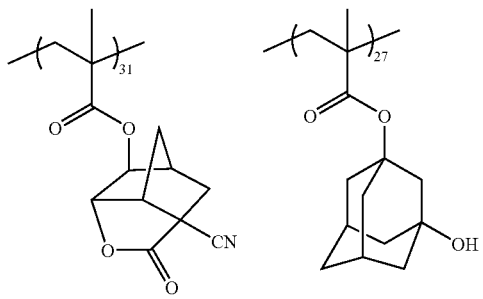

(A-9)

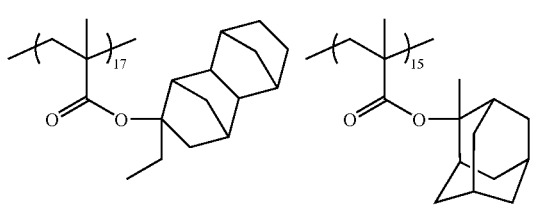

(A-10)

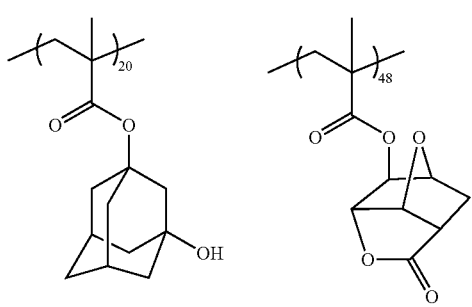

(A-11)

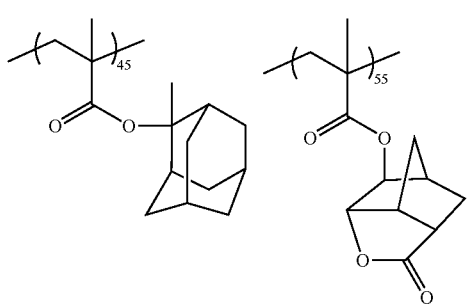

-continued (A-12)

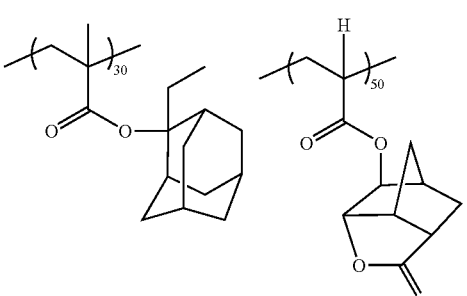

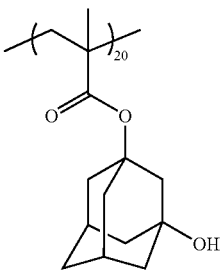

Examples 1 to 29 and Comparative Example 1

Preparation of Resist

The components shown in Table 2 below and a surfactant (Troysol S-366 produced by Troy Chemical Industries, Inc., 0.01 g) were dissolved in a 6/4 mixed solvent of propylene glycol methyl ether acetate/propylene glycol methyl ether to prepare a solution having a solid content concentration of 8 mass %, and the obtained solution was filtered through a 0.03-μm polyethylene filter to prepare a positive resist solution. The positive resist solutions prepared were evaluated by the following methods, and the results are also shown in Table 2.

<Evaluation of Resist>

On a silicon substrate treated with hexamethyldisilazane, an antireflection film, DUV-42, produced by Brewer Science, Inc. was uniformly coated by a spin coater to a thickness of 600 Å. The coated film was then dried at 100° C. for 90 seconds on a hot plate and further dried under heating at 190° C. for 240 seconds. Thereafter, the positive resist solutions each was coated thereon by a spin coater and dried at 120° C. for 60 seconds to form a 150-nm resist film.

This resist film was exposed using an ArF excimer laser stepper (manufactured by ASML, NA=0.75, 2/3 annular illumination) through a mask and immediately after the exposure, heated at 120° C. for 60 seconds on a hot plate. Thereafter, the resist film was developed with an aqueous 2.38 mass % tetramethylammonium hydroxide solution at 23° C. for 60 seconds, rinsed with pure water for 30 seconds and then dried to obtain a line pattern.

Evaluation Method of Sensitivity:

The minimum exposure amount necessary for forming a line pattern was taken as the sensitivity.

Evaluation Method of Pattern Collapse:

The exposure amount necessary for reproducing a mask pattern of 75-nm line/90-nm space was taken as the optimal exposure amount and when the exposure amount was further increased from the optimal exposure amount and the line width of the line pattern formed was decreased, the line width resolved without causing collapse of the pattern was used for the evaluation. A smaller value indicates that a finer pattern is resolved without collapsing, and reveals less occurrence of pattern collapse and higher resolving power.

TABLE 2

| | Polymer Compound (10 g) | Acid Generator (0.3 g) | Basic Compound (0.03 g) | Sensitivity (mJ/cm$^2$) | Pattern Collapse (nm) |
|---|---|---|---|---|---|
| Example 1 | R'-1 | z23 | DIA | 15 | 50 |
| Example 2 | R'-2 | z23 | DIA | 15 | 50 |
| Example 3 | R'-3 | z23 | DIA | 15 | 50 |
| Example 4 | R'-4 | z23 | DIA | 15 | 50 |
| Example 5 | R'-5 | z23 | DIA | 15 | 50 |
| Example 6 | R'-6 | z23 | DIA | 15 | 50 |
| Example 7 | R'-7 | z23 | DIA | 10 | 48 |
| Example 8 | R'-8 | z23 | DIA | 15 | 50 |
| Example 9 | R'-9 | z23 | DIA | 10 | 46 |
| Example 10 | R'-10 | z23 | DIA | 15 | 50 |
| Example 11 | R'-11 | z23 | DIA | 10 | 58 |
| Example 12 | R'-12 | z23 | DIA | 10 | 46 |
| Example 13 | R'-13 | z23 | DIA | 15 | 50 |
| Example 14 | R'-14 | z23 | DIA | 15 | 50 |
| Example 15 | R'-15 | z23 | DIA | 15 | 50 |
| Example 16 | R'-16 | z23 | DIA | 15 | 50 |
| Example 17 | R'-17 | z23 | DIA | 15 | 50 |
| Example 18 | R'-1 | z23 (0.2 g) z55 (0.1 g) | PEA | 15 | 50 |
| Example 19 | R'-2 | z2 | TEA | 15 | 50 |
| Example 20 | R'-3 | z5 | DIA | 15 | 50 |
| Example 21 | R'-4 | z63 | DIA | 15 | 50 |
| Example 22 | R'-5 | z55 | DIA | 15 | 50 |
| Example 23 | R'-6 | z1 | DIA | 15 | 50 |
| Example 24 | R'-7 | z62 | PBI | 10 | 50 |
| Example 25 | R'-14 | z4 (0.2 g) z66 (0.1 g) | TMEA | 15 | 50 |
| Example 26 | R'-1 | z55 (0.2 g) z51 (0.1 g) | PEA | 15 | 50 |
| Example 27 | R'-1 | z64 | DBA | 15 | 50 |
| Example 28 | R'-6 | z67 | DIA | 15 | 50 |
| Example 29 | R'-6 | z23 (0.2 g) z63 (0.1 g) | TMEA | 15 | 50 |
| Comparative Example 1 | CR-1 | z23 | DIA | 30 | 60 |

The abbreviations in Table 2 indicate the following compounds.

[Acid Generator]

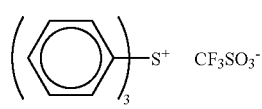
(z1)

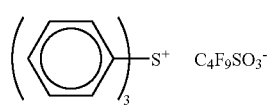
(z2)

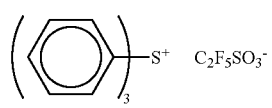
(z4)

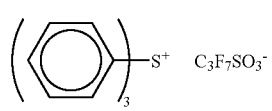
(z5)

-continued

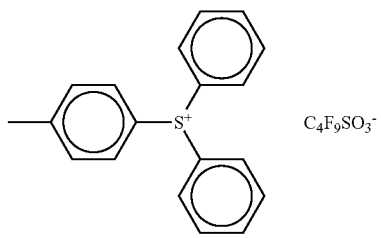
(z23)

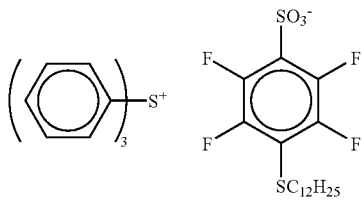
(z51)

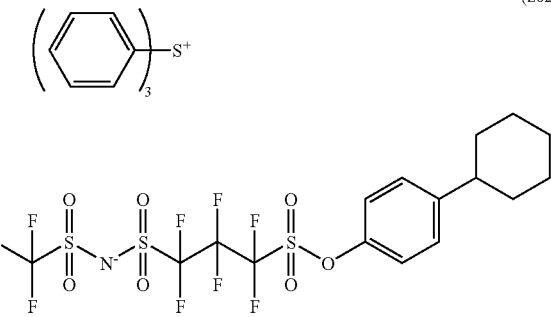
(z62)

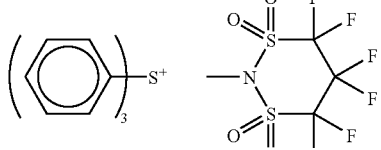
(z55)

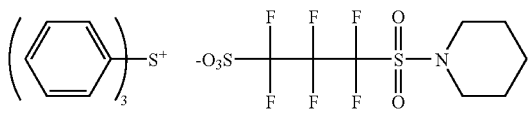
(z63)

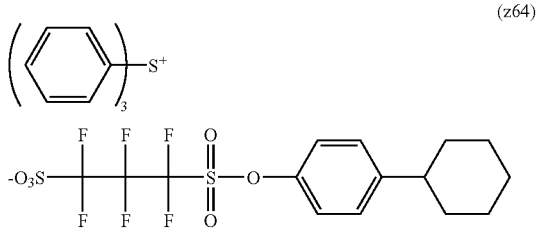
(z64)

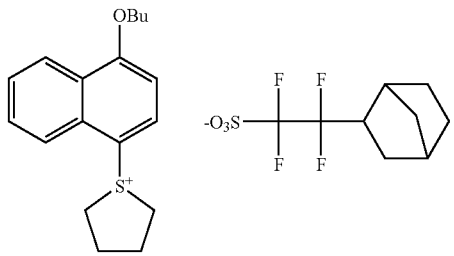
(z66)

-continued (z67)

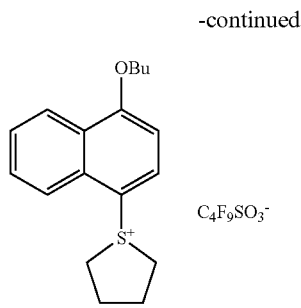

[Basic Compound]

TPSA: triphenylsulfonium acetate

DIA: 2,6-diisopropylaniline

TEA: triethanolamine

DBA: N,N-dibutylaniline

PBI: 2-phenylbenzimidazole

TMEA: tris(methoxyethoxyethyl)amine

PEA: N-phenyldiethanolamine

As apparent from Table 2, the positive resist composition containing the polymer compound of the present invention was verified to have high sensitivity and exhibit good performance in terms of pattern collapse.

Example 30

A resist film was obtained by performing the preparation and coating of resist thoroughly in the same manner as in Example 1 except that the polymer compound was changed to the following polymer compound. However, the film thickness here was 0.40 μm. The obtained resist film was subjected to pattern exposure using a KrF excimer laser stepper (FPA3000EX-5, manufactured by Canon Inc., wavelength: 248 nm), and the pattern formation was confirmed. It was verified that the polymer compound of the present invention can be suitably used also for the pattern formation by KrF excimer laser exposure. Also, the minimum exposure amount necessary for the pattern formation was 50 mJ/cm² in the case of the resist film using a polymer compound not having a structure represented by formula (1) at the main chain terminal, whereas the minimum exposure amount was 35 mJ/cm² in the case of the resist film using the polymer compound shown below, and this reveals that high sensitivity is ensured also in the KrF excimer laser exposure.

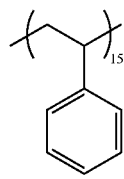

-continued

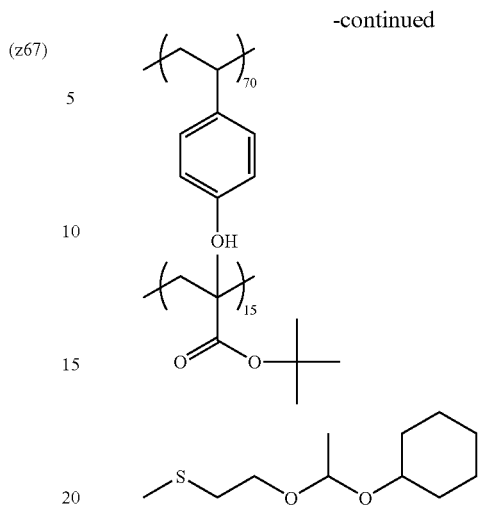

Weight average molecular weight: 8,200

Dispersity: 1.82

Example 31

A resist film was obtained by performing the synthesis of a polymer compound and the preparation and coating of resist thoroughly in the same manner as in Example 1 except that in Synthesis Example 1, 0.10 g of a monomer corresponding to the repeating unit shown below was further added. Furthermore, the resist film obtained was subjected to pattern exposure using pure water as the immersion liquid and using an ArF excimer laser immersion stepper (Na: 0.85), and a pattern was formed in the same manner as in Example 1, as a result, the minimum sensitivity necessary for the pattern formation was 15 mJ/cm². Thus, high sensitivity was confirmed.

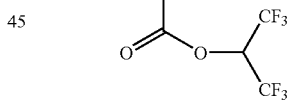

Weight average molecular weight: 5,400

Dispersity: 1.80

From the results above, it was verified that the polymer compound of the present invention can be suitably used also for the pattern formation by ArF excimer laser immersion exposure.

This application is based on Japanese Patent application JP 2006-313912, filed Nov. 21, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A positive photosensitive composition comprising:
a polymer compound having a structure represented by the following formula (1) at a main chain terminal; and
a photoacid generator capable of generating an acid upon irradiation with actinic rays or radiation:

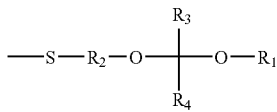
(1)

wherein $R_1$ represents a monovalent organic group,
$R_2$ represents a divalent linking group,
$R_3$ an $R_4$ each independently represents a hydrogen atom or a monovalent organic group, and
$R_3$ or $R_4$ may combine with the carbon atom on $R_1$ to form a ring structure.

2. The positive photosensitive composition as claimed in claim 1, wherein in formula (1), $R_1$ represents an alkyl group, a cycloalkyl group, an aryl group, a monovalent thiazoline ring group, a monovalent oxazoline ring group, a monovalent imidazoline ring group, or a monovalent organic group formed by combining at least two members thereof, R2 represents an alkylene group, a cycloalkylene group, an oxyalkylene group, an arylene group, a divalent thiazoline ring group, a divalent oxazoline ring group, a divalent imidazoline ring group, or a divalent linking group formed by combining at least two members thereof, and R3 and R4 each independently represents a hydrogen atom, an alkyl group, a cycloalkyl group, an alkenyl group or an aryl group.

3. The positive photosensitive composition as claimed in claim 1, wherein the structure represented by the formula (1) is selected from structures represented by the following formulae (S1) to (S24):

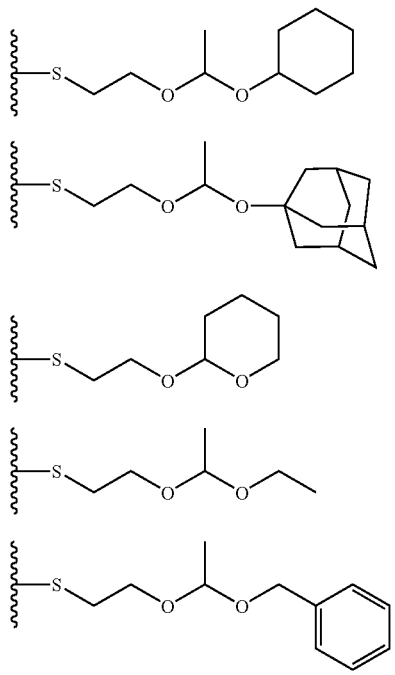

-continued

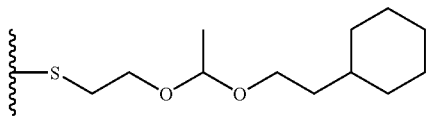
(S6)

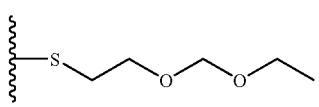
(S7)

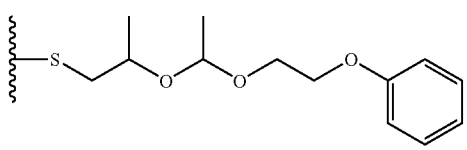
(S8)

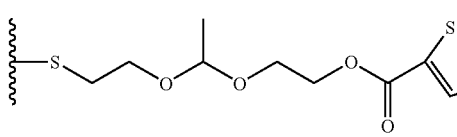
(S9)

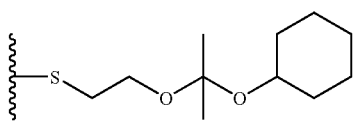
(S10)

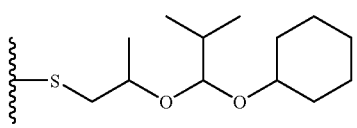
(S11)

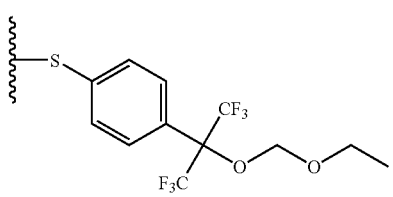
(S12)

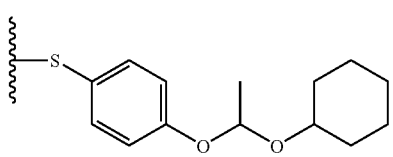
(S13)

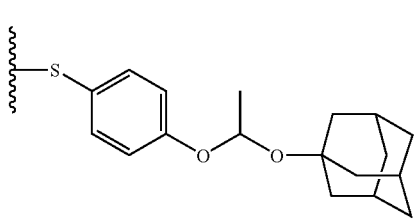
(S14)

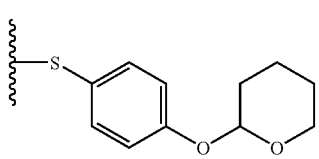
(S15)

-continued (S16)
(S17)
(S18)
(S19)
(S20)
(S21)
(S22)
(S23)

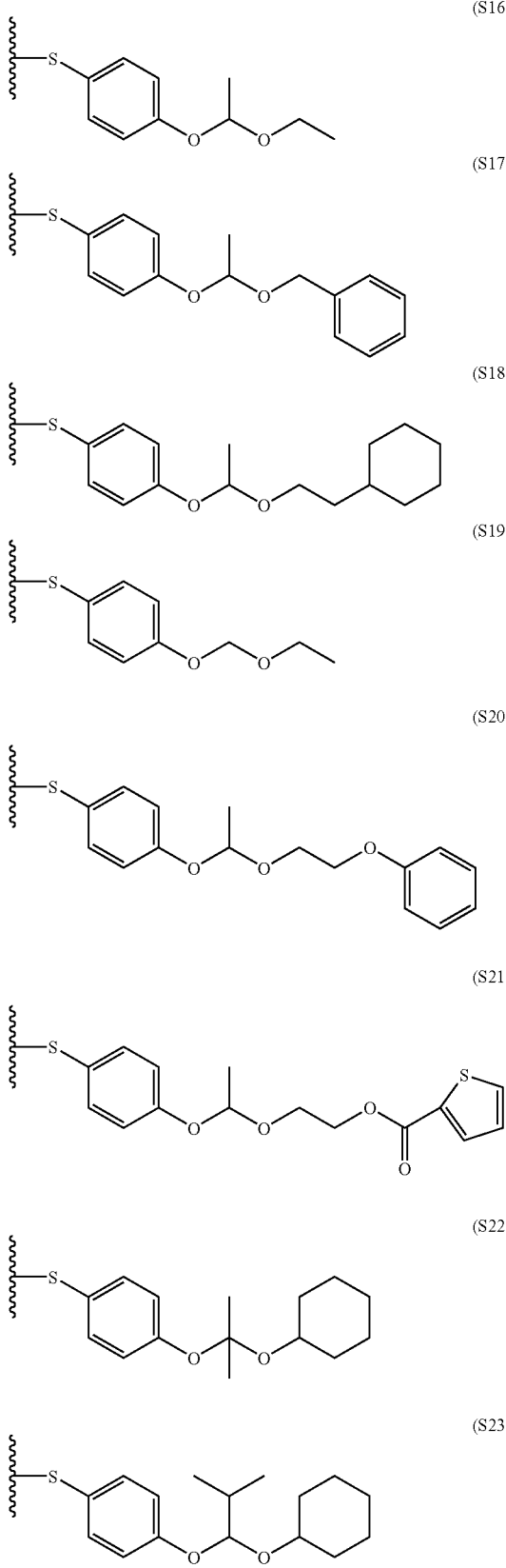

-continued (S24)

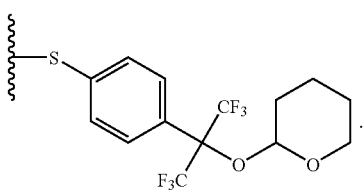

4. A polymer compound having a structure represented by the following formula (1) at a main chain terminal:

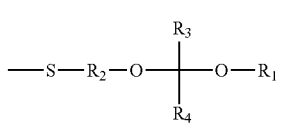

(1)

wherein $R_1$ represents a monovalent organic group,
$R_2$ represents a divalent linking group,
$R_3$ an $R_4$ each independently represents a hydrogen atom or a monovalent organic group, and
$R_3$ or $R_4$ may combine with the carbon atom on $R_1$ to form a ring structure.

5. A method for producing a polymer compound, comprising: polymerizing a polymerizable compound having an ethylenic double bond by using a compound represented by the following formula (2) and a polymerization initiator; and reacting the obtained polymer compound with a vinyl ether compound or a halomethyl ether compound:

(2)

wherein $R_2$ represents a divalent linking group.

6. A polymer compound having a structure represented by the following formula (1) at a main chain terminal, which is obtained by the production method claimed in claim 5:

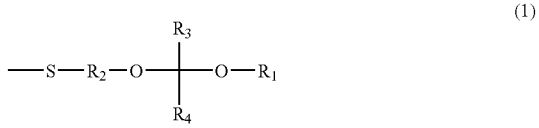

(1)

wherein $R_1$ represents a monovalent organic group,
$R_2$ represents a divalent linking group,
$R_3$ an $R_4$ each independently represents a hydrogen atom or a monovalent organic group, and
$R_3$ or $R_4$ may combine with the carbon atom on $R_1$ to form a ring structure.

7. A pattern forming method comprising: forming a photosensitive film from the positive photosensitive composition claimed in claim 1; and exposing and developing the photosensitive film.

8. The positive photosensitive composition according to claim 1, wherein $R_1$ represents an alkyl group, a cycloalkyl group, an aryl group or a monovalent thiazoline ring group.

9. The polymer compound according to claim 4, wherein $R_1$ represents an alkyl group, a cycloalkyl group, an aryl group or a monovalent thiazoline ring group.

10. The polymer compound according to claim 6, wherein $R_1$ represents an alkyl group, a cycloalkyl group, an aryl group or a monovalent thiazoline ring group.

* * * * *